United States Patent
Masuoka et al.

(10) Patent No.: US 9,590,175 B2
(45) Date of Patent: *Mar. 7, 2017

(54) METHOD FOR PRODUCING A SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/238,122

(22) Filed: Aug. 16, 2016

(65) Prior Publication Data

US 2016/0359106 A1 Dec. 8, 2016

Related U.S. Application Data

(60) Division of application No. 15/093,986, filed on Apr. 8, 2016, which is a continuation of application No. PCT/JP2014/053441, filed on Feb. 14, 2014.

(51) Int. Cl.
*H01L 21/00* (2006.01)
*H01L 21/8238* (2006.01)
(Continued)

(52) U.S. Cl.
CPC ............ *H01L 43/12* (2013.01); *H01L 27/228* (2013.01); *H01L 43/02* (2013.01); *H01L 43/08* (2013.01)

(58) Field of Classification Search
CPC ......... H01L 27/11521; H01L 27/11551; H01L 27/2454; H01L 29/0676; H01L 29/66795; H01L 29/785
(Continued)

(56) References Cited

U.S. PATENT DOCUMENTS 6,649,953 B2 11/2003 Cha
6,891,234 B1 5/2005 Connelly et al.
(Continued)

FOREIGN PATENT DOCUMENTS

JP 08116060 A 5/1996
JP 11297984 A 10/1999
(Continued)

OTHER PUBLICATIONS

English language translation of International Preliminary Report on Patentability in corresponding International Application No. PCT/JP2014/053441, dated Aug. 25, 2016, 7 pages.

*Primary Examiner* — Hsien Ming Lee

(74) *Attorney, Agent, or Firm* — Brinks Gilson & Lione

(57) ABSTRACT

A semiconductor device includes four or more memory cells arranged on a row, the memory cells each including a first pillar-shaped semiconductor layer, a first gate insulating film around the semiconductor layer, a first gate line around the first gate insulating film, a third gate insulating film around an upper portion of the semiconductor layer, a first contact electrode around the third gate insulating film, a second contact electrode connecting upper portions of the semiconductor layer and the first contact electrode, and a magnetic tunnel junction storage element on the second contact electrode, a first source line connecting lower portions of the semiconductor layers to each other, a first bit line extending in a direction perpendicular to a direction of the first gate line and connected to an upper portion of the storage element, and a second source line extending in a direction perpendicular to the first source line.

2 Claims, 47 Drawing Sheets

(51) Int. Cl.
  *H01L 21/336* (2006.01)
  *H01L 29/76* (2006.01)
  *H01L 29/788* (2006.01)
  *H01L 43/12* (2006.01)
  *H01L 27/22* (2006.01)
  *H01L 43/08* (2006.01)
  *H01L 43/02* (2006.01)

(58) Field of Classification Search
  USPC .................................. 257/302, 328, 401, 618
  See application file for complete search history.

(56) References Cited

U.S. PATENT DOCUMENTS

| | | | |
|---|---|---|---|
| 7,940,573 | B2 | 5/2011 | Masuoka et al. |
| 8,080,468 | B2 | 12/2011 | Scherer et al. |
| 8,144,509 | B2 | 3/2012 | Jung et al. |
| 8,283,712 | B2 | 10/2012 | Kushida |
| 8,427,864 | B2 | 4/2013 | Kawahara et al. |
| 8,735,971 | B2* | 5/2014 | Masuoka ............ H01L 29/7827 257/329 |
| 9,117,747 | B2* | 8/2015 | Masuoka .......... H01L 21/82348 |
| 2003/0128580 | A1 | 7/2003 | Park et al. |
| 2004/0262681 | A1 | 12/2004 | Masuoka et al. |
| 2011/0017971 | A1 | 1/2011 | Kim |

FOREIGN PATENT DOCUMENTS

| | | |
|---|---|---|
| JP | 2002329846 A | 11/2002 |
| JP | 2003218328 A | 7/2003 |
| JP | 2004356314 A | 12/2004 |
| JP | 2008021781 A | 1/2008 |
| JP | 2010-114143 | 5/2010 |
| JP | 2011166163 A | 8/2011 |
| JP | 2012-531751 A | 12/2012 |
| JP | 2013-093592 A | 5/2013 |
| WO | 2010140615 A1 | 12/2010 |
| WO | 2013038553 A1 | 3/2013 |
| WO | 2013093988 A1 | 4/2015 |

* cited by examiner

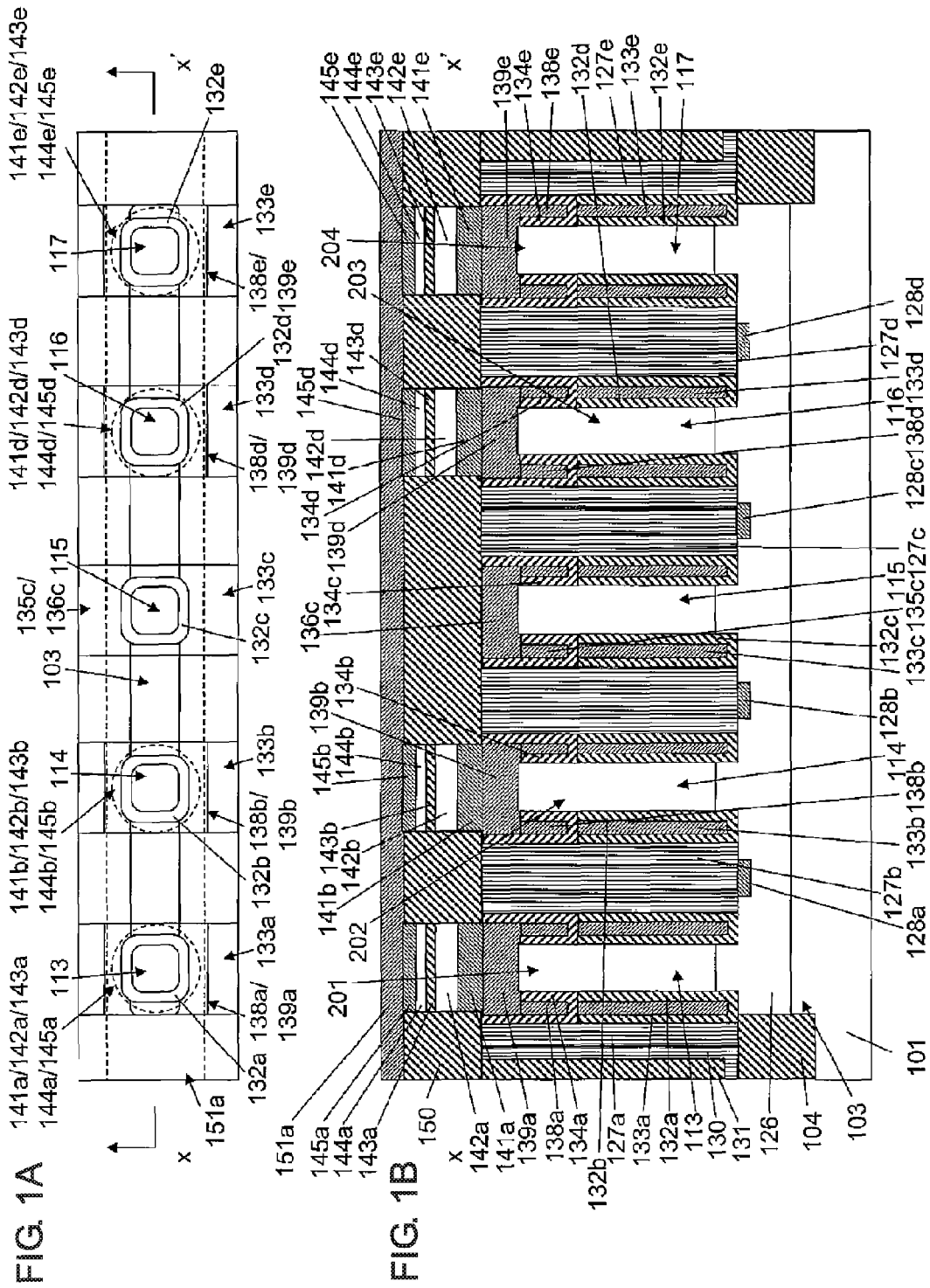

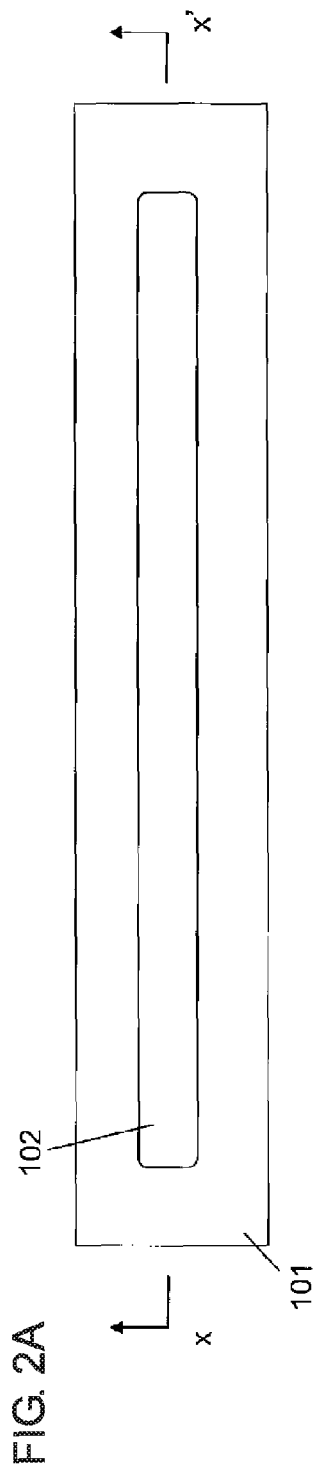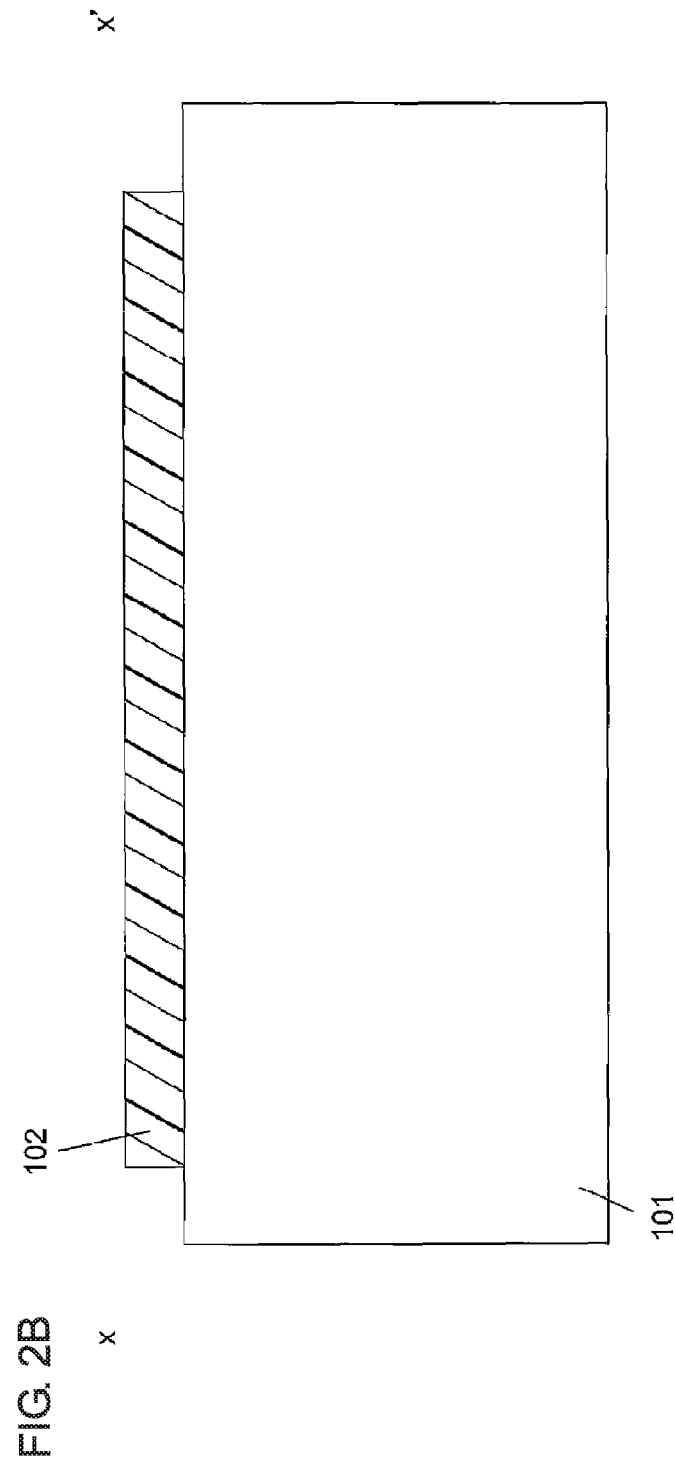
FIG. 2A
FIG. 2B

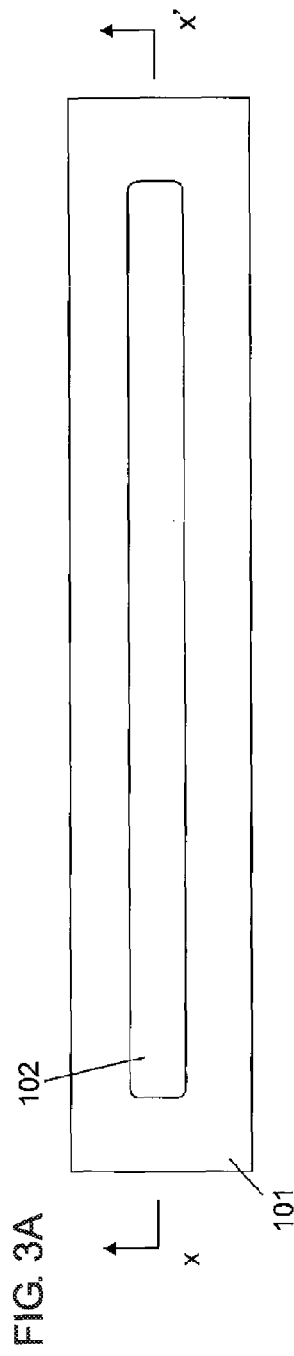
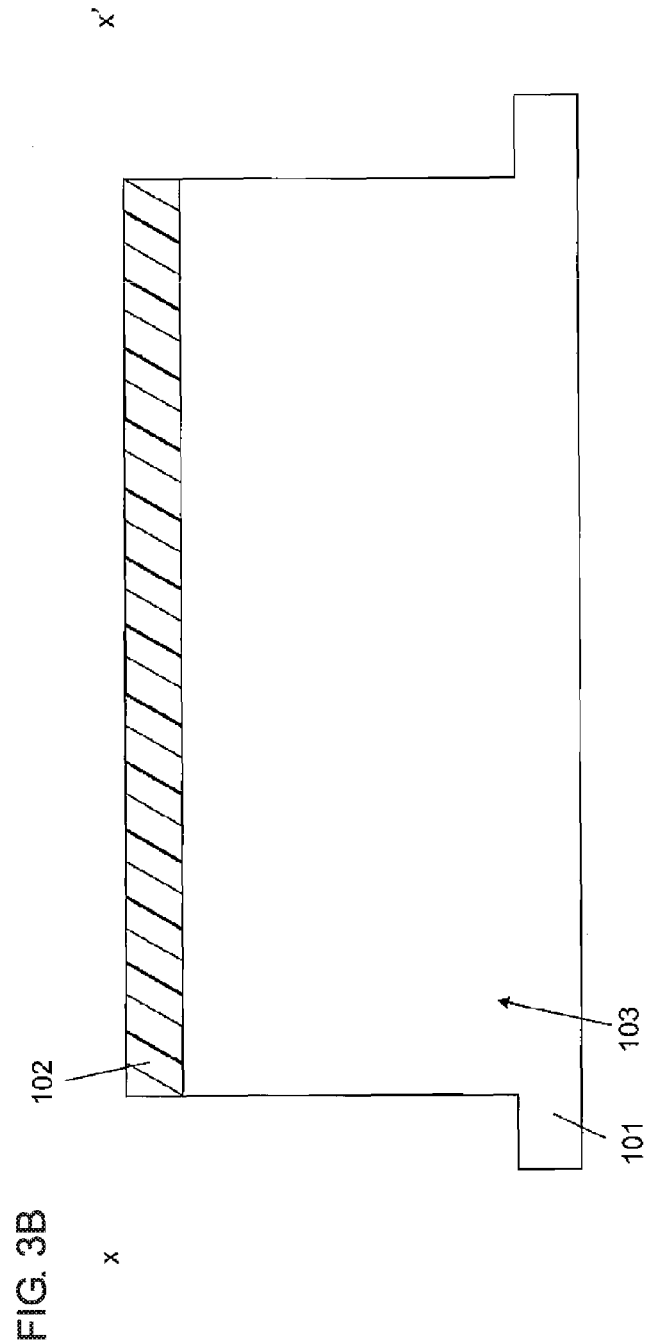
FIG. 3A
FIG. 3B

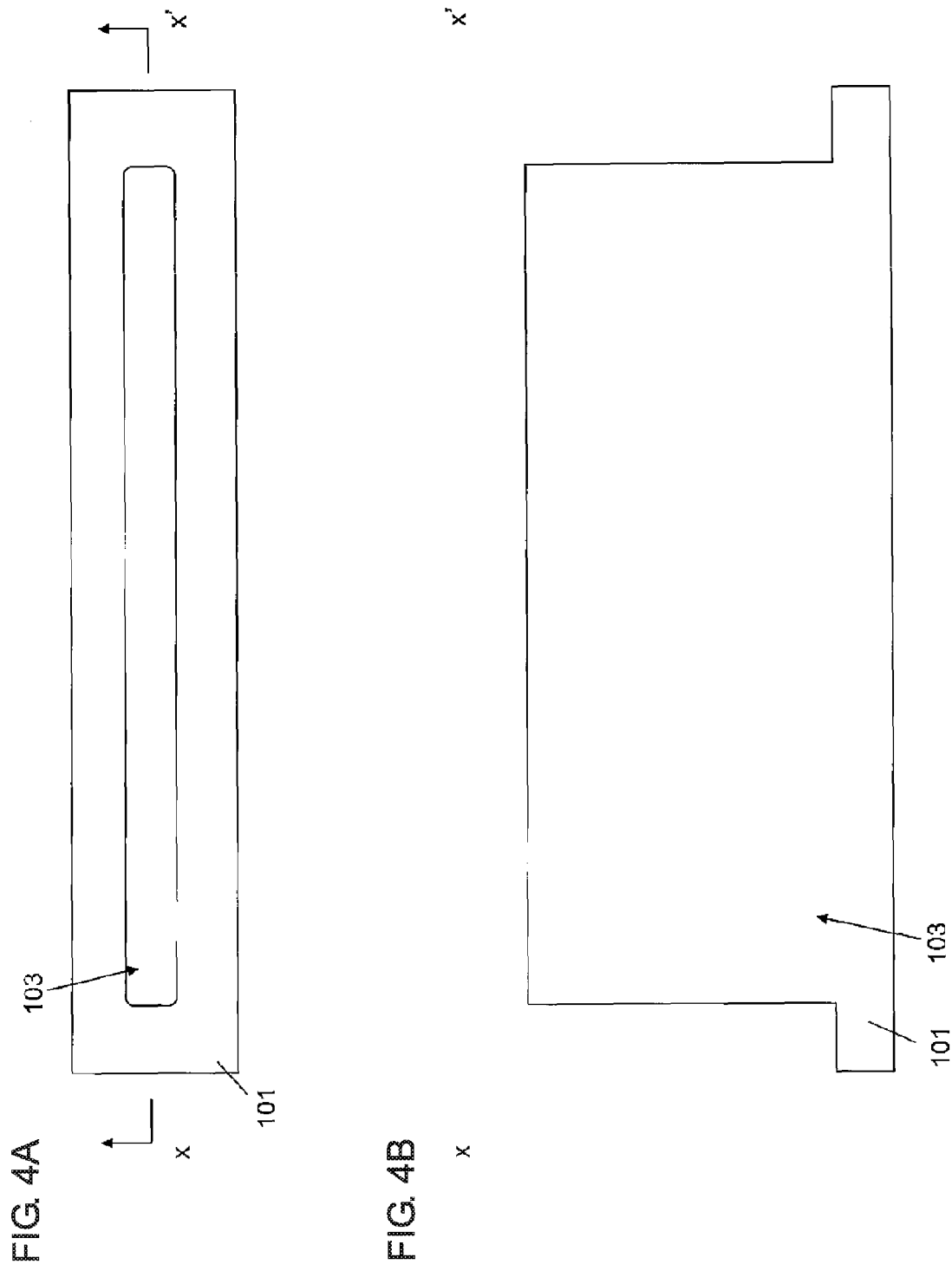

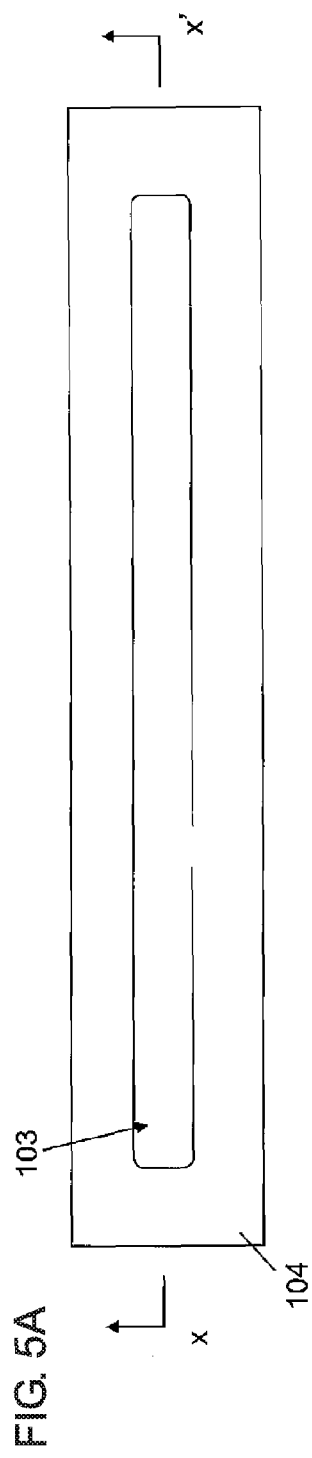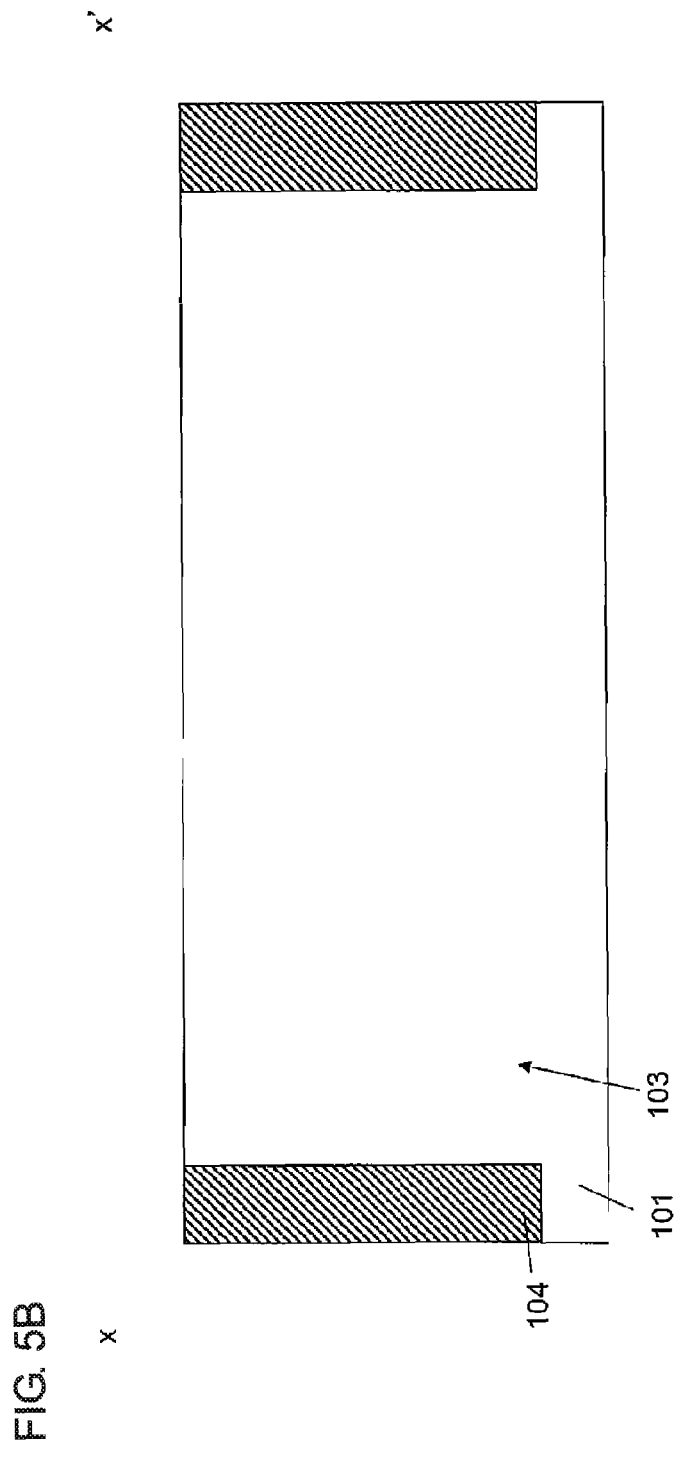
FIG. 5A
FIG. 5B

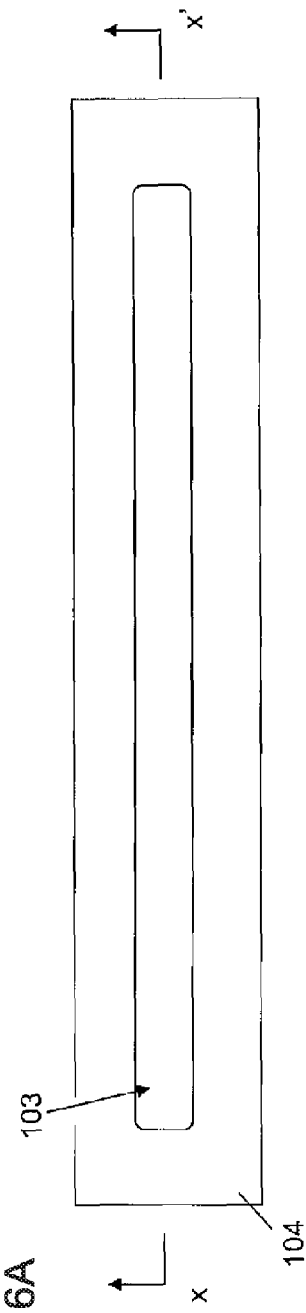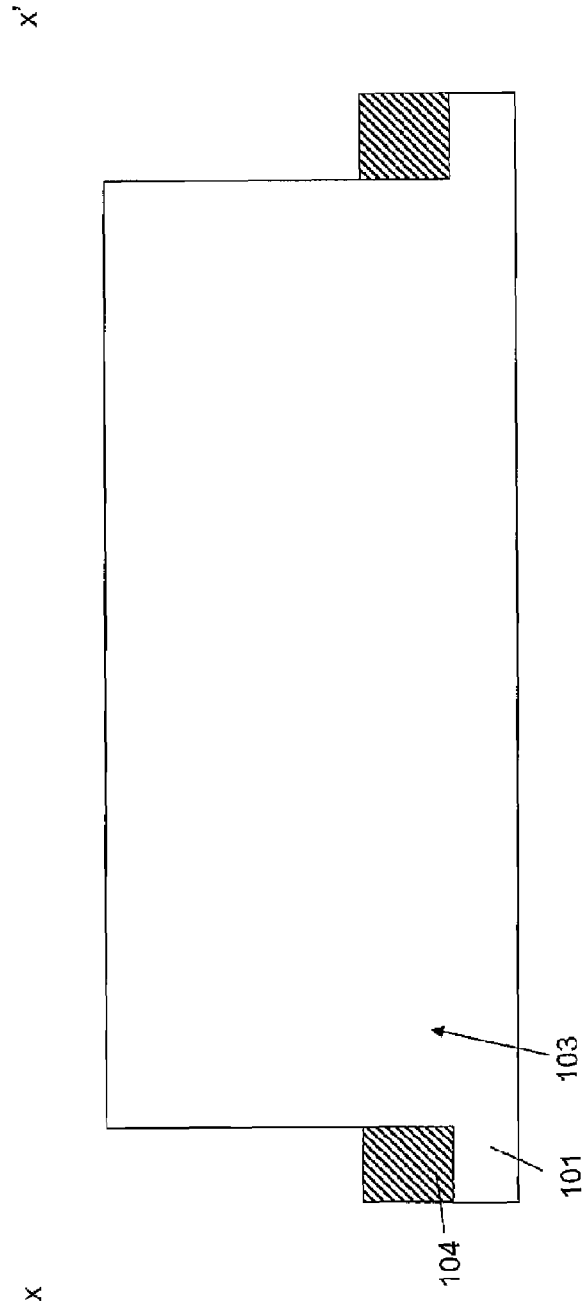
FIG. 6A
FIG. 6B

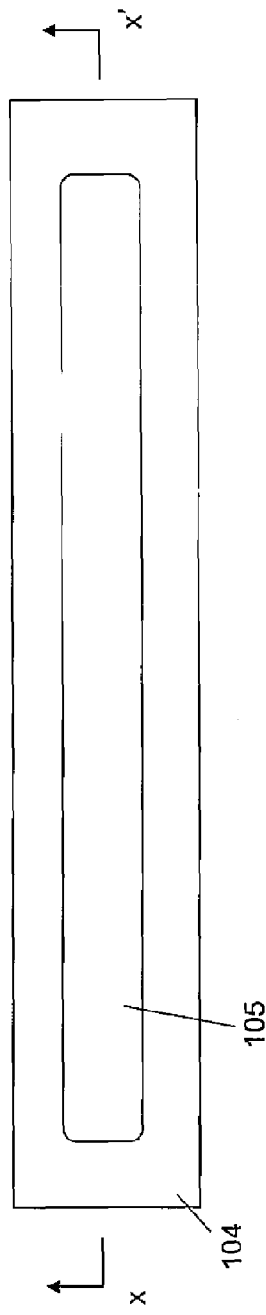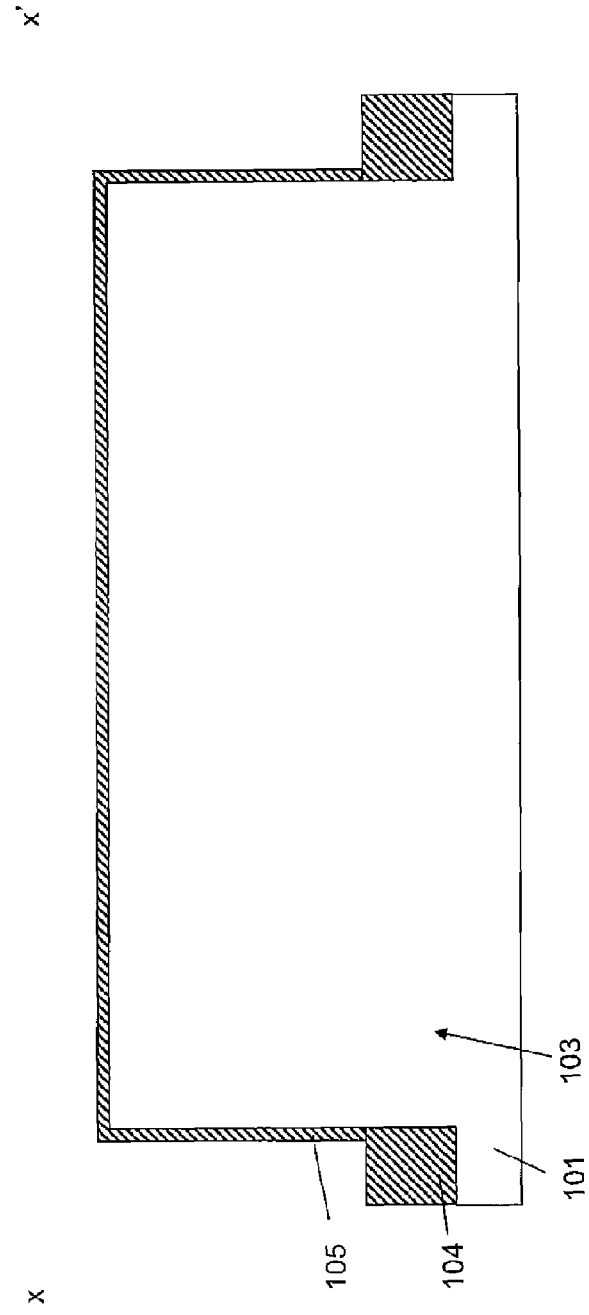

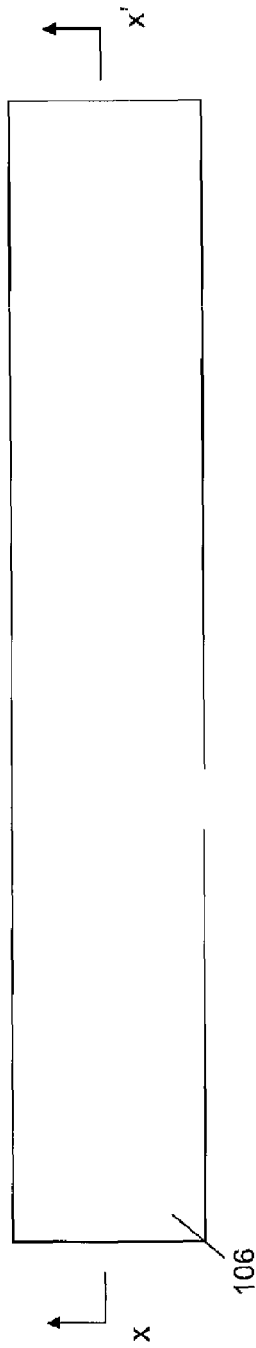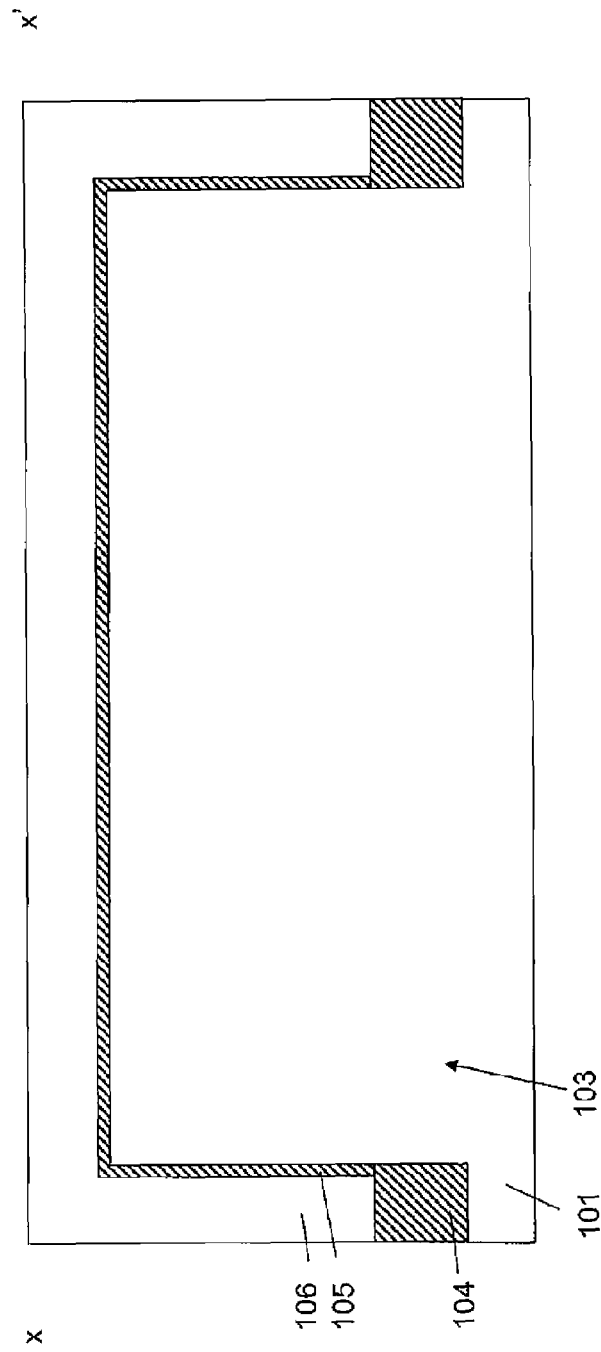
FIG. 8A
FIG. 8B

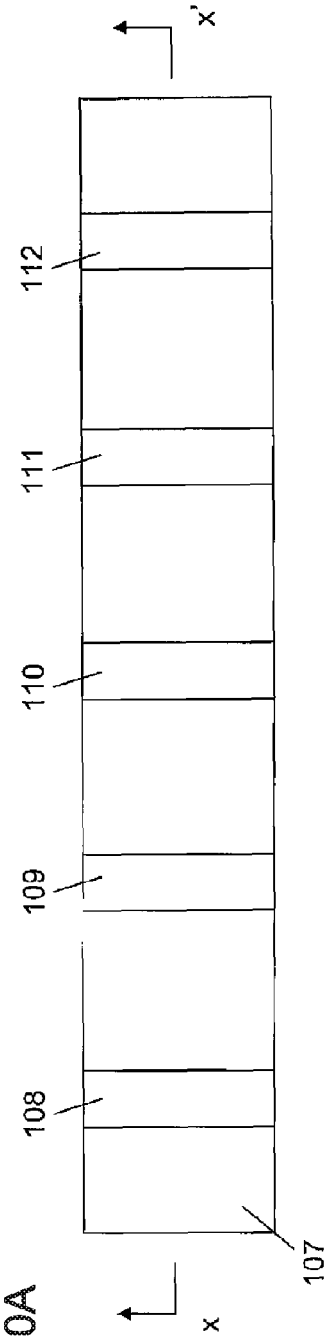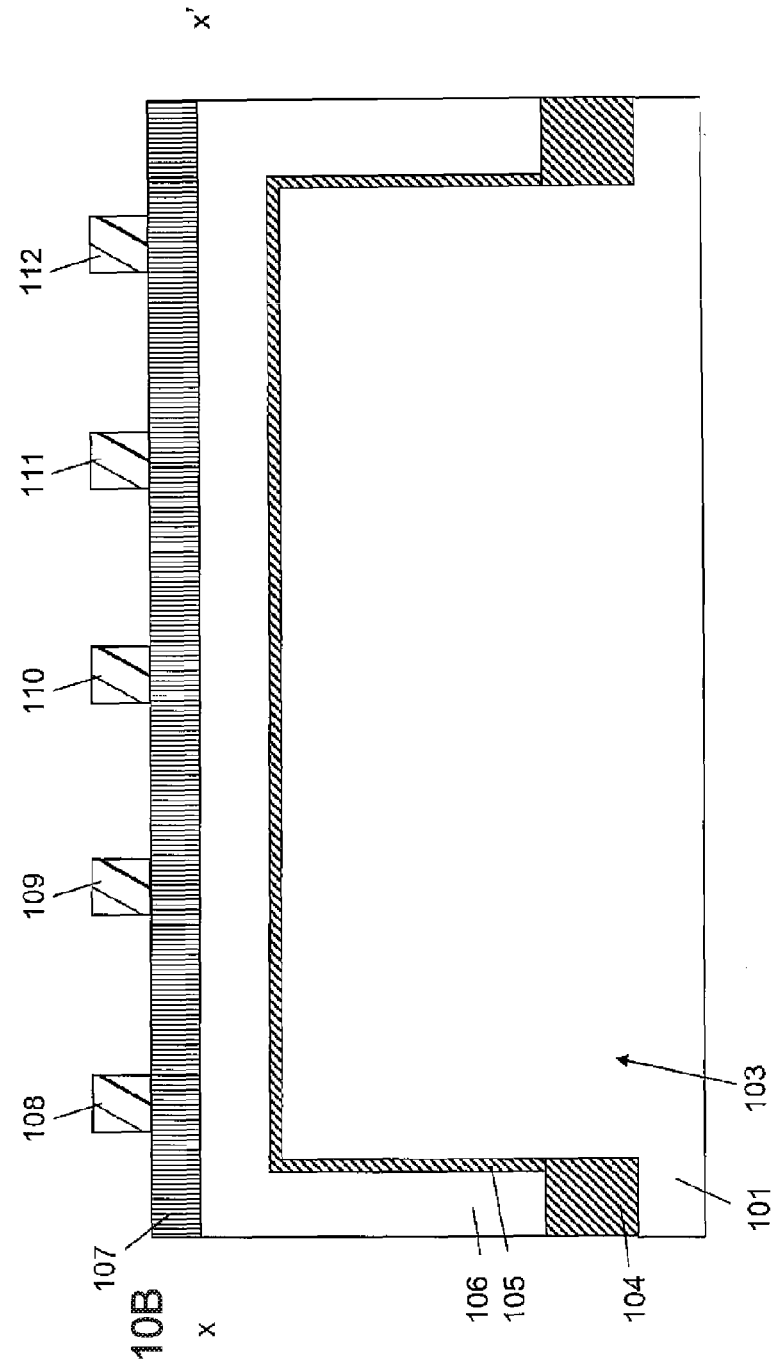

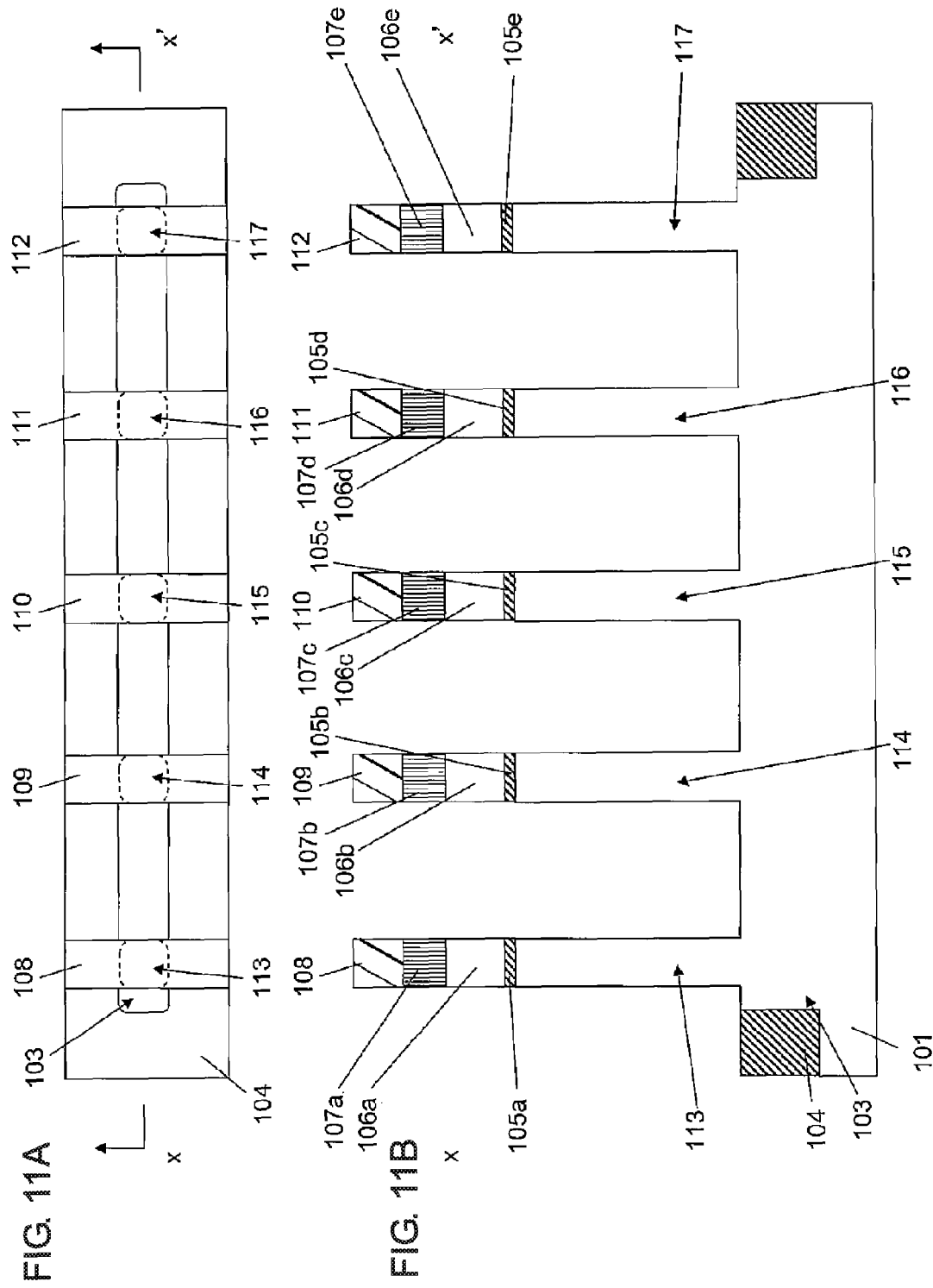

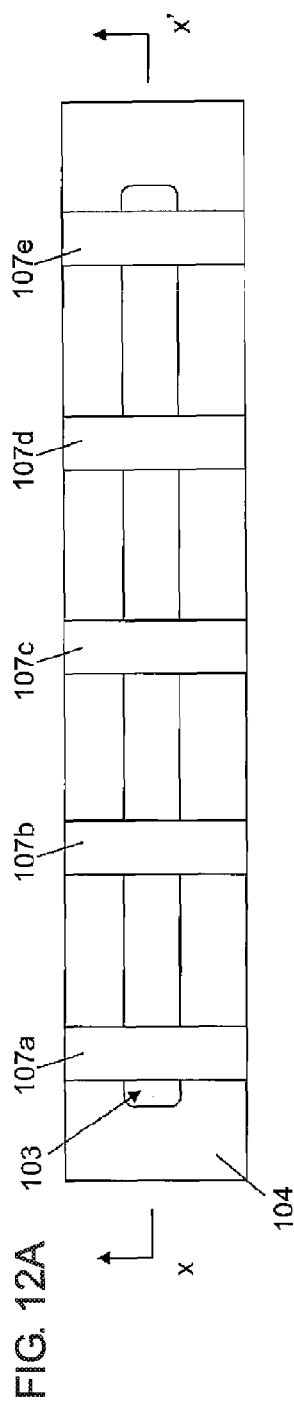
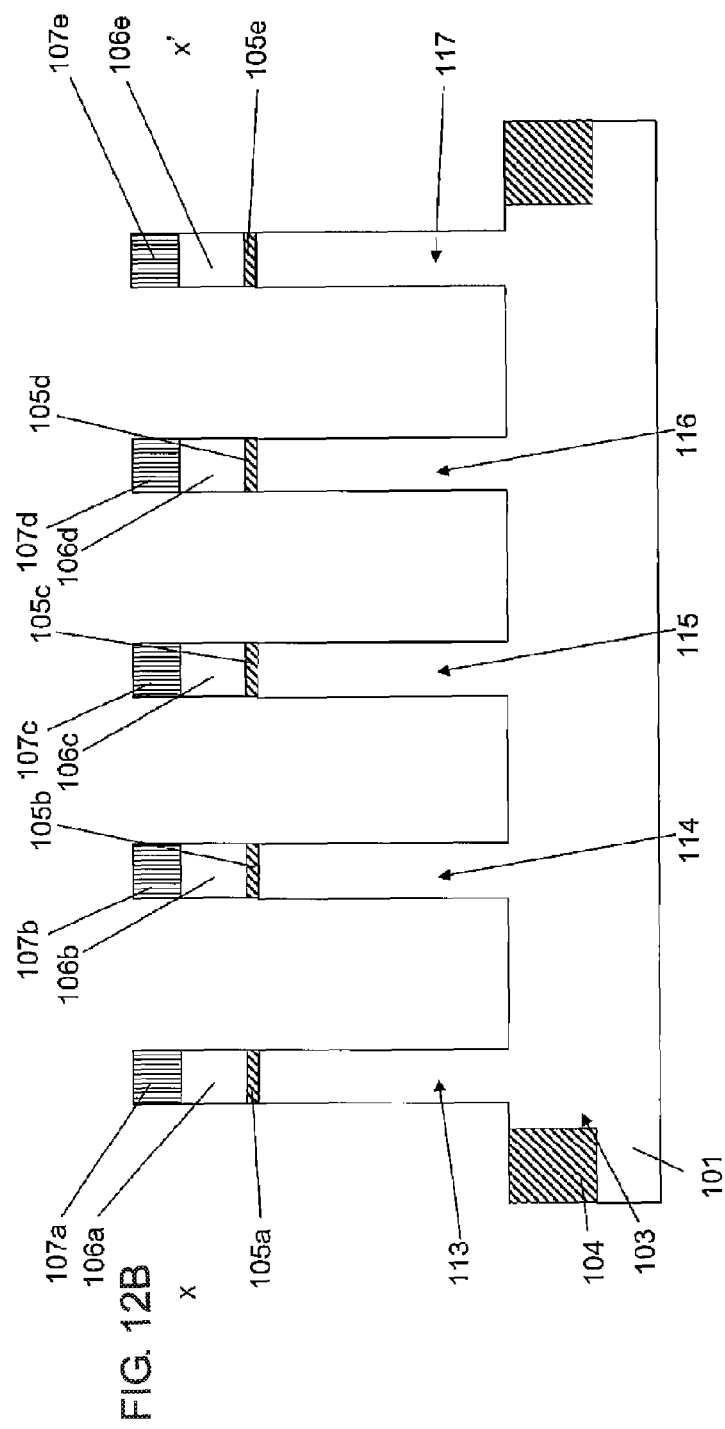
FIG. 12A
FIG. 12B

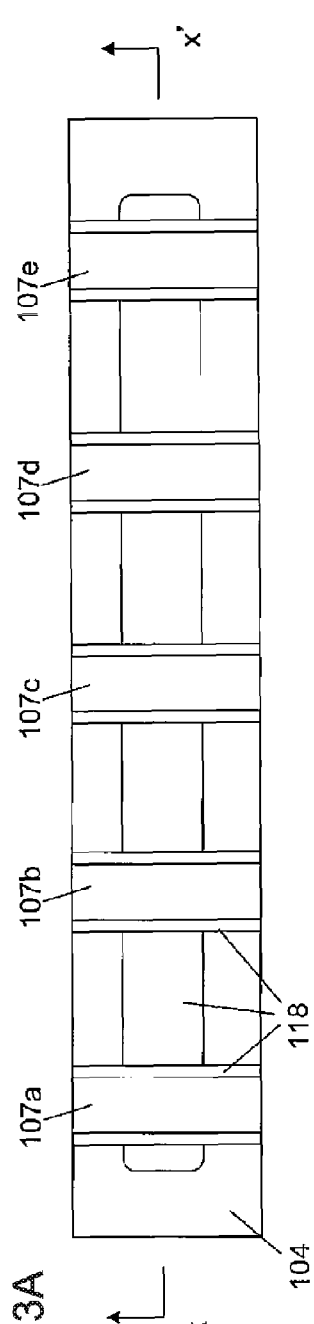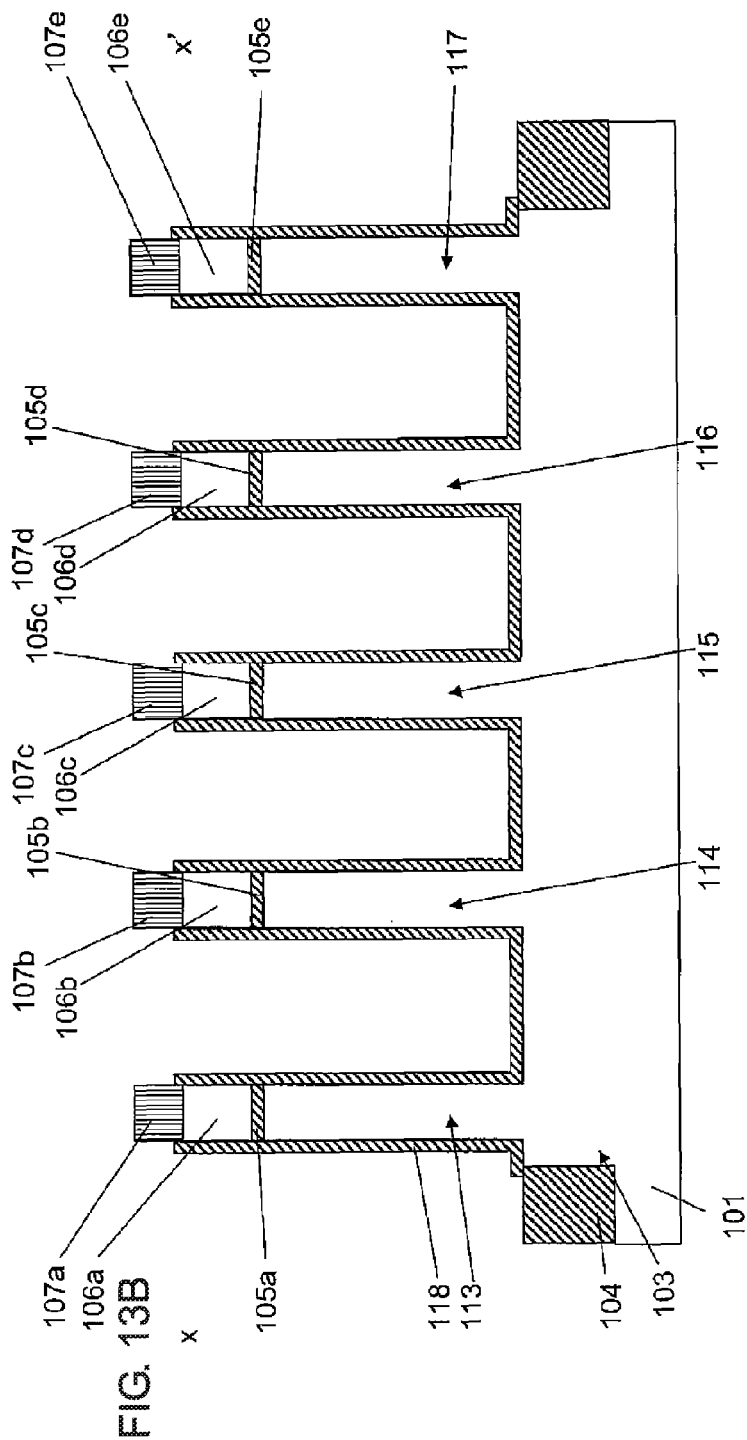
FIG. 13A
FIG. 13B

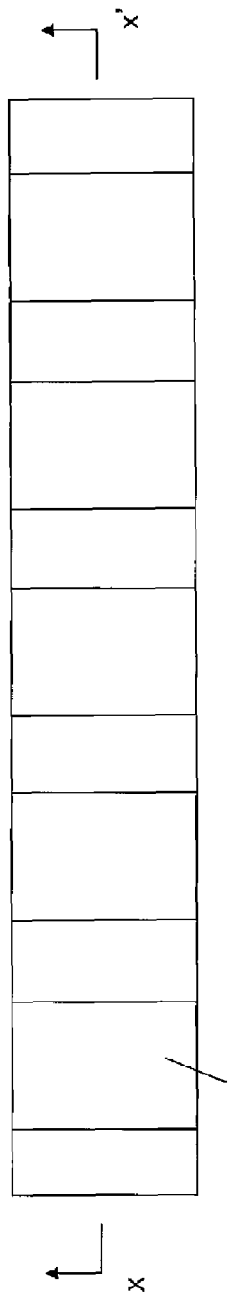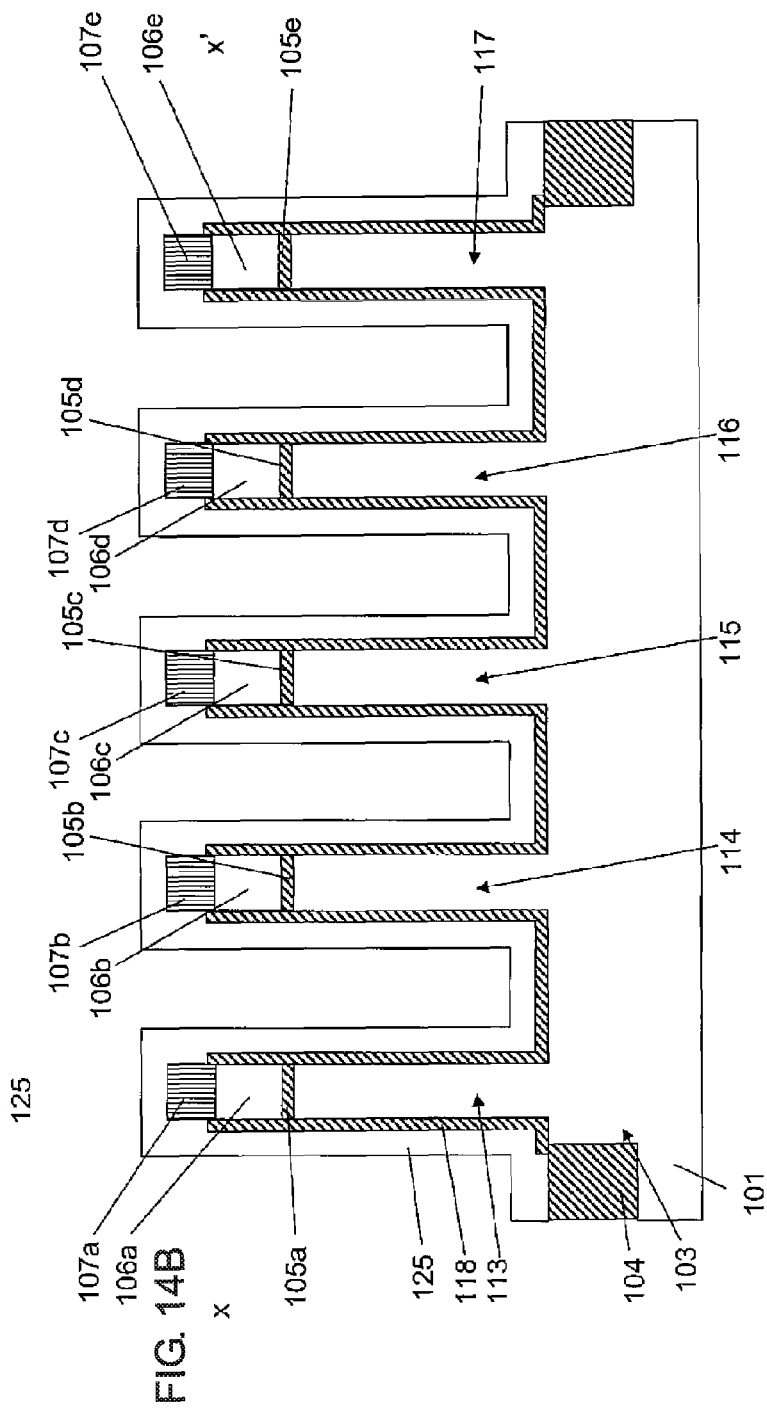

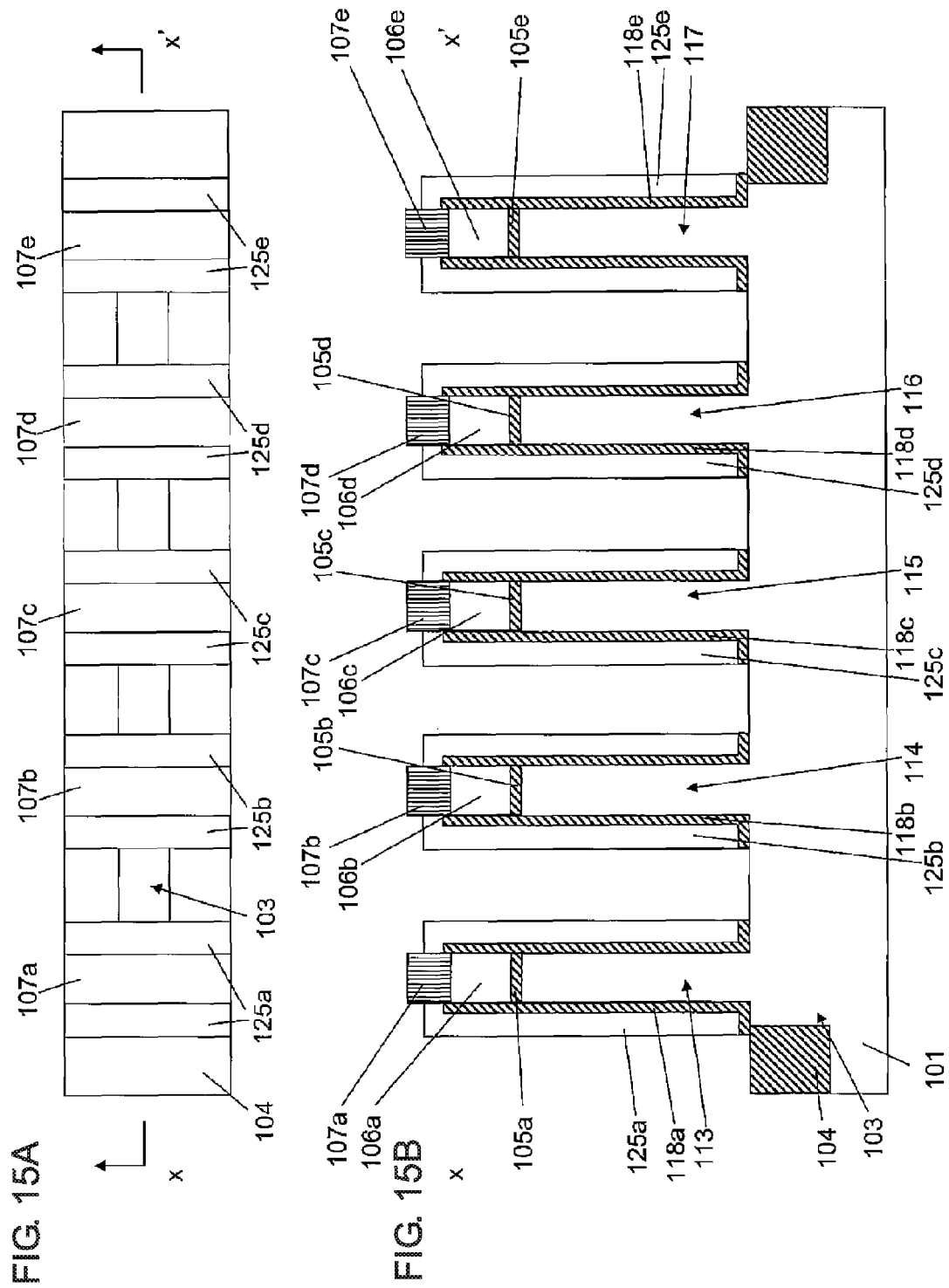

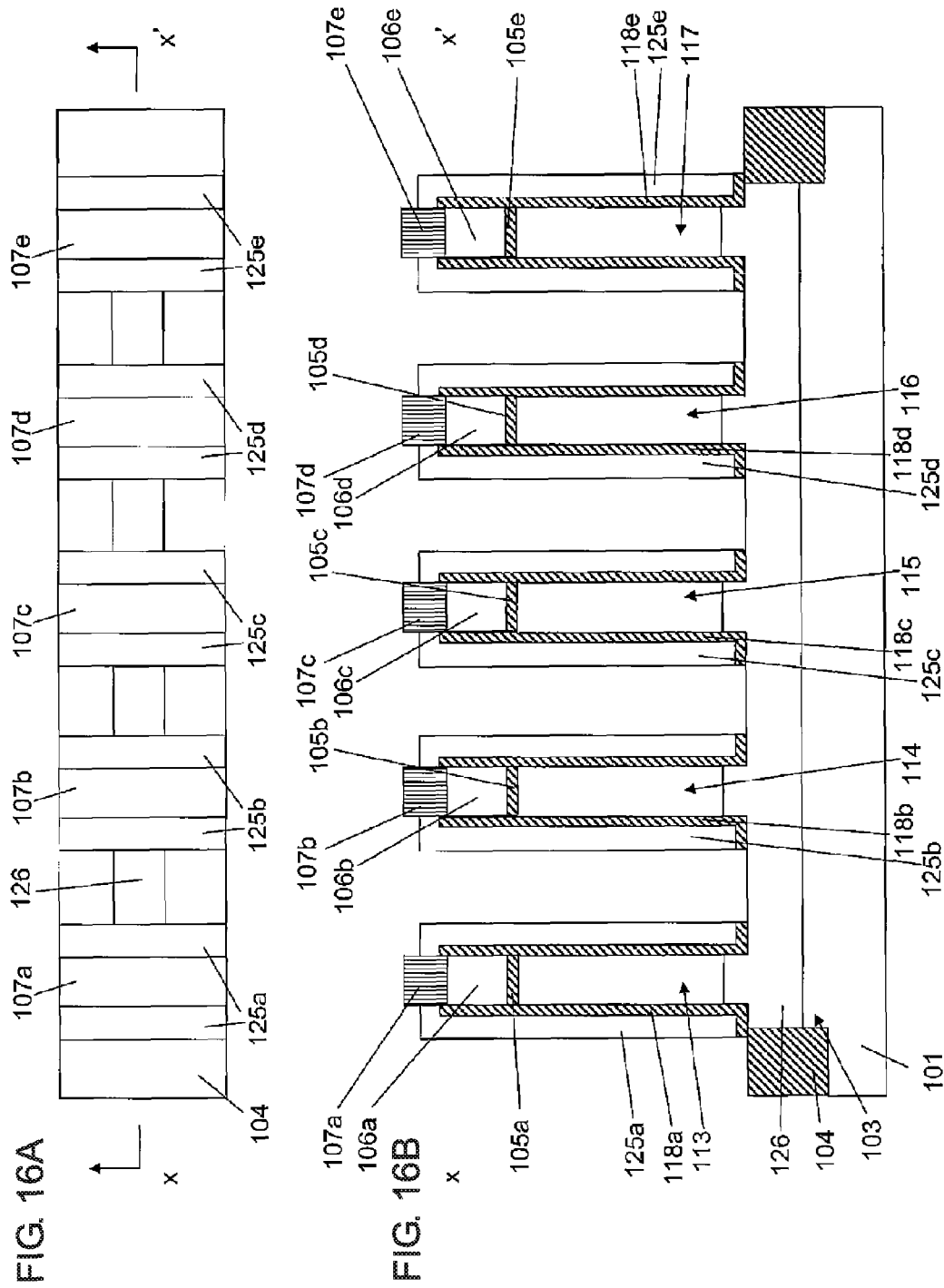

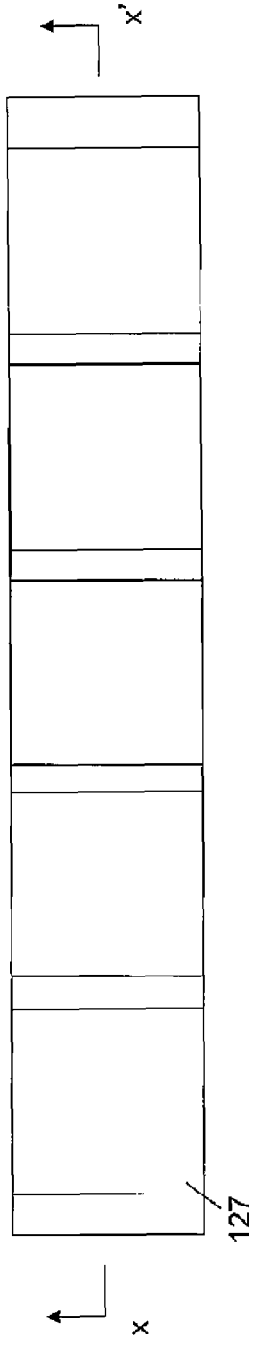
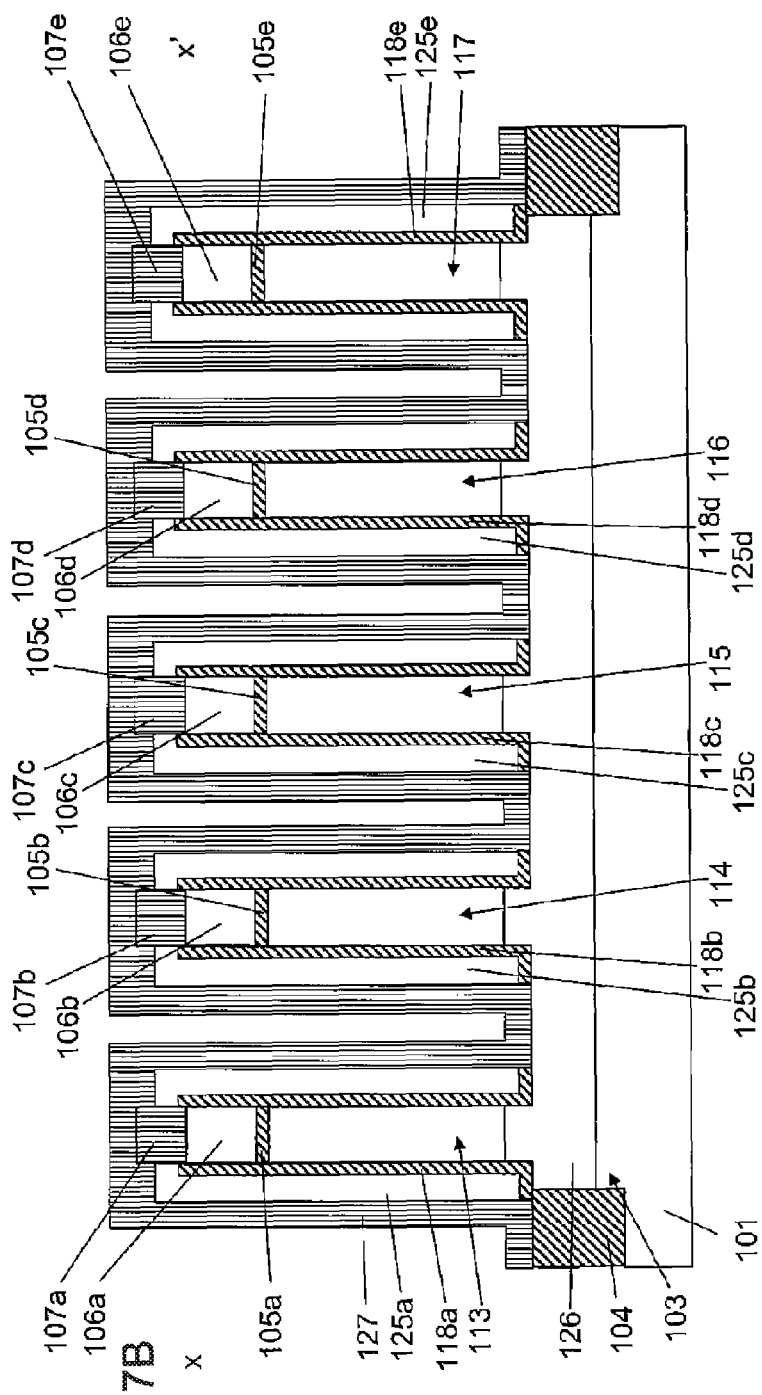
FIG. 17A
FIG. 17B

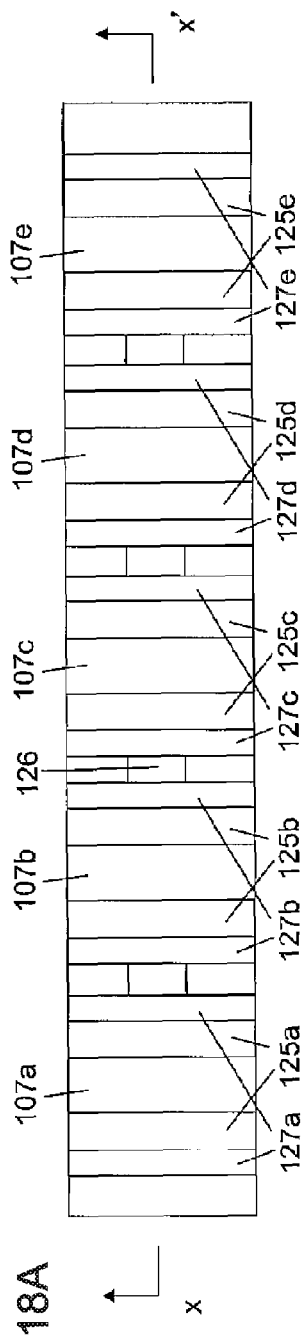
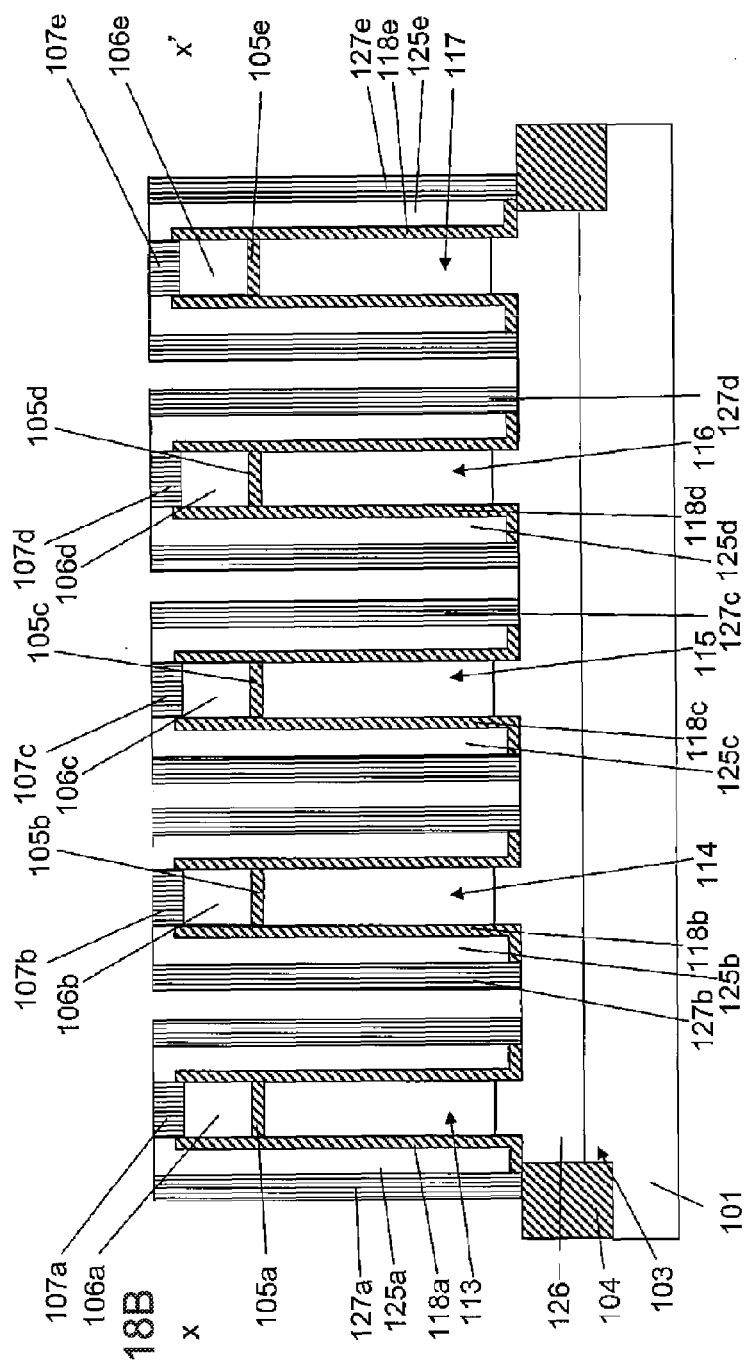
FIG. 18A
FIG. 18B

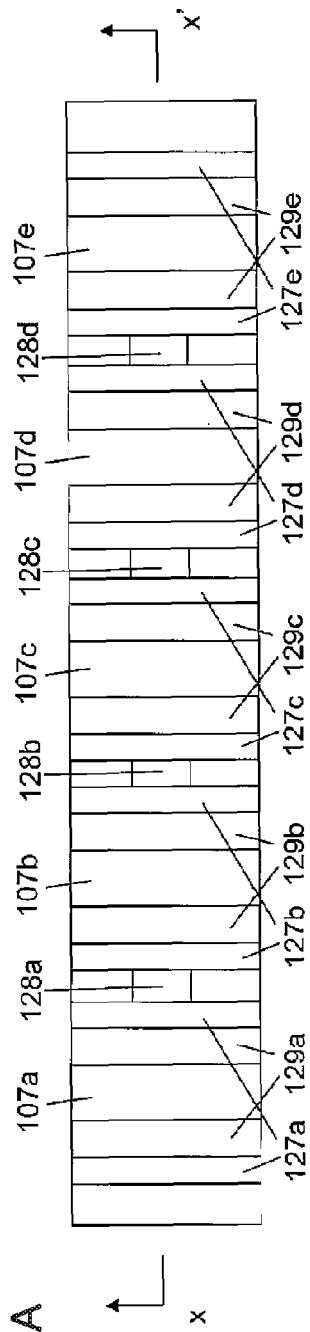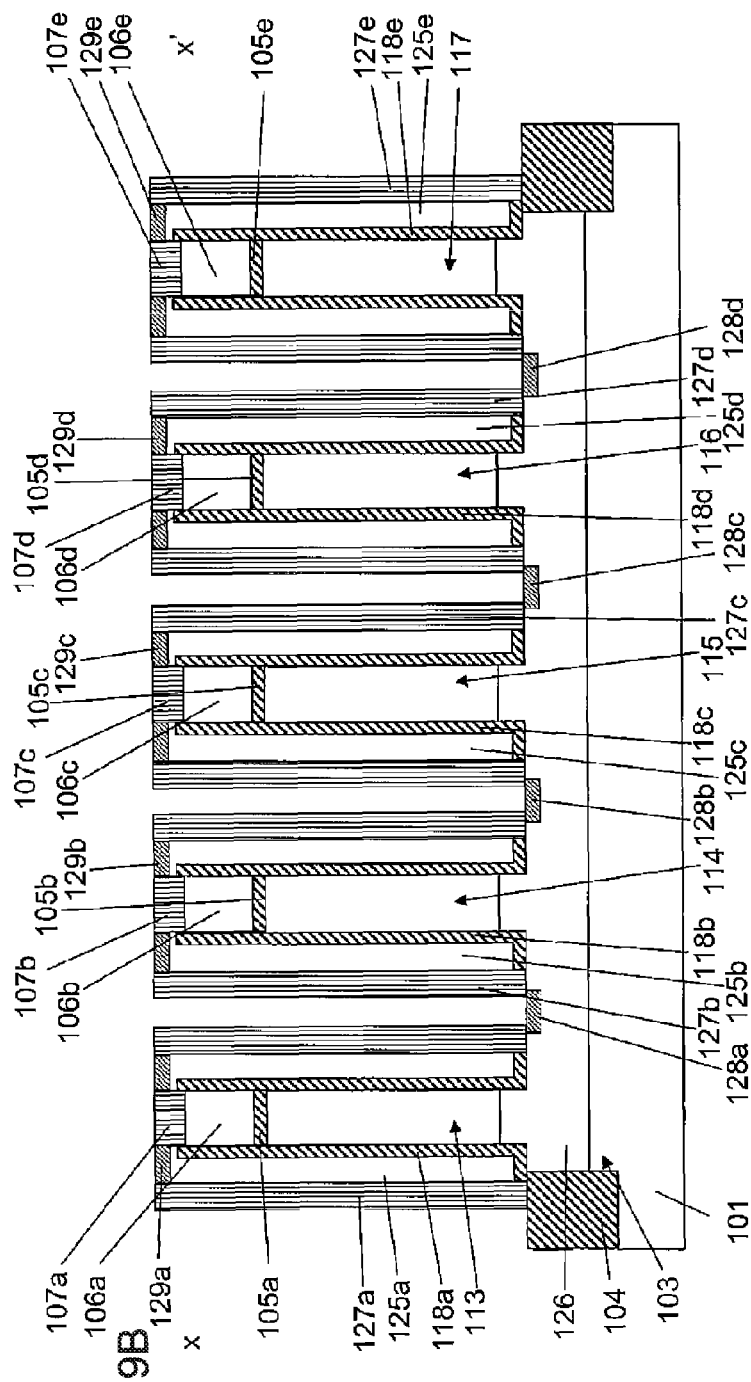
FIG. 19A
FIG. 19B

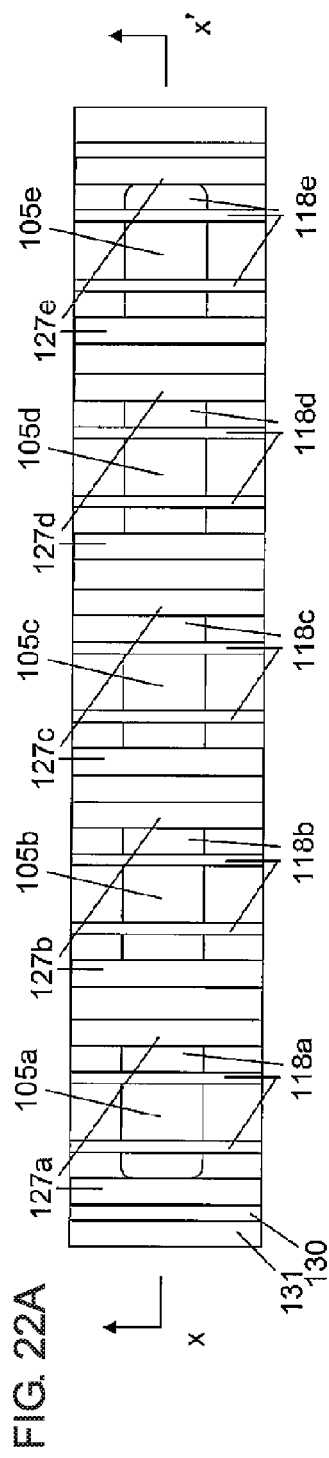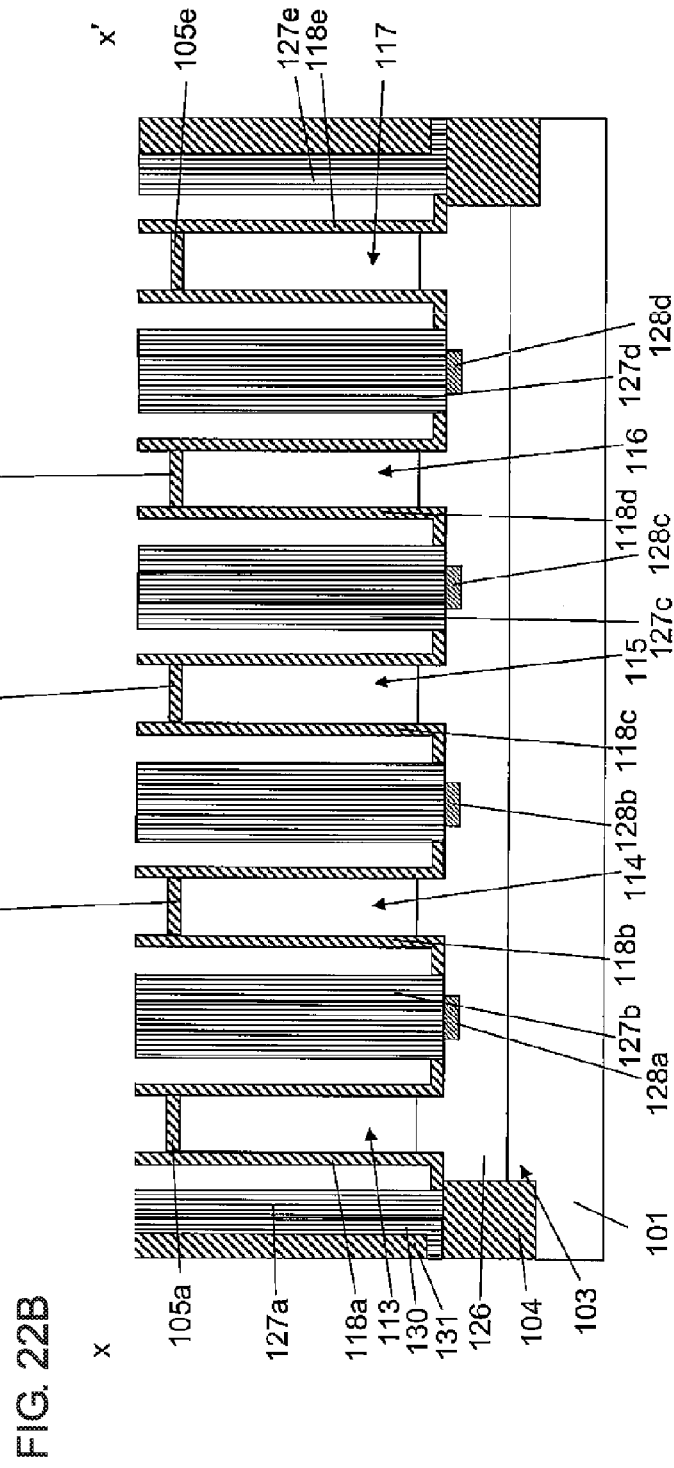
FIG. 22A
FIG. 22B

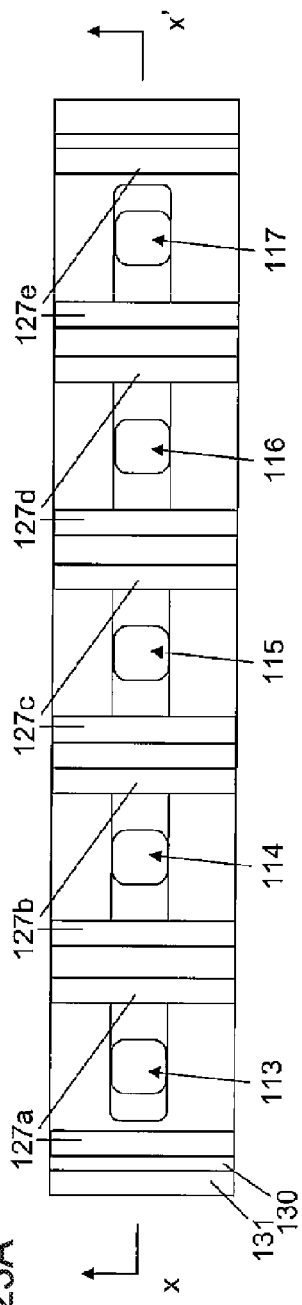
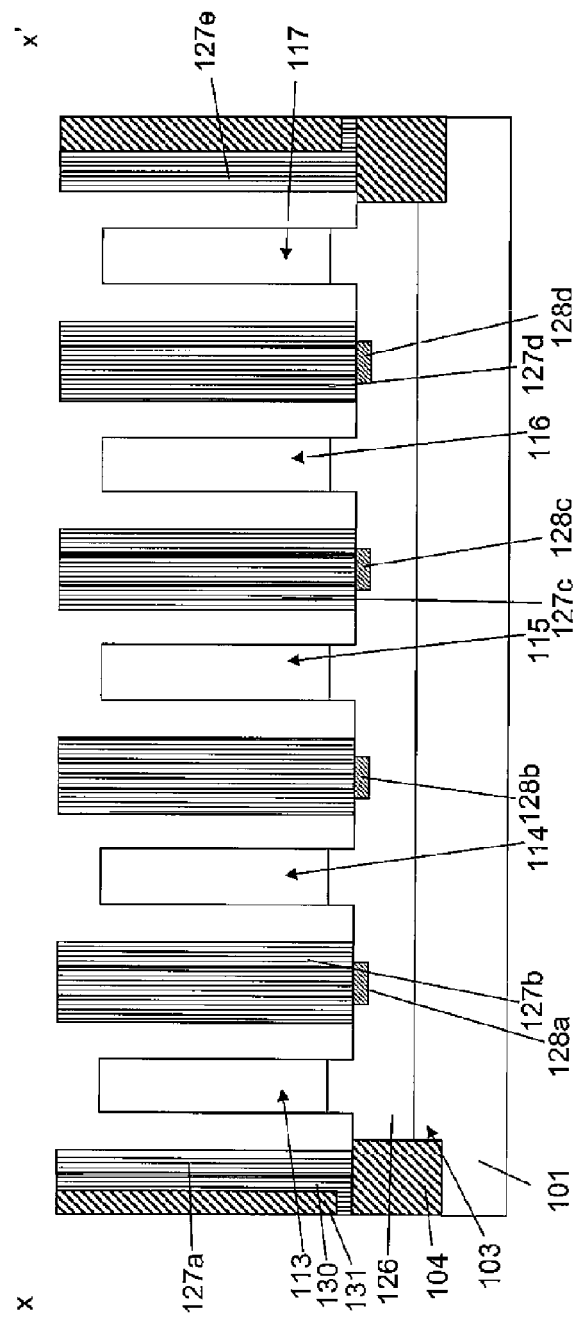

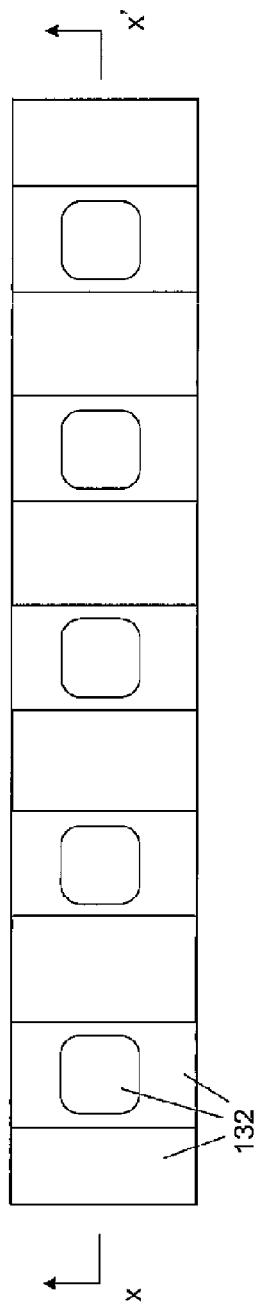
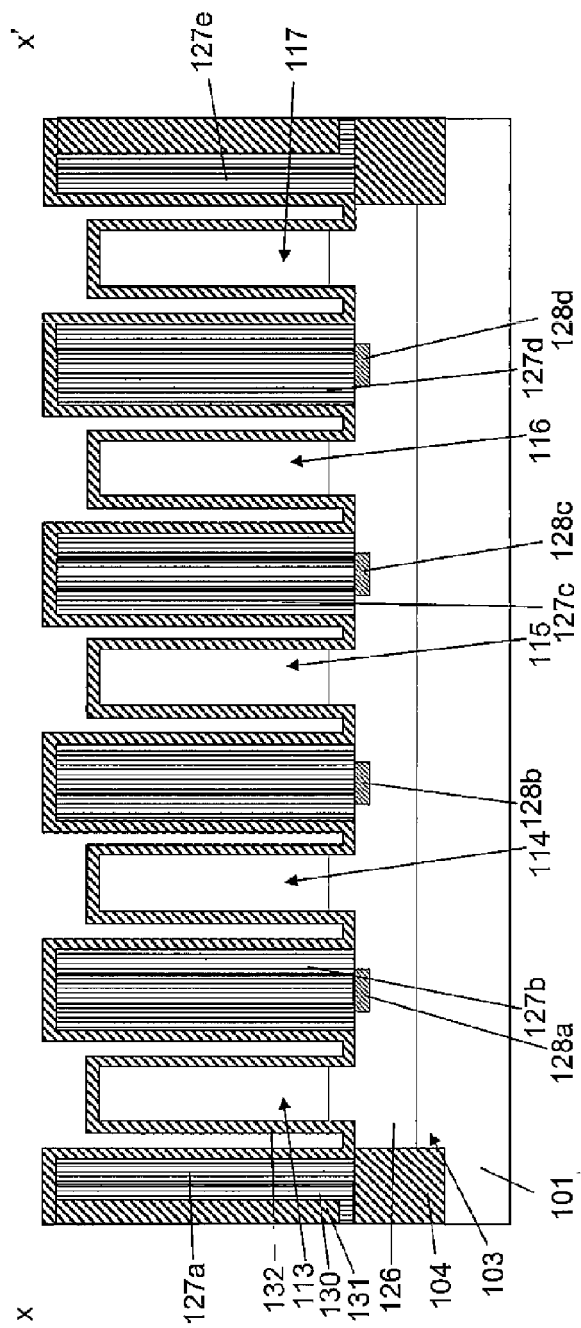
FIG. 24A
FIG. 24B

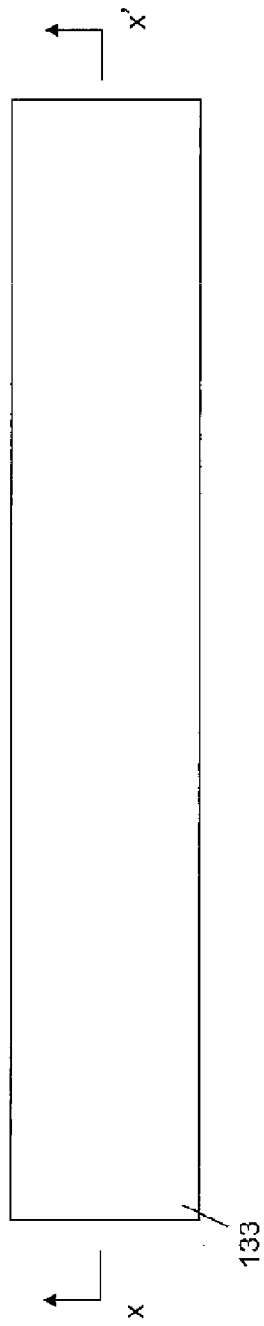
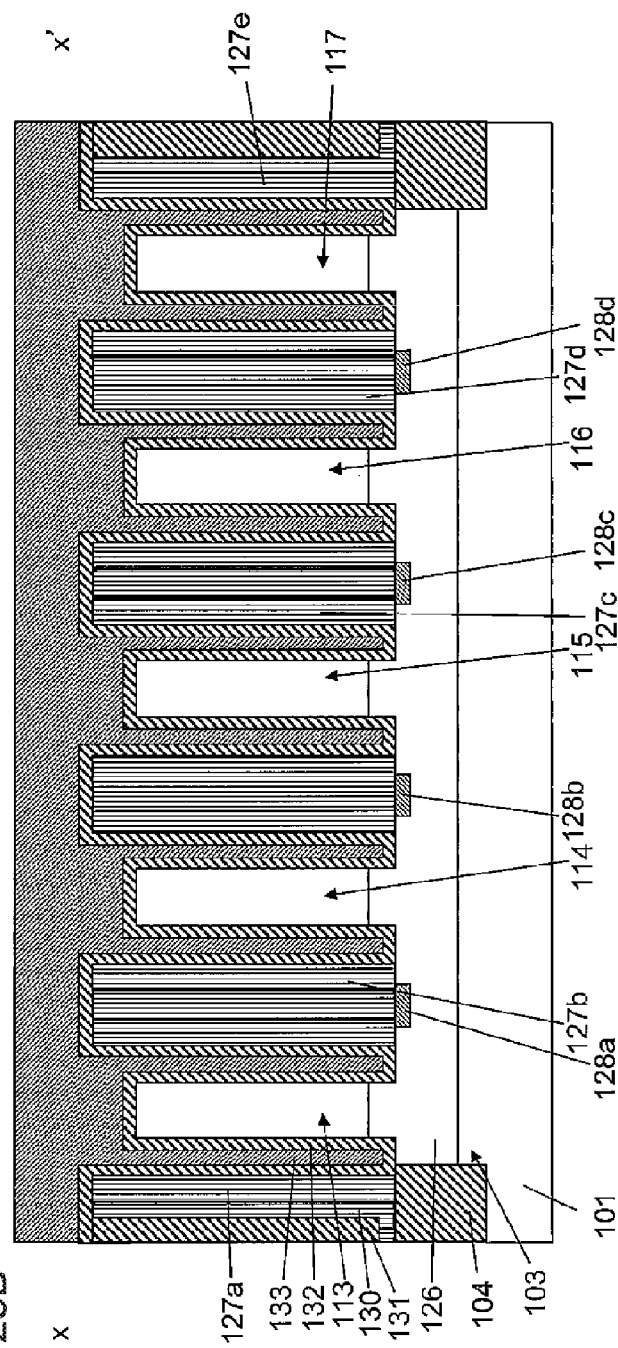
FIG. 25A
FIG. 25B

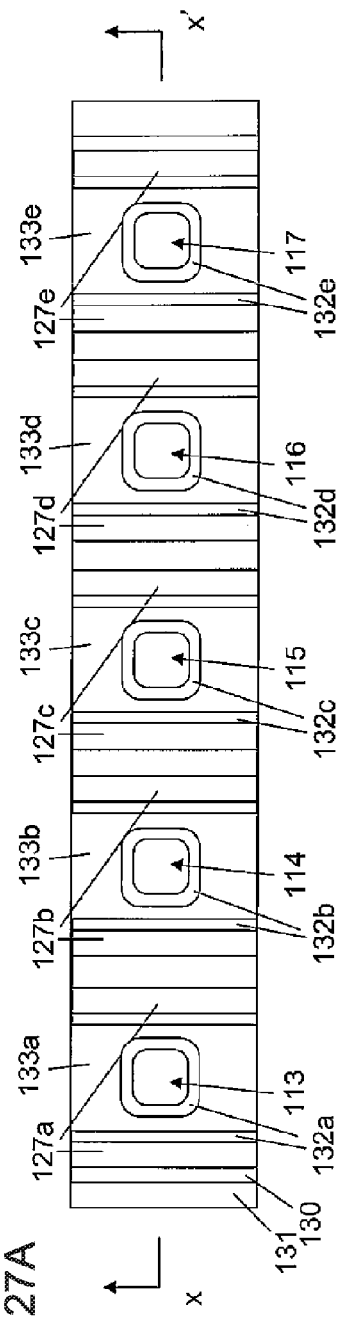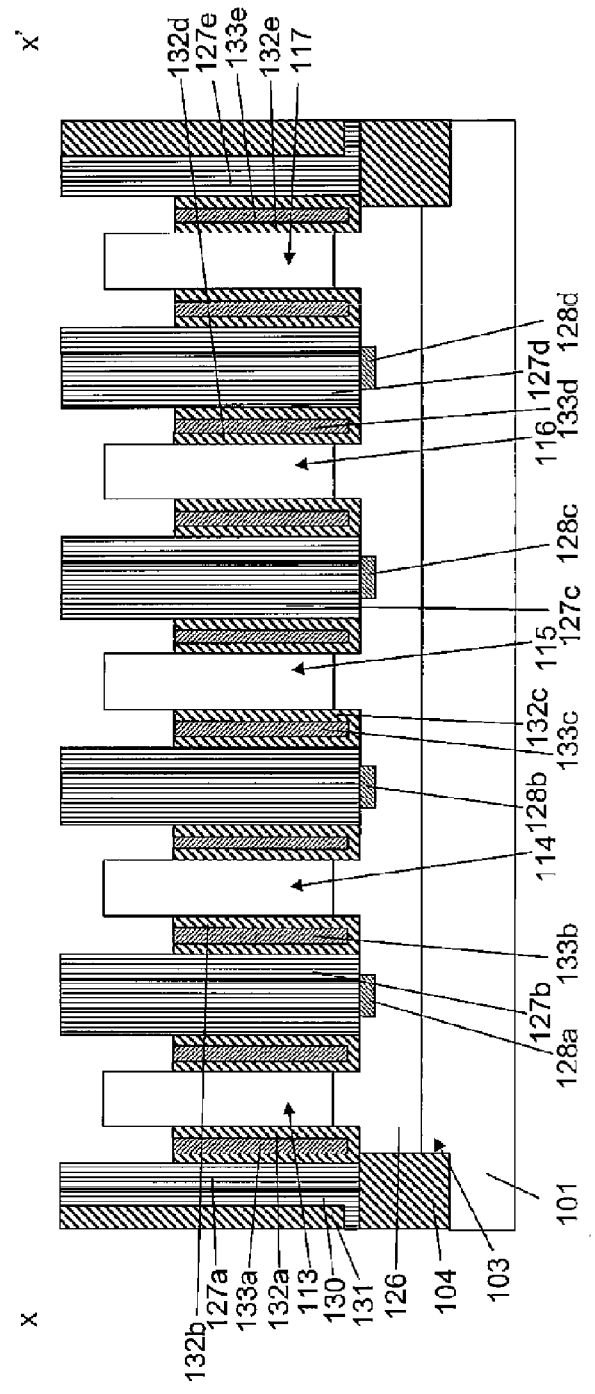
FIG. 27A
FIG. 27B

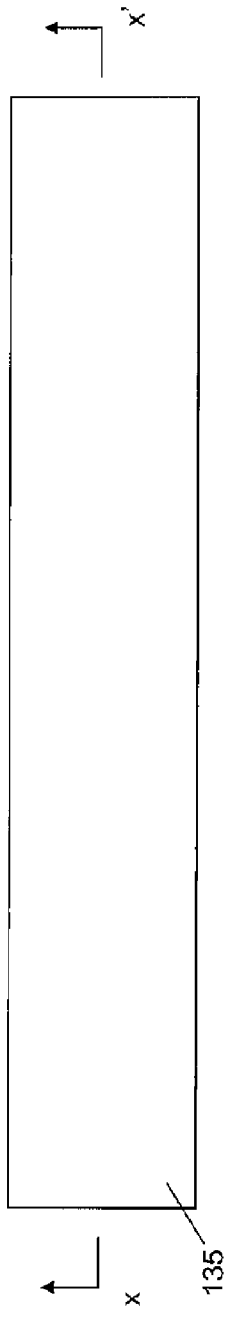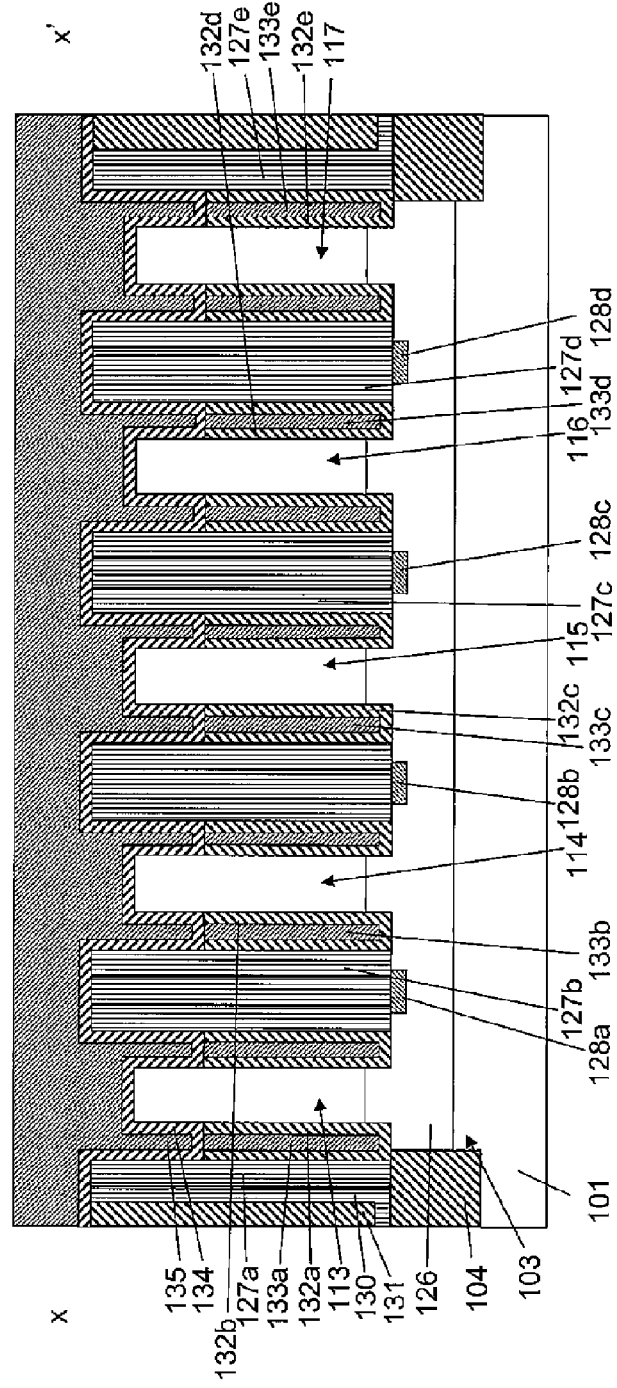
FIG. 29A
FIG. 29B

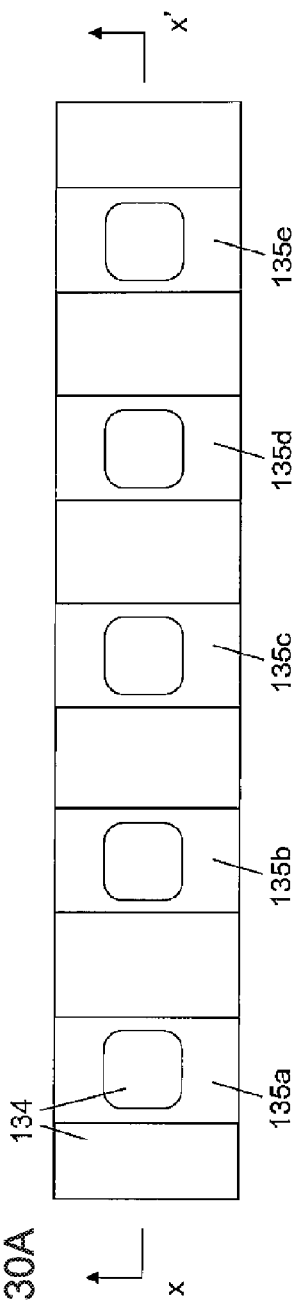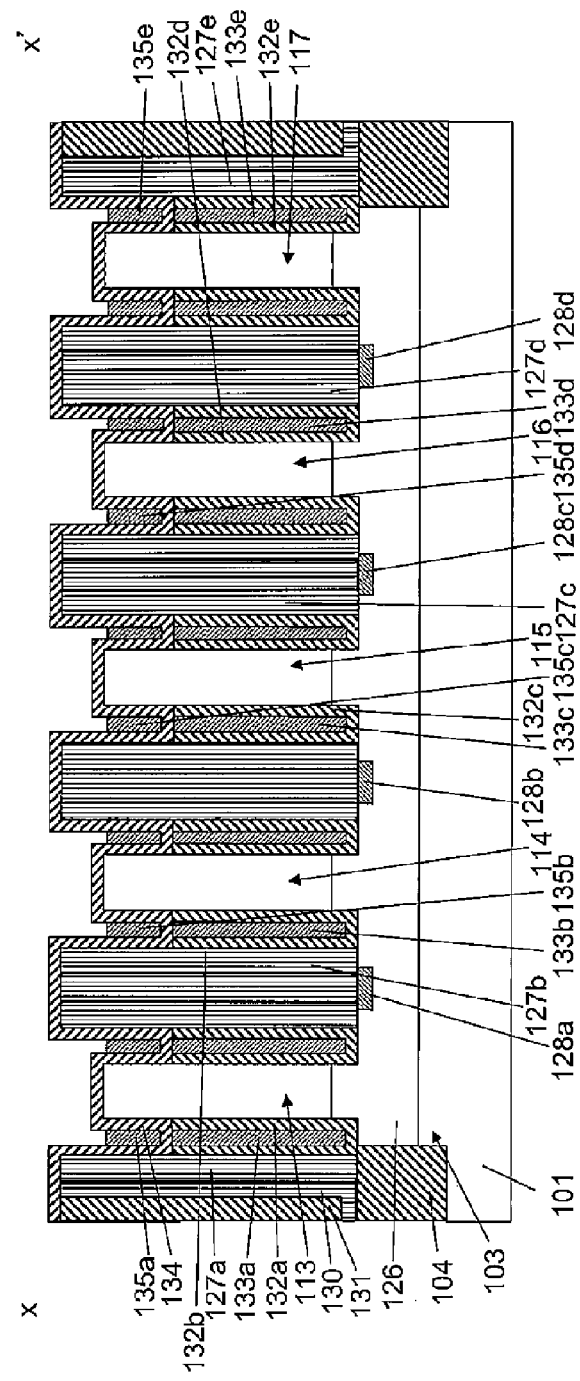
FIG. 30A
FIG. 30B

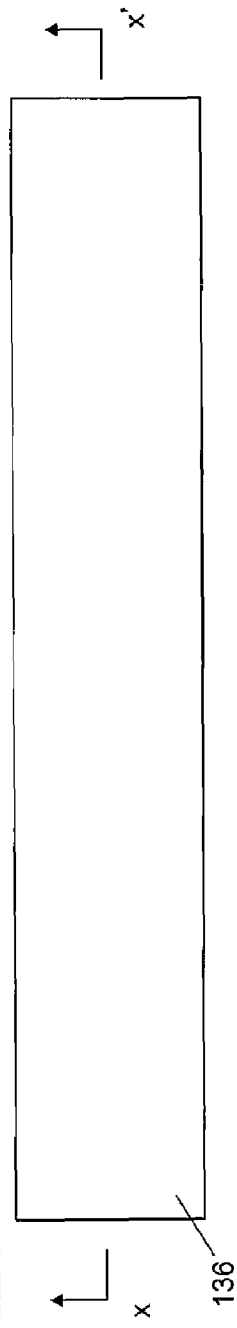
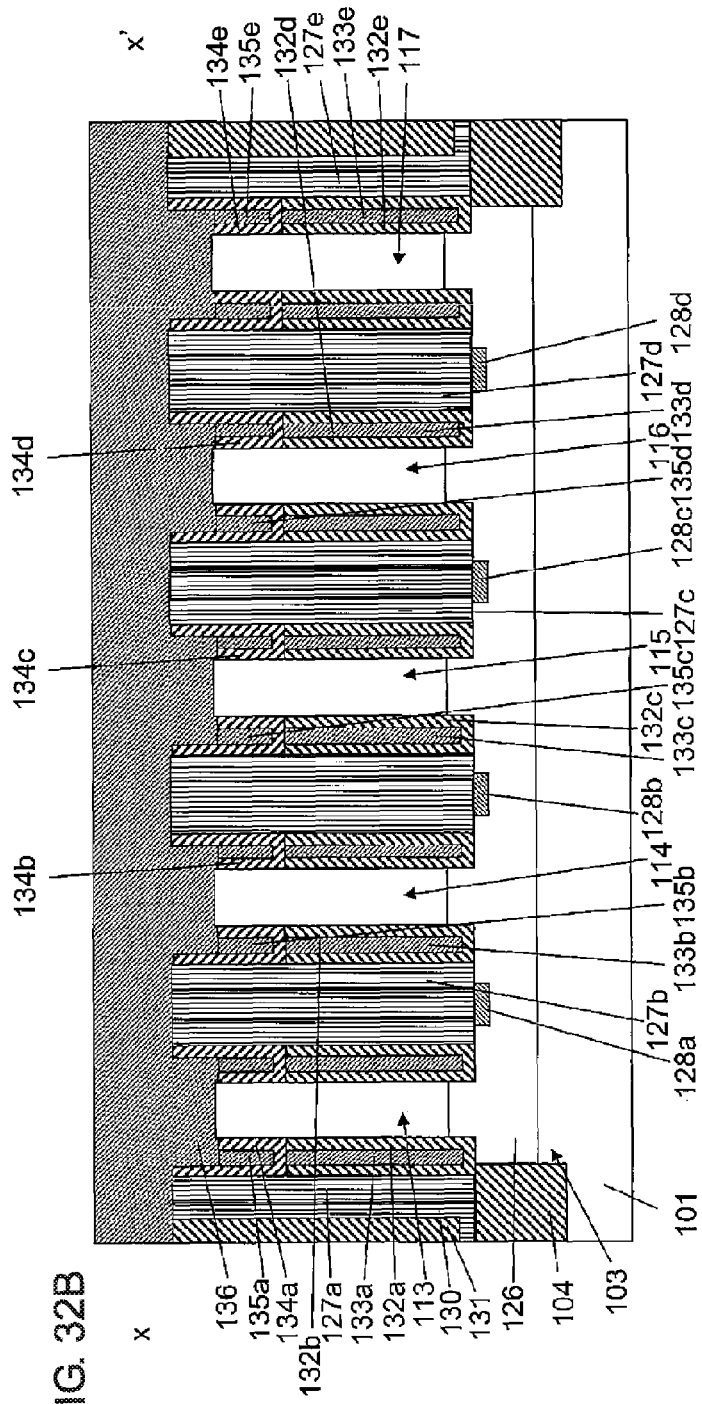
FIG. 32A
FIG. 32B

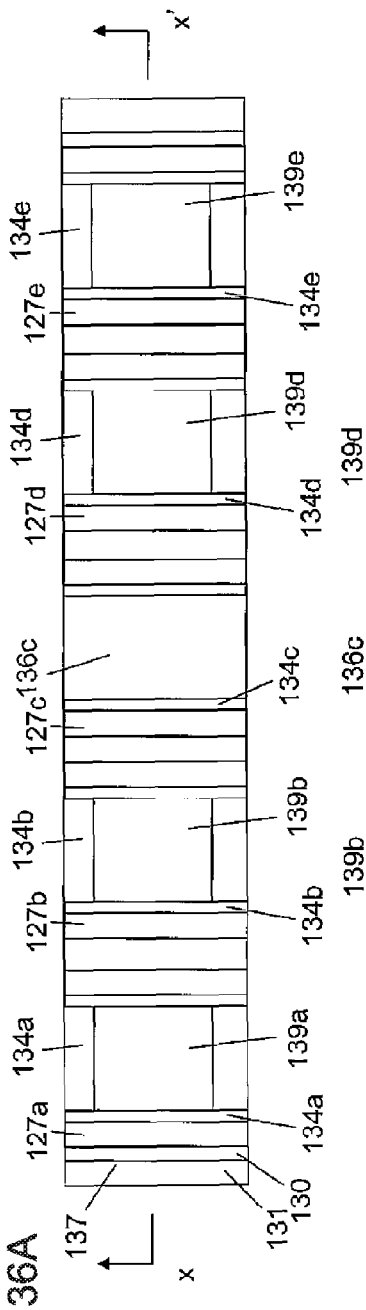
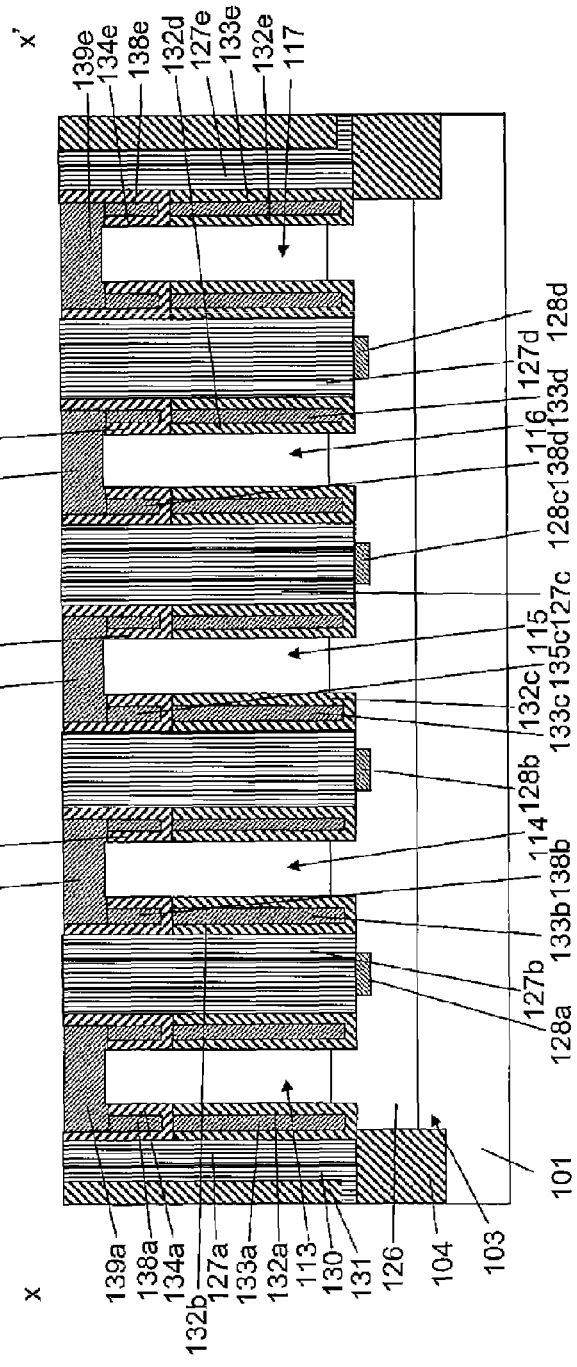
FIG. 36A
FIG. 36B

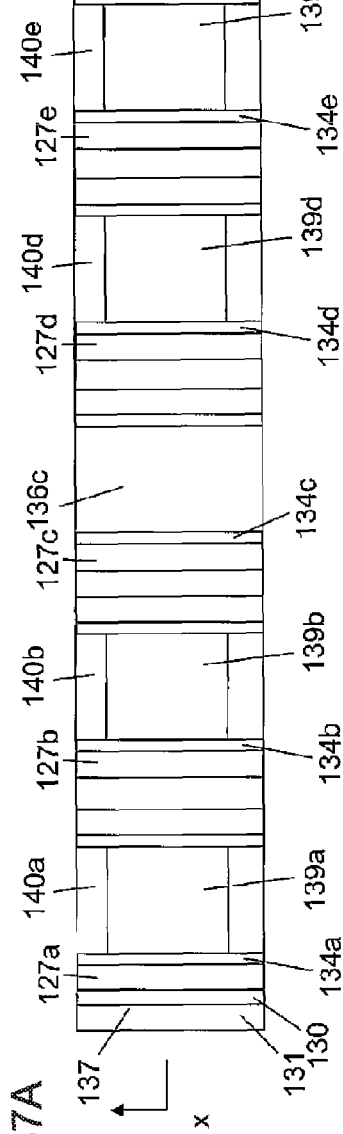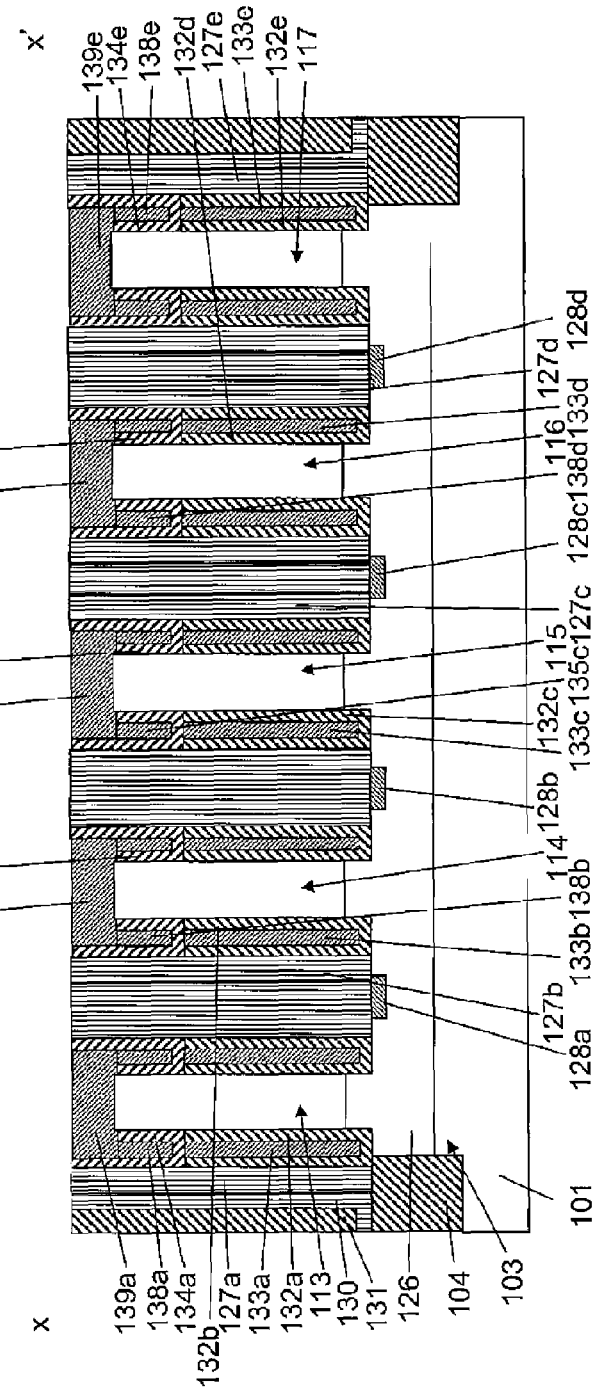
FIG. 37A
FIG. 37B

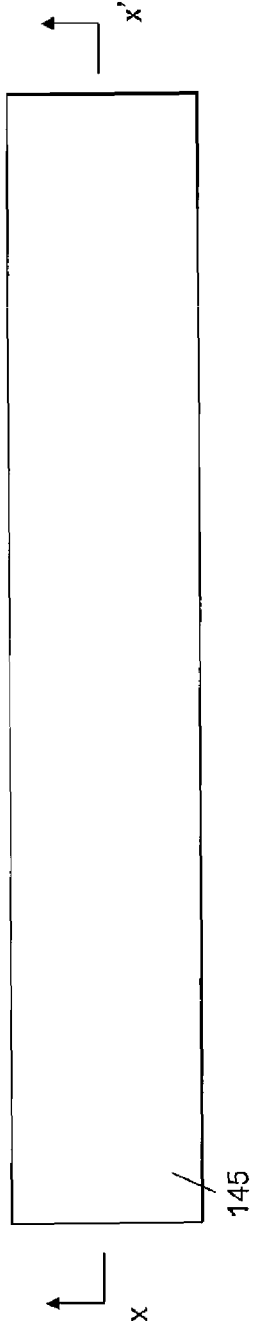
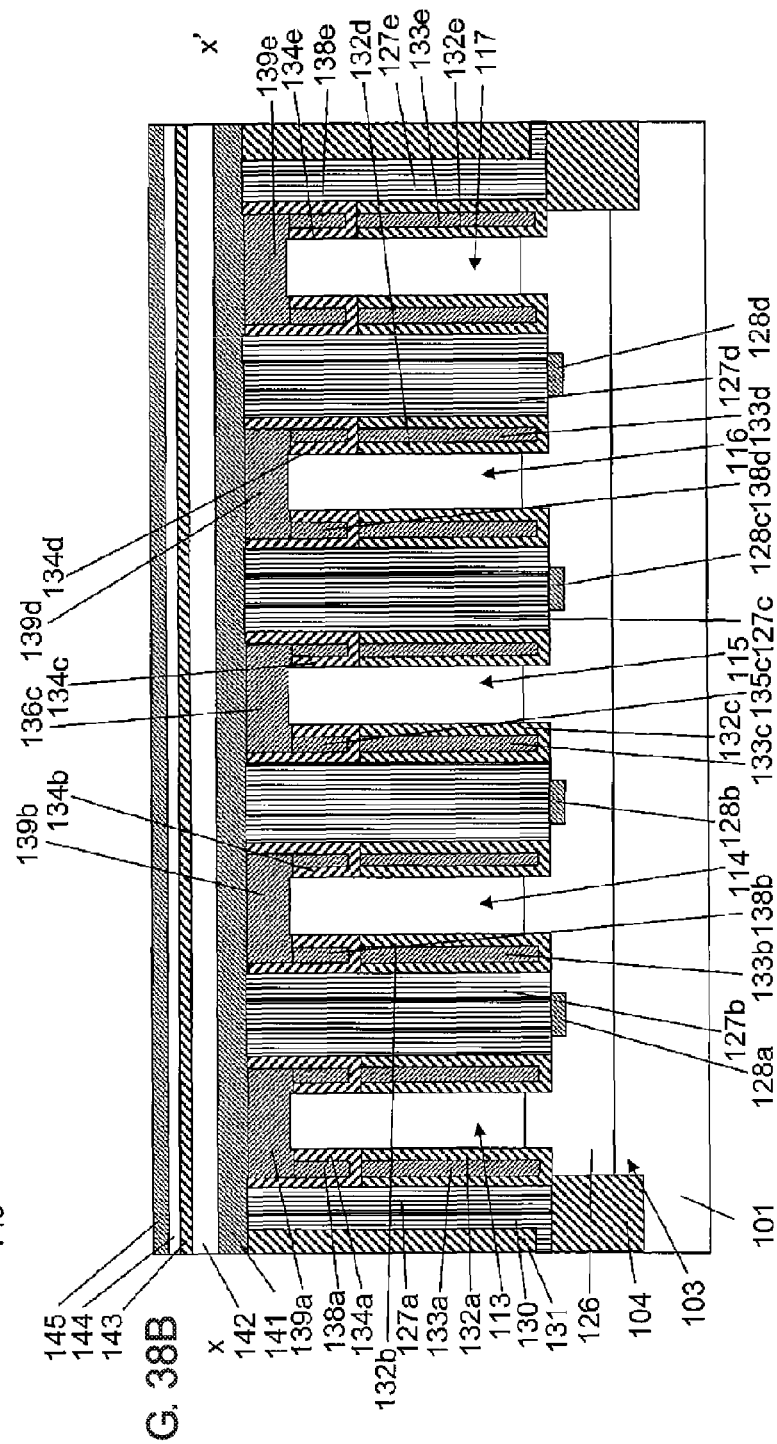
FIG. 38A
FIG. 38B

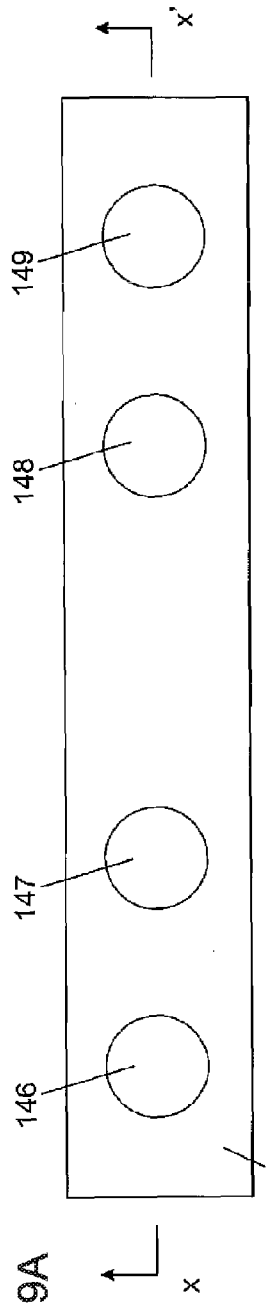
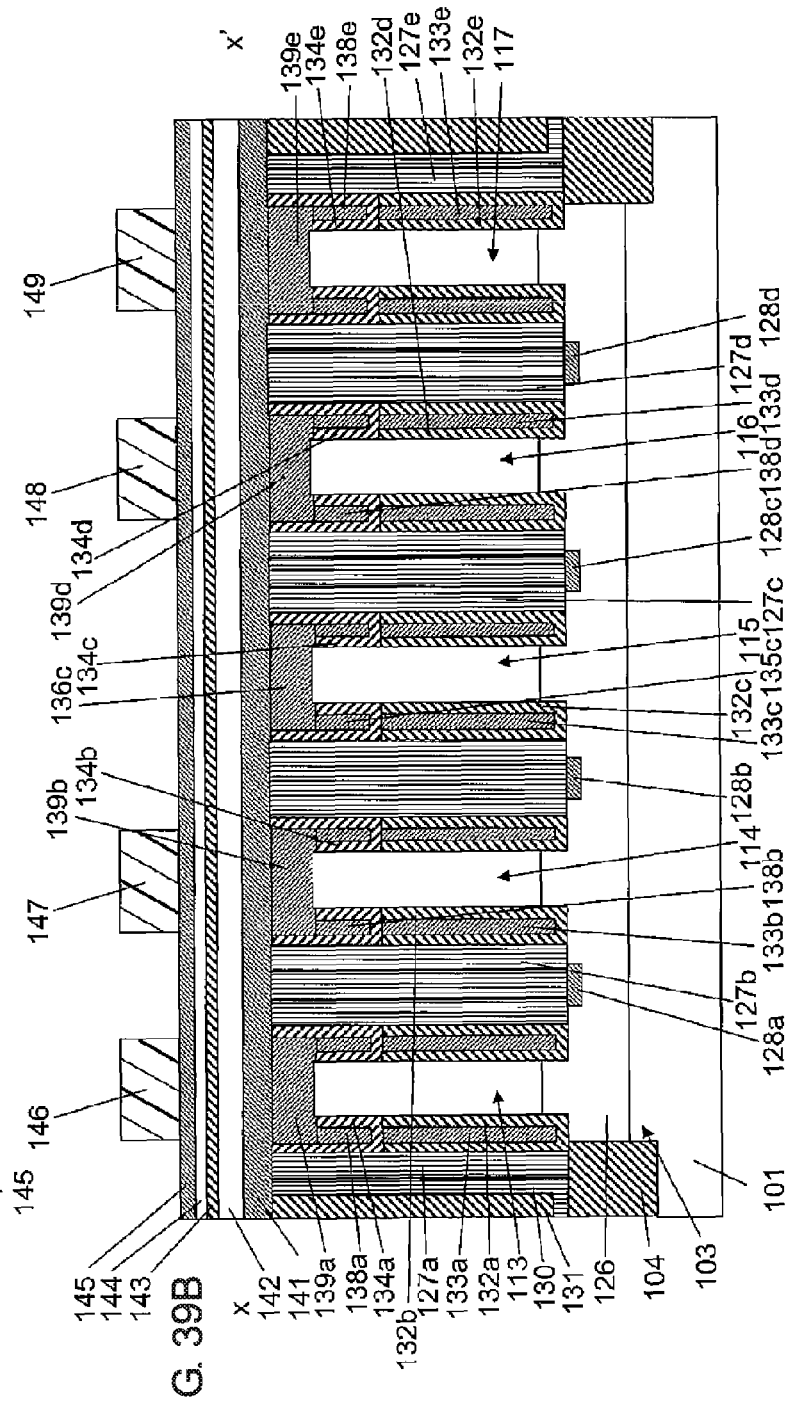
FIG. 39A
FIG. 39B

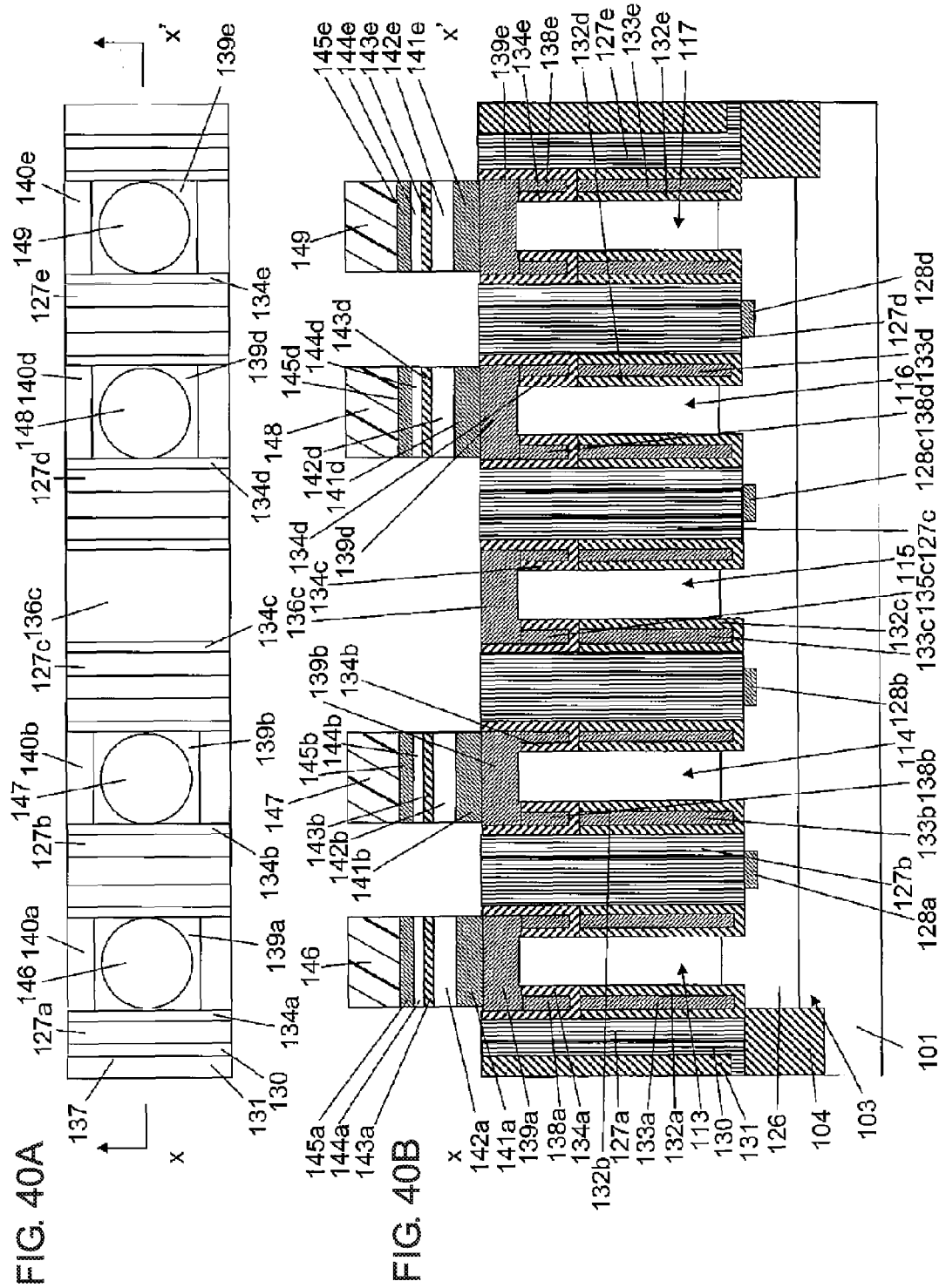

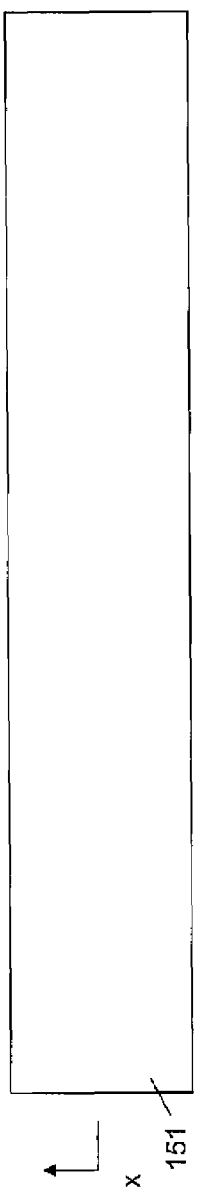
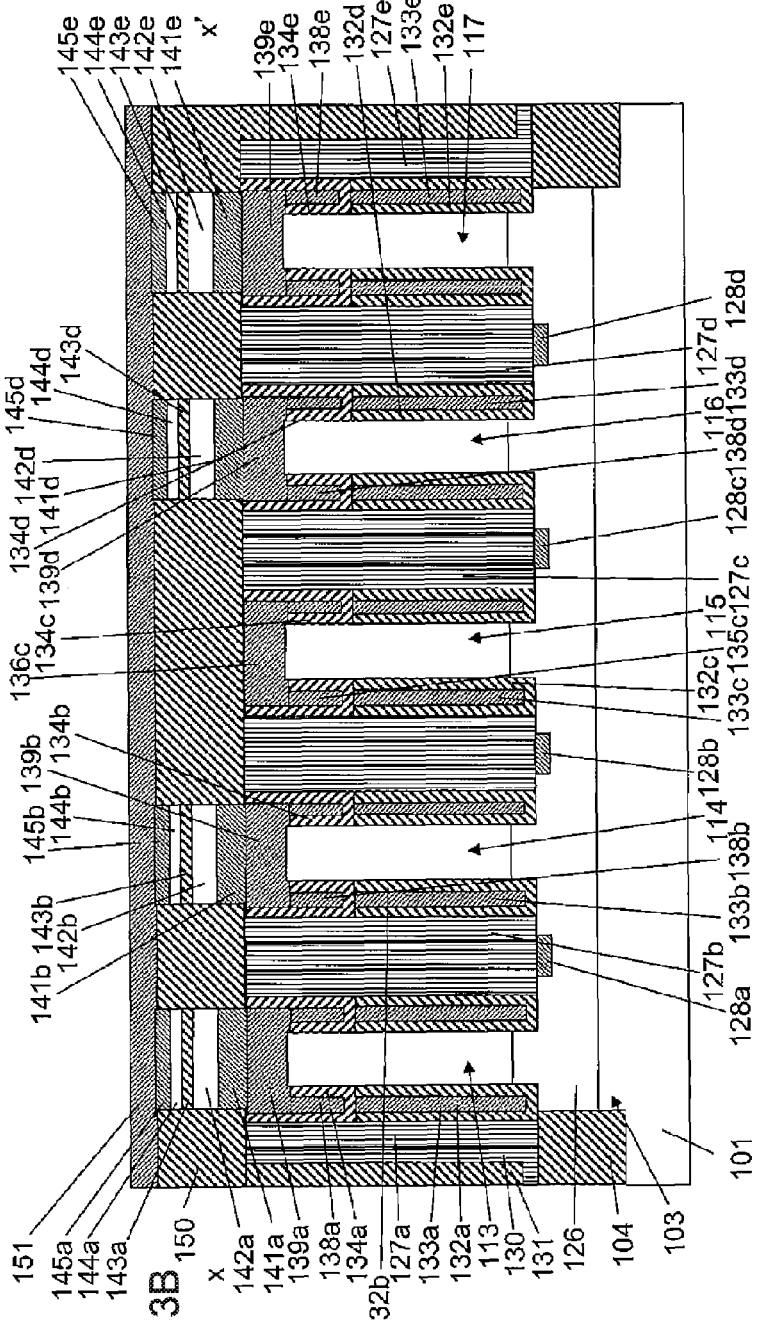
FIG. 43A
FIG. 43B

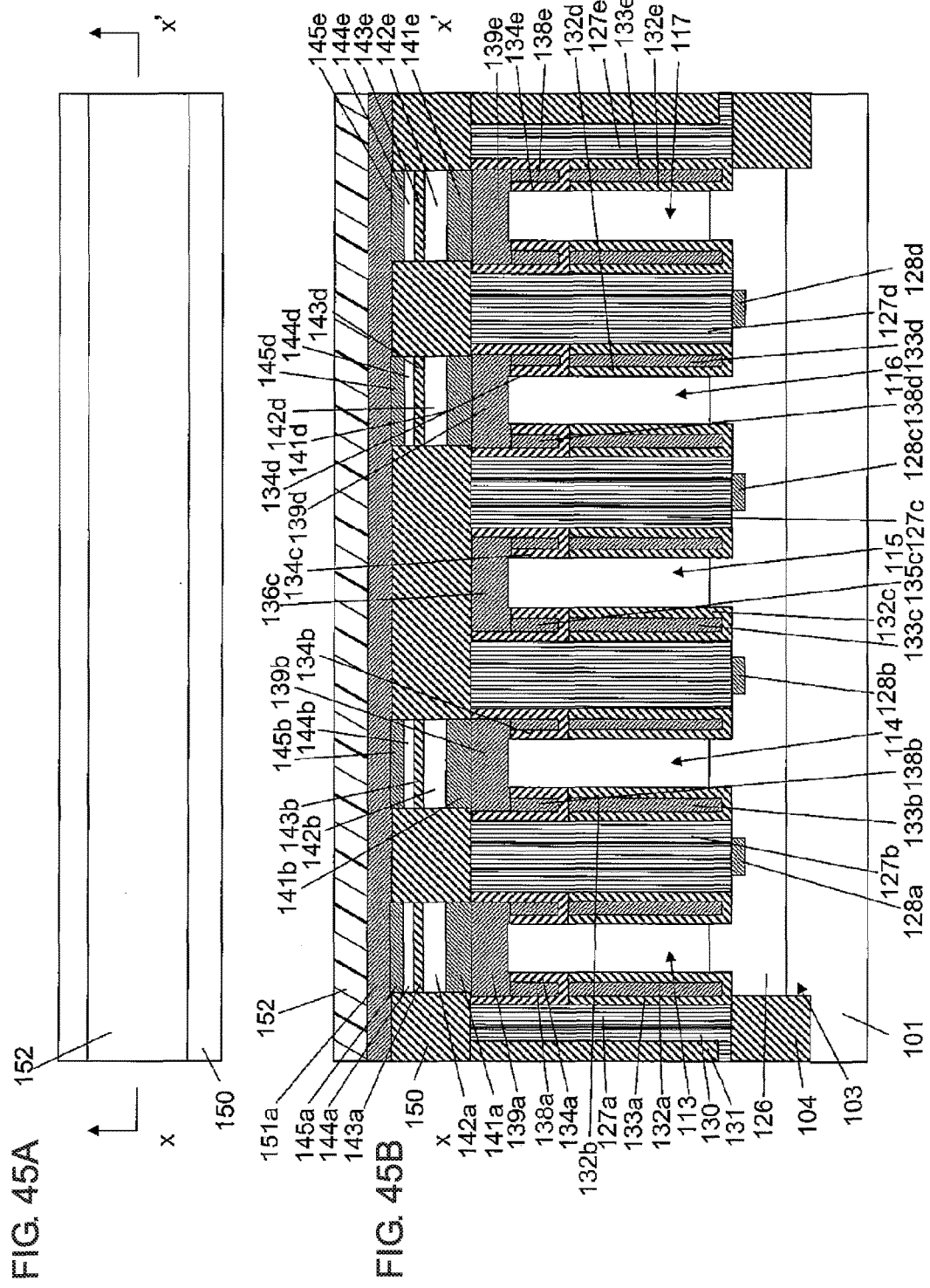

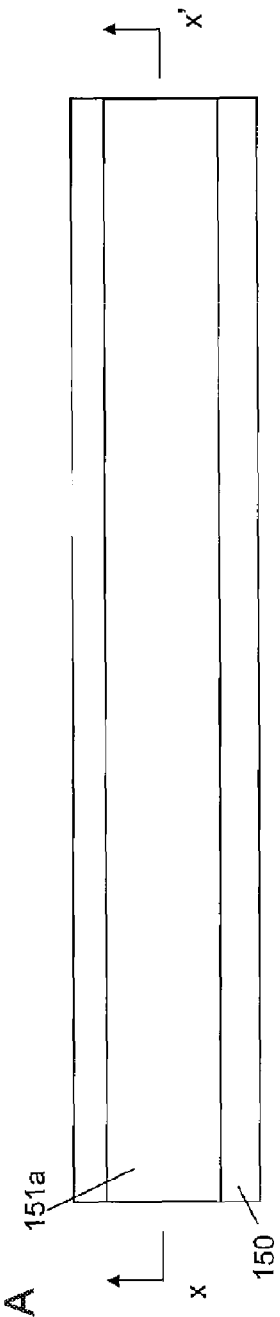
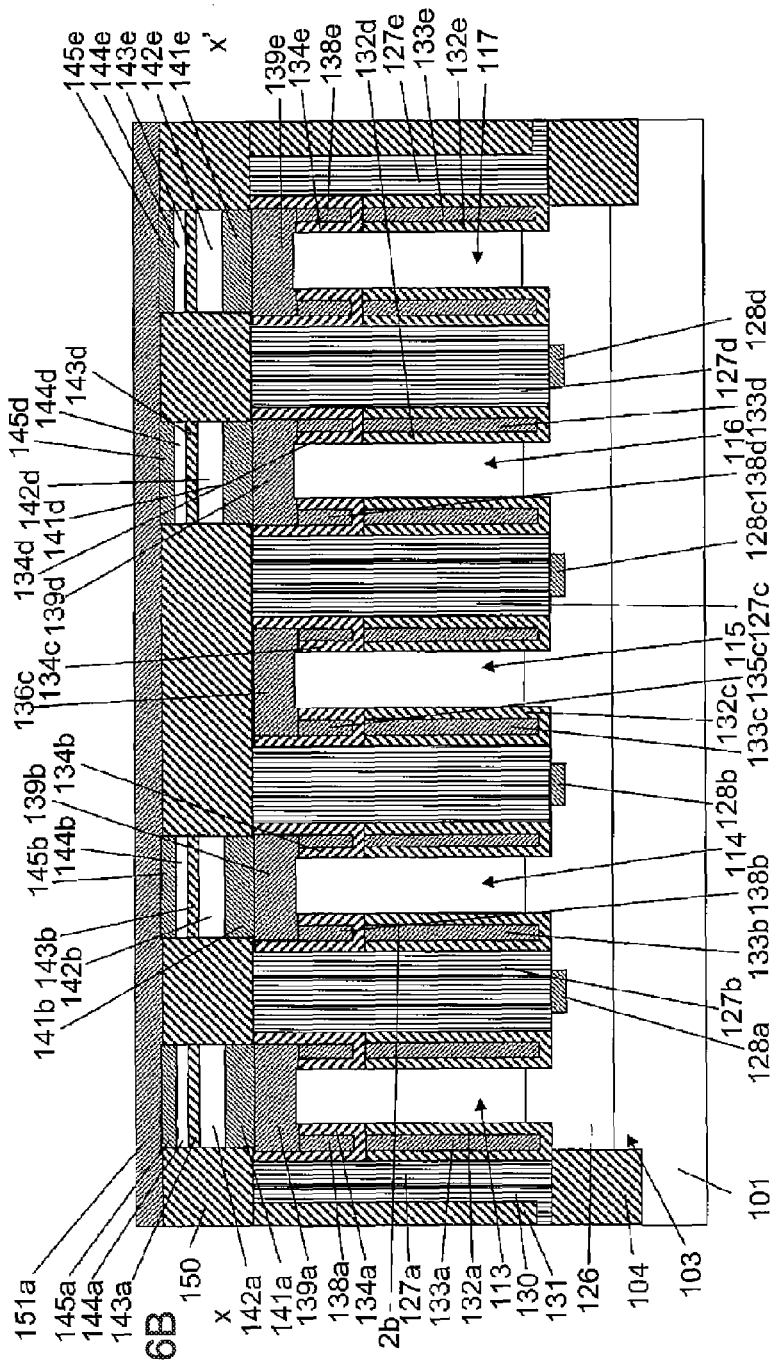
FIG. 46A
FIG. 46B

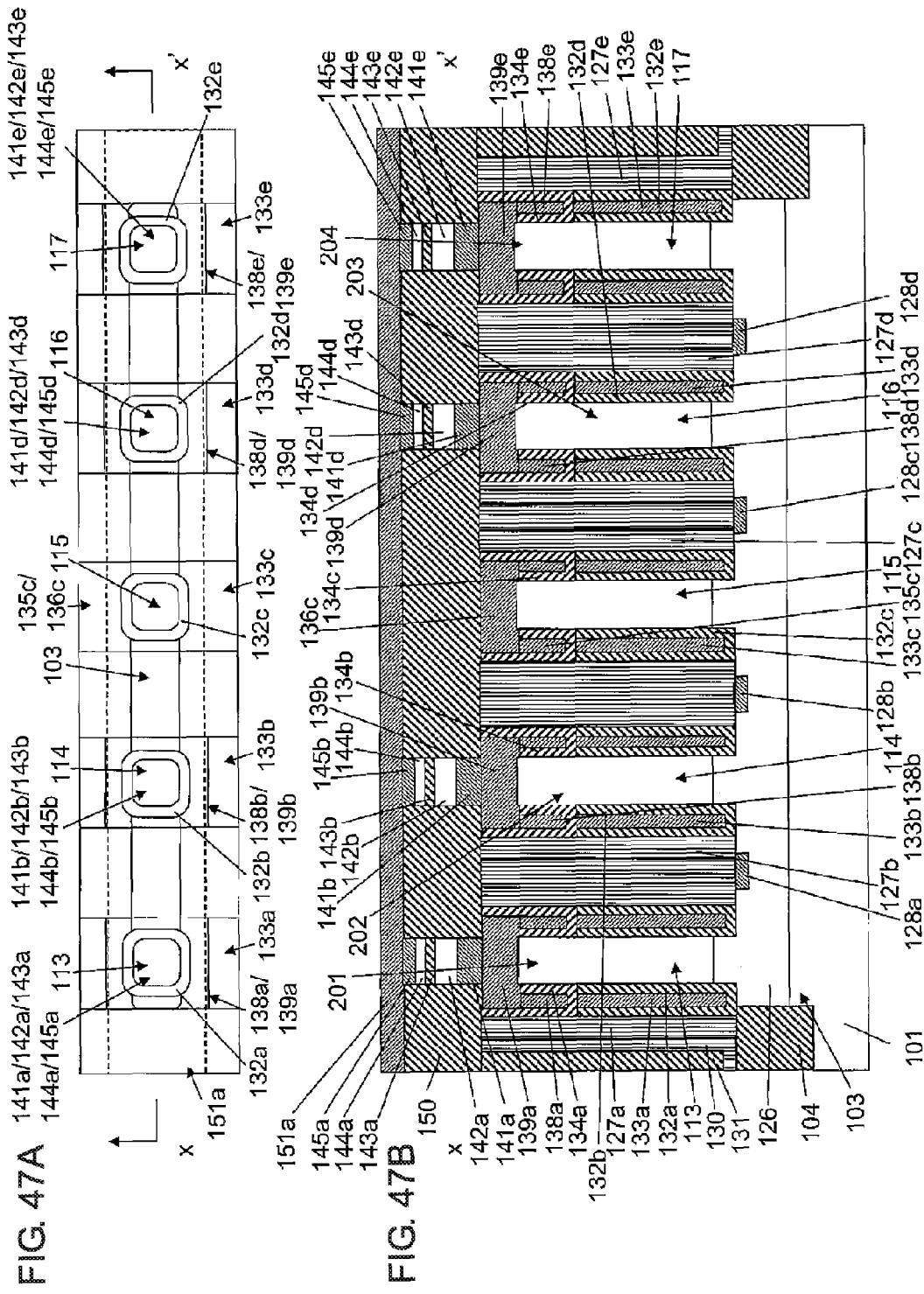

METHOD FOR PRODUCING A SEMICONDUCTOR DEVICE

CROSS-REFERENCE TO RELATED APPLICATION

This application is a divisional of copending application Ser. No. 15/093,986, filed Apr. 8, 2016, which is a continuation, under 35 U.S.C. §120, of copending international application No. PCT/JP2014/053441, filed Feb. 14, 2014; the entire contents of the earlier applications are incorporated herein by reference.

BACKGROUND OF THE INVENTION

Field of the Invention

The present invention relates to a semiconductor device and a method for producing a semiconductor device.

Description of the Related Art

In recent years, magnetoresistive random access memories have been developed (refer to, for example, Japanese Unexamined Patent Application Publication No. 2013-93592).

In the typical structure of a spin-transfer torque magnetoresistive random access memory (STT-M RAM) array illustrated in FIG. 6B of Japanese Unexamined Patent Application Publication No. 2013-93592, a source line (SL) is parallel to word lines (WL) and is perpendicular to bit lines (BL). In the case where this structure is formed using planar transistors, as illustrated in FIG. 6B of the publication, one source line is necessary for two memory cells, and one source line is arranged between word lines. This layout increases the area used for a bit-cell array and has large bit-cell dimensions.

A surrounding gate transistor (hereinafter referred to as "SGT") having a structure in which a source, a gate, and a drain are arranged in a direction perpendicular to a substrate and a gate electrode surrounds a pillar-shaped semiconductor layer has been proposed (refer to, for example, Japanese Unexamined Patent Application Publication No. 2004-356314).

With a decrease in the width of a silicon pillar, it becomes more difficult to allow an impurity to be present in the silicon pillar because the density of silicon is $5\times10^{22}$ atoms/cm$^3$.

In a typical SGT, it has been proposed that an impurity concentration of a channel is set to be a low concentration of $10^{17}$ cm$^{-3}$ or less, and the threshold voltage is determined by changing the work function of a gate material (refer to, for example, Japanese Unexamined Patent Application Publication No. 2004-356314).

It has been disclosed that, in a planar MOS transistor, the sidewall of a lightly doped drain (LDD) region is formed of a polycrystalline silicon having the same conductivity type as a low-concentration layer, surface carriers of the LDD region are induced by the difference in work function, and the impedance of the LDD region can be reduced compared with oxide film sidewall LDD-type MOS transistors (refer to, for example, Japanese Unexamined Patent Application Publication No. 11-297984). It has also been disclosed that the polycrystalline silicon sidewall is electrically insulated from a gate electrode. The drawings of the publication illustrate that the polycrystalline silicon sidewall is insulated from a source and a drain by an interlayer insulating film.

BRIEF SUMMARY OF THE INVENTION

It is desirable to provide a structure of a memory which includes a magnetic tunnel junction storage element and whose cell area can be reduced, and a method for producing the memory.

A semiconductor device according to an aspect of the present invention includes four or more first memory cells arranged on a row, the first memory cells each including a first pillar-shaped semiconductor layer, a first gate insulating film formed around the first pillar-shaped semiconductor layer, a first gate line formed around the first gate insulating film, a third gate insulating film formed around an upper portion of the first pillar-shaped semiconductor layer, a first contact electrode formed around the third gate insulating film, a second contact electrode that connects an upper portion of the first pillar-shaped semiconductor layer and an upper portion of the first contact electrode, and a first magnetic tunnel junction storage element formed on the second contact electrode; a first source line that connects lower portions of the first pillar-shaped semiconductor layers to each other; a first bit line that extends in a direction perpendicular to a direction in which the first gate line extends and that is connected to an upper portion of the first magnetic tunnel junction storage element; and a second source line that extends in a direction perpendicular to a direction in which the first source line extends.

The first contact electrode may be made of a metal, and the metal of the first contact electrode may have a work function of 4.0 to 4.2 eV.

The first contact electrode may be made of a metal, and the metal of the first contact electrode may have a work function of 5.0 to 5.2 eV.

The semiconductor device may include a second pillar-shaped semiconductor layer arranged on the row on which the first memory cells are arranged, a second gate insulating film formed around the second pillar-shaped semiconductor layer, a second gate line formed around the second gate insulating film, a fourth gate insulating film formed around an upper portion of the second pillar-shaped semiconductor layer, a third contact electrode formed around the fourth gate insulating film, and a fourth contact electrode that connects an upper portion of the second pillar-shaped semiconductor layer and an upper portion of the third contact electrode. In this case, a lower portion of the second pillar-shaped semiconductor layer may be connected to the first source line, and an upper portion of the second pillar-shaped semiconductor layer may be connected to the second source line.

The semiconductor device may include a first fin-shaped semiconductor layer formed on a semiconductor substrate, a first insulating film formed around the first fin-shaped semiconductor layer, the first pillar-shaped semiconductor layers formed on the first fin-shaped semiconductor layer, the second pillar-shaped semiconductor layer formed on the first fin-shaped semiconductor layer, and a second diffusion layer formed in lower portions of the first pillar-shaped semiconductor layers and in a lower portion of the second pillar-shaped semiconductor layer. In this case, the second diffusion layer may be further formed in the first fin-shaped semiconductor layer, and the second diffusion layer may function as the first source line.

The third contact electrode and the fourth contact electrode may extend in the same direction as a direction in which the second gate line extends and may operate as the second source line.

The first gate line and the second gate line may each be made of a metal.

A width of each of the first pillar-shaped semiconductor layers in a direction perpendicular to a direction in which the first fin-shaped semiconductor layer extends may be equal to a width of the first fin-shaped semiconductor layer in the direction perpendicular to the direction in which the first fin-shaped semiconductor layer extends.

The first gate insulating film may be further provided around and on a bottom portion of the first gate line.

A cross section of the first magnetic tunnel junction storage element formed on each of the first pillar-shaped semiconductor layers may have the same shape as a cross section of the first pillar-shaped semiconductor layer.

A method for producing a semiconductor device according to another aspect of the present invention includes a first step of forming a first fin-shaped semiconductor layer on a semiconductor substrate, and forming a first insulating film around the first fin-shaped semiconductor layer; a second step of, after the first step, forming a second insulating film around the first fin-shaped semiconductor layer, depositing a first polysilicon on the second insulating film and planarizing the first polysilicon, forming a second resist for forming first and second gate lines, a first pillar-shaped semiconductor layer, and a second pillar-shaped semiconductor layer in a direction perpendicular to a direction in which the first fin-shaped semiconductor layer extends, and etching the first polysilicon, the second insulating film, and the first fin-shaped semiconductor layer to form a first pillar-shaped semiconductor layer, a first dummy gate derived from the first polysilicon, a second pillar-shaped semiconductor layer, and a second dummy gate derived from the first polysilicon; a third step of, after the second step, forming a fourth insulating film around the first pillar-shaped semiconductor layer, the second pillar-shaped semiconductor layer, the first dummy gate, and the second dummy gate, depositing a second polysilicon around the fourth insulating film, and etching the second polysilicon so as to remain on side walls of the first dummy gate, the first pillar-shaped semiconductor layer, the second dummy gate, and the second pillar-shaped semiconductor layer to form a third dummy gate and a fourth dummy gate; a fourth step of, after the third step, forming a second diffusion layer in an upper portion of the first fin-shaped semiconductor layer, a lower portion of the first pillar-shaped semiconductor layer, and a lower portion of the second pillar-shaped semiconductor layer, forming a fifth insulating film around the third dummy gate and the fourth dummy gate, etching the fifth insulating film so as to remain as a sidewall to form a sidewall formed of the fifth insulating film, and forming a compound of a metal and a semiconductor in an upper portion of the second diffusion layer to form a first source line; a fifth step of, after the fourth step, depositing an interlayer insulating film and performing planarization to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film which is to become first and second gate insulating films around the first pillar-shaped semiconductor layer, around the second pillar-shaped semiconductor layer, and inside the fifth insulating film, depositing a metal and performing etch-back to form a first gate line around the first pillar-shaped semiconductor layer and a second gate line around the second pillar-shaped semiconductor layer; a sixth step of, after the fifth step, removing exposed portions of the gate insulating film which is to become first and second gate insulating films, forming a gate insulating film which is to become third and fourth gate insulating films around an upper portion of the first pillar-shaped semiconductor layer, around an upper portion of the second pillar-shaped semiconductor layer, and inside the fifth insulating film, depositing a metal and performing etch-back to form a first contact electrode line around the upper portion of the first pillar-shaped semiconductor layer and a third contact electrode line around the upper portion of the second pillar-shaped semiconductor layer, removing the gate insulating film which is to become third and fourth gate insulating films, the gate insulating film being exposed on upper portions of the first pillar-shaped semiconductor layer and the second pillar-shaped semiconductor layer, depositing a metal and performing etch-back to form a second contact electrode line and a fourth contact electrode line, and etching the first contact electrode line and the second contact electrode line to form a first contact electrode, a second contact electrode, a third contact electrode, and a fourth contact electrode; and a seventh step of, after the sixth step, depositing a second interlayer insulating film and performing planarization to expose an upper portion of the second contact electrode and an upper portion of the fourth contact electrode, and forming a first magnetic tunnel junction storage element on the second contact electrode.

The method for producing a semiconductor device may further include, after the deposition of the first polysilicon on the second insulating film and the planarization of the first polysilicon, forming a third insulating film on the first polysilicon.

According to the aspects of the present invention, it is possible to provide a structure of a memory which includes a magnetic tunnel junction storage element and whose cell area can be reduced, and a method for producing the memory.

A semiconductor device according to an aspect of the present invention includes a first pillar-shaped semiconductor layer, a first gate insulating film formed around the first pillar-shaped semiconductor layer, a first gate line formed around the first gate insulating film, a third gate insulating film formed around an upper portion of the first pillar-shaped semiconductor layer, a first contact electrode formed around the third gate insulating film, a second contact electrode that connects an upper portion of the first pillar-shaped semiconductor layer and an upper portion of the first contact electrode, and a first magnetic tunnel junction storage element formed on the second contact electrode. With this structure, the cell area can be reduced, and a first source line and a first bit line can be formed in different hierarchies. Since the semiconductor device includes a second source line that extends in a direction perpendicular to a direction in which the first source line extends, a single second source line is provided for four or more first memory cells. Since the single second source line is shared with four or more first memory cells, the cell area can be reduced. One second source line is preferably shared with 4, 8, 16, 32, 64, or 128 first memory cells.

An upper portion of a pillar-shaped semiconductor layer can be allowed to function as an n-type semiconductor layer or a p-type semiconductor layer due to the difference in work function between a metal and a semiconductor without forming a diffusion layer in the upper portion of the pillar-shaped semiconductor layer. Accordingly, a step of forming a diffusion layer in an upper portion of a pillar-shaped semiconductor layer can be reduced.

The semiconductor device may include a second pillar-shaped semiconductor layer arranged on the row on which the first memory cells are arranged, a second gate insulating film formed around the second pillar-shaped semiconductor layer, and a second gate line formed around the second gate insulating film, in which a lower portion of the second pillar-shaped semiconductor layer is connected to the first source line, and an upper portion of the second pillar-shaped semiconductor layer is connected to the second source line. With this structure, the first source line can be connected to the second source line through a transistor formed by the second pillar-shaped semiconductor layer. Accordingly, it is not necessary to form a deep contact extending from an upper portion of a pillar-shaped semiconductor layer to a fin-shaped semiconductor layer.

The semiconductor device may include a fourth gate insulating film formed around an upper portion of the second pillar-shaped semiconductor layer, a third contact electrode formed around the fourth gate insulating film, and a fourth contact electrode that connects an upper portion of the second pillar-shaped semiconductor layer and an upper portion of the third contact electrode, in which the third contact electrode and the fourth contact electrode extend in the same direction as a direction in which the second gate line extends and operate as the second source line. With this structure, the second source line can be simultaneously formed with the first contact electrodes and the second contact electrodes.

Adjacent fin-shaped semiconductor layers can be isolated from each other by the first insulating film. Sources of the first memory cells can be connected to each other using the second diffusion layer formed in the first fin-shaped semiconductor layer. The second diffusion layer can function as the first source line.

The first gate line and the second gate line may each be made of a metal. In this case, a high-speed operation can be performed.

A width of each of the first pillar-shaped semiconductor layers in a direction perpendicular to a direction in which the first fin-shaped semiconductor layer extends may be equal to a width of the first fin-shaped semiconductor layer in the direction perpendicular to the direction in which the first fin-shaped semiconductor layer extends. With this structure, a fin-shaped semiconductor layer, a pillar-shaped semiconductor layer, and a gate line are formed using two masks arranged perpendicular to each other, and thus misalignment can be prevented.

The first gate insulating film may be further provided around and on a bottom portion of the first gate line. With this structure, the semiconductor device is formed by a gate-last process, and thus reliable insulation between a gate line and a fin-shaped semiconductor layer can be realized.

A cross section of the first magnetic tunnel junction storage element formed on each of the first pillar-shaped semiconductor layers may have the same shape as a cross section of the first pillar-shaped semiconductor layer. With this structure, in the case where a magnetic tunnel junction storage element and a pillar-shaped semiconductor layer are integrally formed, the number of steps can be reduced.

BRIEF DESCRIPTION OF THE SEVERAL VIEWS OF THE DRAWING

FIG. 1A is a plan view of a semiconductor device according to an embodiment of the present invention, and FIG. 1B is a sectional view taken along line X-X' in FIG. 1A.

FIG. 2A is a plan view illustrating a method for producing a semiconductor device according to an embodiment of the present invention, and FIG. 2B is a sectional view taken along line X-X' in FIG. 2A.

FIG. 3A is a plan view illustrating a method for producing a semiconductor device according to an embodiment of the present invention, and FIG. 3B is a sectional view taken along line X-X' in FIG. 3A.

FIG. 4A is a plan view illustrating a method for producing a semiconductor device according to an embodiment of the present invention, and FIG. 4B is a sectional view taken along line X-X' in FIG. 4A.

FIG. 5A is a plan view illustrating a method for producing a semiconductor device according to an embodiment of the present invention, and FIG. 5B is a sectional view taken along line X-X' in FIG. 5A.

FIG. 6A is a plan view illustrating a method for producing a semiconductor device according to an embodiment of the present invention, and FIG. 6B is a sectional view taken along line X-X' in FIG. 6A.

FIG. 7A is a plan view illustrating a method for producing a semiconductor device according to an embodiment of the present invention, and FIG. 7B is a sectional view taken along line X-X' in FIG. 7A.

FIG. 8A is a plan view illustrating a method for producing a semiconductor device according to an embodiment of the present invention, and FIG. 8B is a sectional view taken along line X-X' in FIG. 8A.

FIG. 10A is a plan view illustrating a method for producing a semiconductor device according to an embodiment of the present invention, and FIG. 10B is a sectional view taken along line X-X' in FIG. 10A.

FIG. 11A is a plan view illustrating a method for producing a semiconductor device according to an embodiment of the present invention, and FIG. 11B is a sectional view taken along line X-X' in FIG. 11A.

FIG. 12A is a plan view illustrating a method for producing a semiconductor device according to an embodiment of the present invention, and FIG. 12B is a sectional view taken along line X-X' in FIG. 12A.

FIG. 13A is a plan view illustrating a method for producing a semiconductor device according to an embodiment of the present invention, and FIG. 13B is a sectional view taken along line X-X' in FIG. 13A.

FIG. 14A is a plan view illustrating a method for producing a semiconductor device according to an embodiment of the present invention, and FIG. 14B is a sectional view taken along line X-X' in FIG. 14A.

FIG. 15A is a plan view illustrating a method for producing a semiconductor device according to an embodiment of the present invention, and FIG. 15B is a sectional view taken along line X-X' in FIG. 15A.

FIG. 16A is a plan view illustrating a method for producing a semiconductor device according to an embodiment of the present invention, and FIG. 16B is a sectional view taken along line X-X' in FIG. 16A.

FIG. 17A is a plan view illustrating a method for producing a semiconductor device according to an embodiment of the present invention, and FIG. 17B is a sectional view taken along line X-X' in FIG. 17A.

FIG. 18A is a plan view illustrating a method for producing a semiconductor device according to an embodiment of the present invention, and FIG. 18B is a sectional view taken along line X-X' in FIG. 18A.

FIG. 19A is a plan view illustrating a method for producing a semiconductor device according to an embodiment of the present invention, and FIG. 19B is a sectional view taken along line X-X' in FIG. 19A.

FIG. 22A is a plan view illustrating a method for producing a semiconductor device according to an embodiment of the present invention, and FIG. 22B is a sectional view taken along line X-X' in FIG. 22A.

FIG. 23A is a plan view illustrating a method for producing a semiconductor device according to an embodiment of the present invention, and FIG. 23B is a sectional view taken along line X-X' in FIG. 23A.

FIG. 24A is a plan view illustrating a method for producing a semiconductor device according to an embodiment of the present invention, and FIG. 24B is a sectional view taken along line X-X' in FIG. 24A.

FIG. 25A is a plan view illustrating a method for producing a semiconductor device according to an embodiment of the present invention, and FIG. 25B is a sectional view taken along line X-X' in FIG. 25A.

FIG. 27A is a plan view illustrating a method for producing a semiconductor device according to an embodiment of the present invention, and FIG. 27B is a sectional view taken along line X-X' in FIG. 27A.

FIG. 29A is a plan view illustrating a method for producing a semiconductor device according to an embodiment of the present invention, and FIG. 29B is a sectional view taken along line X-X' in FIG. 29A.

FIG. 30A is a plan view illustrating a method for producing a semiconductor device according to an embodiment of the present invention, and FIG. 30B is a sectional view taken along line X-X' in FIG. 30A.

FIG. 32A is a plan view illustrating a method for producing a semiconductor device according to an embodiment of the present invention, and FIG. 32B is a sectional view taken along line X-X' in FIG. 32A.

FIG. 36A is a plan view illustrating a method for producing a semiconductor device according to an embodiment of the present invention, and FIG. 36B is a sectional view taken along line X-X' in FIG. 36A.

FIG. 37A is a plan view illustrating a method for producing a semiconductor device according to an embodiment of the present invention, and FIG. 37B is a sectional view taken along line X-X' in FIG. 37A.

FIG. 38A is a plan view illustrating a method for producing a semiconductor device according to an embodiment of the present invention, and FIG. 38B is a sectional view taken along line X-X' in FIG. 38A.

FIG. 39A is a plan view illustrating a method for producing a semiconductor device according to an embodiment of the present invention, and FIG. 39B is a sectional view taken along line X-X' in FIG. 39A.

FIG. 40A is a plan view illustrating a method for producing a semiconductor device according to an embodiment of the present invention, and FIG. 40B is a sectional view taken along line X-X' in FIG. 40A.

FIG. 43A is a plan view illustrating a method for producing a semiconductor device according to an embodiment of the present invention, and FIG. 43B is a sectional view taken along line X-X' in FIG. 43A.

FIG. 45A is a plan view illustrating a method for producing a semiconductor device according to an embodiment of the present invention, and FIG. 45B is a sectional view taken along line X-X' in FIG. 45A.

FIG. 46A is a plan view illustrating a method for producing a semiconductor device according to an embodiment of the present invention, and FIG. 46B is a sectional view taken along line X-X' in FIG. 46A.

FIG. 47A is a plan view of a semiconductor device according to an embodiment of the present invention, and FIG. 47B is a sectional view taken along line X-X' in FIG. 47A.

DESCRIPTION OF THE PREFERRED EMBODIMENTS

Figure 9A:
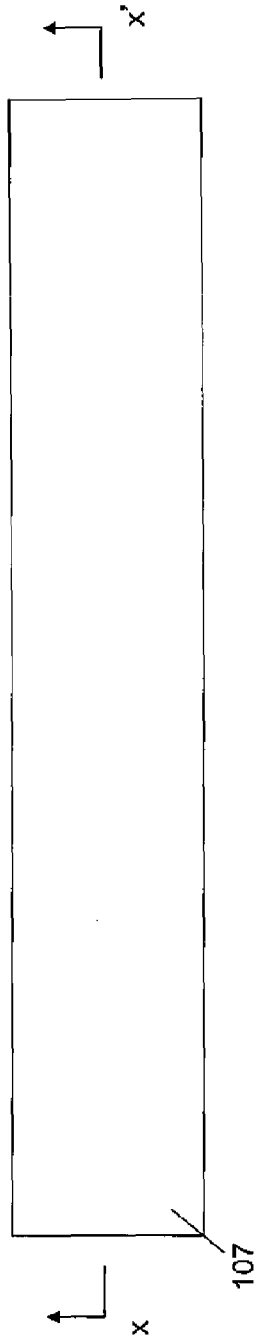
FIG. 9A is a plan view illustrating a method for producing a semiconductor device according to an embodiment of the present invention.

Referring now to the figures of the drawing in detail and first, particularly, to FIGS. 1A and 1B thereof, there is shown a structure of a semiconductor device.

In a first column of a first row of the semiconductor device, a first memory cell 201 is provided. The first memory cell 201 includes a first fin-shaped semiconductor layer 103 formed on a semiconductor substrate 101, a first insulating film 104 formed around the first fin-shaped semiconductor layer 103, a first pillar-shaped semiconductor layer 113 formed on the first fin-shaped semiconductor layer 103, a first gate insulating film 132a formed around the first pillar-shaped semiconductor layer 113, a first gate line 133a formed around the first gate insulating film 132a, the first fin-shaped semiconductor layer 103 extending in a direction perpendicular to a direction in which the first gate line 133a extends, a second diffusion layer 126 formed in a lower portion of the first pillar-shaped semiconductor layer 113, a third gate insulating film 134a formed around an upper portion of the first pillar-shaped semiconductor layer 113, a first contact electrode 138a formed around the third gate insulating film 134a, a second contact electrode 139a that connects the an upper portion of the first pillar-shaped semiconductor layer 113 and an upper portion of the first contact electrode 138a, and a first magnetic tunnel junction storage element (142a, 143a, and 144a) formed on the second contact electrode 139a.

The first magnetic tunnel junction storage element includes a pinned layer 142a, a tunnel barrier layer 143a, and a free layer 144a. A lower electrode 141a is provided between the pinned layer 142a and the second contact electrode 139a. An upper electrode 145a is provided on the free layer 144a.

In a second column of the first row, a first memory cell 202 is provided. The first memory cell 202 includes a first pillar-shaped semiconductor layer 114 formed on the first fin-shaped semiconductor layer 103, a first gate insulating film 132b formed around the first pillar-shaped semiconductor layer 114, a first gate line 133b formed around the first gate insulating film 132b, the second diffusion layer 126 formed in a lower portion of the first pillar-shaped semiconductor layer 114, a third gate insulating film 134b formed around an upper portion of the first pillar-shaped semiconductor layer 114, a first contact electrode 138b formed around the third gate insulating film 134b, a second contact electrode 139b that connects an upper portion of the first pillar-shaped semiconductor layer 114 and an upper portion of the first contact electrode 138b, and a first magnetic tunnel junction storage element (142b, 143b, and 144b) formed on the second contact electrode 139b.

The first magnetic tunnel junction storage element includes a pinned layer 142b, a tunnel barrier layer 143b, and a free layer 144b. A lower electrode 141b is provided between the pinned layer 142b and the second contact electrode 139b. An upper electrode 145b is provided on the free layer 144b.

In a fourth column of the first row, a first memory cell 203 is provided. The first memory cell 203 includes a first pillar-shaped semiconductor layer 116 formed on the first fin-shaped semiconductor layer 103, a first gate insulating film 132d formed around the first pillar-shaped semiconductor layer 116, a first gate line 133d formed around the first gate insulating film 132d, the second diffusion layer 126 formed in a lower portion of the first pillar-shaped semiconductor layer 116, a third gate insulating film 134d formed around an upper portion of the first pillar-shaped semiconductor layer 116, a first contact electrode 138d formed around the third gate insulating film 134d, a second contact electrode 139d that connects an upper portion of the first pillar-shaped semiconductor layer 116 and an upper portion of the first contact electrode 138d, and a first magnetic tunnel junction storage element (142d, 143d, and 144d) formed on the second contact electrode 139d.

The first magnetic tunnel junction storage element includes a pinned layer 142d, a tunnel barrier layer 143d, and a free layer 144d. A lower electrode 141d is provided between the pinned layer 142d and the second contact electrode 139d. An upper electrode 145d is provided on the free layer 144d.

In a fifth column of the first row, a first memory cell 204 is provided. The first memory cell 204 includes a first pillar-shaped semiconductor layer 117 formed on the first fin-shaped semiconductor layer 103, a first gate insulating film 132e formed around the first pillar-shaped semiconductor layer 117, a first gate line 133e formed around the first gate insulating film 132e, the second diffusion layer 126 formed in a lower portion of the first pillar-shaped semiconductor layer 117, a third gate insulating film 134e formed around an upper portion of the first pillar-shaped semiconductor layer 117, a first contact electrode 138e formed around the third gate insulating film 134e, a second contact electrode 139e that connects an upper portion of the first pillar-shaped semiconductor layer 117 and an upper portion of the first contact electrode 138e, and a first magnetic tunnel junction storage element (142e, 143e, and 144e) formed on the second contact electrode 139e.

The first magnetic tunnel junction storage element includes a pinned layer 142e, a tunnel barrier layer 143e, and a free layer 144e. A lower electrode 141e is provided between the pinned layer 142e and the second contact electrode 139e. An upper electrode 145e is provided on the free layer 144e.

The second diffusion layer 126 is further formed in the first fin-shaped semiconductor layer 103. The second diffusion layer 126 functions as a first source line.

The first contact electrodes 138a, 138b, 138d, and 138e are made of a metal. When the upper portion of the first pillar-shaped semiconductor layer functions as an n-type semiconductor, the work function of the metal of the first contact electrodes 138a, 138b, 138d, and 138e is 4.0 to 4.2 eV.

The first contact electrodes 138a, 138b, 138d, and 138e are made of a metal. When the upper portion of the first pillar-shaped semiconductor layer functions as a p-type semiconductor, the work function of the metal of the first contact electrodes 138a, 138b, 138d, and 138e is 5.0 to 5.2 eV.

The metal of the first contact electrodes 138a, 138b, 138d, and 138e may be the same as the metal used in the second contact electrodes 139a, 139b, 139d, and 139e.

The four first memory cells 201, 202, 203, and 204 are arranged on one row. The lower portions of the first pillar-shaped semiconductor layers 113, 114, 116, and 117 are connected to each other through the second diffusion layer 126 and function as the first source line. In this embodiment, four first memory cells are arranged. Alternatively, the number of the first memory cells arranged may be 8, 16, 32, 64, or 128.

The upper electrodes 145a, 145b, 145d, and 145e are connected to each other through a first bit line 151a that extends in a direction perpendicular to a direction in which the first gate lines 133a, 133b, 133d, and 133e extend.

The semiconductor device further includes a second pillar-shaped semiconductor layer 115 formed on the first fin-shaped semiconductor layer 103, a second gate insulating film 132c formed around the second pillar-shaped semiconductor layer 115, a second gate line 133c formed around the second gate insulating film 132c, the second gate line 133c extending in a direction perpendicular to a direction in which the first fin-shaped semiconductor layer 103 extends, the second diffusion layer 126 formed in a lower portion of the second pillar-shaped semiconductor layer 115, a fourth gate insulating film 134c formed around an upper portion of the second pillar-shaped semiconductor layer 115, a third contact electrode 135c formed around the fourth gate insulating film 134c, and a fourth contact electrode 136c that connects an upper portion of the second pillar-shaped semiconductor layer 115 and an upper portion of the third contact electrode 135c.

The second diffusion layer formed in the lower portion of the second pillar-shaped semiconductor layer 115 is connected to the second diffusion layer 126 formed in the first fin-shaped semiconductor layer 103 and thus is connected to the first source line.

The third contact electrode 135c and the fourth contact electrode 136c extend in the same direction as a direction in which the second gate line 133c extends and operate as a second source line.

The second source line 135c and 136c extends in a direction perpendicular to the direction in which the second diffusion layer 126 functioning as the first source line extends.

Silicides 128a, 128b, 128c, and 128d are formed in upper portions of the second diffusion layer.

The first gate lines 133a, 133b, 133d, and 133e and the second gate line 133c are preferably made of a metal.

As illustrated in FIGS. 47A and 47B, a cross section of each of the first magnetic tunnel junction storage elements formed on the first pillar-shaped semiconductor layers may have the same shape as a cross section of the first pillar-shaped semiconductor layer. When the magnetic tunnel junction storage elements and the pillar-shaped semiconductor layers are integrally formed, the number of steps can be reduced.

A production process for forming a structure of a semiconductor device according to an embodiment of the present invention will now be described with reference to FIGS. 2A to 46B.

A description will be made of a first step of forming a first fin-shaped semiconductor layer on a semiconductor substrate, and forming a first insulating film around the first fin-shaped semiconductor layer. A silicon substrate is used in the present embodiment, but the substrate may be made of another semiconductor material.

As illustrated in FIGS. 2A and 2B, a first resist 102 for forming a fin-shaped silicon layer is formed on a silicon substrate 101.

As illustrated in FIGS. 3A and 3B, the silicon substrate 101 is etched to form a first fin-shaped silicon layer 103. In this embodiment, the fin-shaped silicon layer is formed using a resist as a mask. Alternatively, a hard mask such as an oxide film or a nitride film may be used.

As illustrated in FIGS. 4A and 4B, the first resist 102 is removed.

As illustrated in FIGS. 5A and 5B, a first insulating film 104 is deposited around the first fin-shaped silicon layer 103. An oxide film formed with high-density plasma or an oxide film formed by low-pressure chemical vapor deposition (CVD) may be used as the first insulating film 104.

As illustrated in FIGS. 6A and 6B, the first insulating film 104 is etched-back to expose an upper portion of the first fin-shaped silicon layer 103.

Thus, the first step has been described. Specifically, the first step includes forming a first fin-shaped semiconductor layer on a semiconductor substrate, and forming a first insulating film around the first fin-shaped semiconductor layer.

Next, a description will be made of a second step of forming a second insulating film around the first fin-shaped semiconductor layer, depositing a first polysilicon on the second insulating film and planarizing the first polysilicon, forming a second resist for forming first and second gate lines, a first pillar-shaped semiconductor layer, and a second pillar-shaped semiconductor layer in a direction perpendicular to a direction in which the first fin-shaped semiconductor layer extends, and etching the first polysilicon, the second insulating film, and the first fin-shaped semiconductor layer to form a first pillar-shaped semiconductor layer, a first dummy gate derived from the first polysilicon, a second pillar-shaped semiconductor layer, and a second dummy gate derived from the first polysilicon.

As illustrated in FIGS. 7A and 7B, a second insulating film 105 is formed around the first fin-shaped silicon layer 103. The second insulating film 105 is preferably an oxide film.

As illustrated in FIGS. 8A and 8B, a first polysilicon 106 is deposited on the second insulating film 105 and is planarized.

Figure 9B:
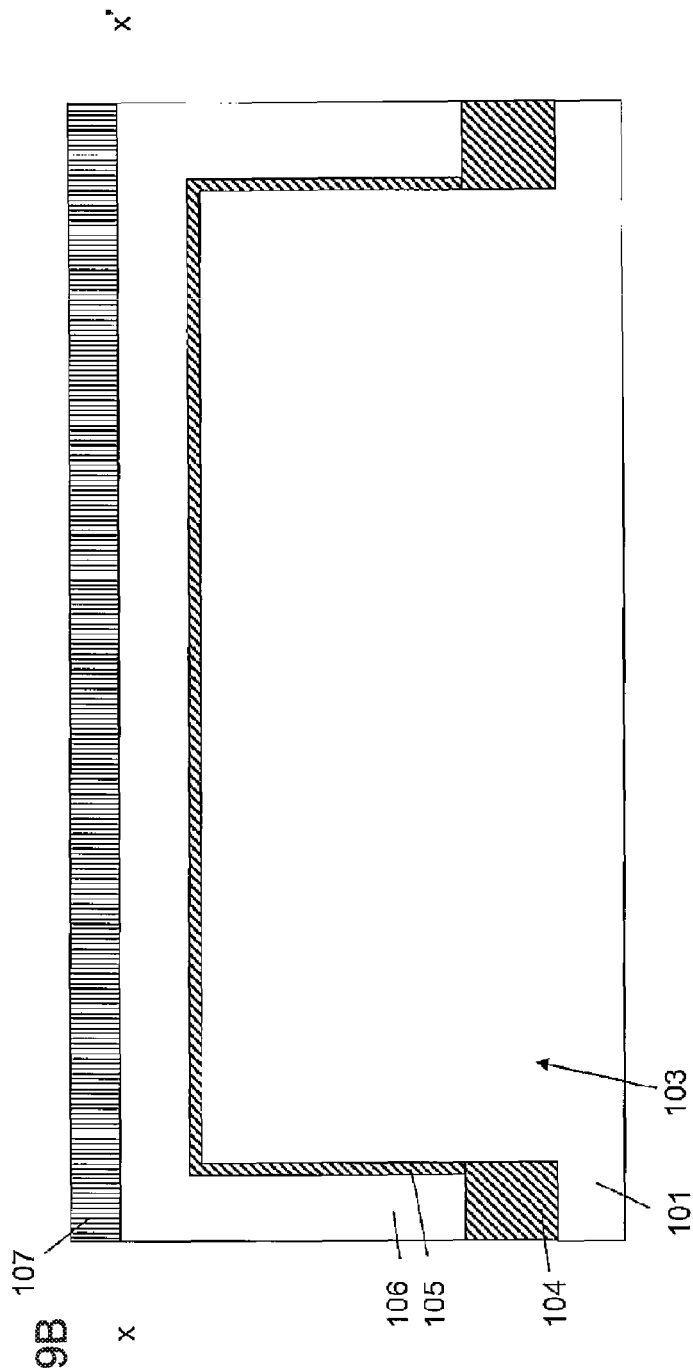
FIG. 9B is a sectional view taken along line X-X' in FIG. 9A.

As illustrated in FIGS. 9A and 9B, a third insulating film 107 is formed on the first polysilicon 106. The third insulating film 107 is preferably a nitride film.

As illustrated in FIGS. 10A and 10B, second resists 108, 109, 110, 111, and 112 for forming first and second gate lines, first pillar-shaped semiconductor layers, and a second pillar-shaped semiconductor layer are formed in a direction perpendicular to a direction in which the first fin-shaped silicon layer 103 extends.

As illustrated in FIGS. 11A and 11B, the third insulating film 107, the first polysilicon 106, the second insulating film 105, and the first fin-shaped silicon layer 103 are etched to form first pillar-shaped silicon layers 113, 114, 116, and 117 and first dummy gates 106a, 106b, 106d, and 106e derived from the first polysilicon, a second pillar-shaped silicon layer 115, and a second dummy gate 106c derived from the first polysilicon. At this time, the third insulating film 107 is divided into third insulating films 107a, 107b, 107c, 107d, and 107e, and the second insulating film 105 is divided into second insulating films 105a, 105b, 105c, 105d, and 105e. In the case where the second resists 108, 109, 110, 111, and 112 are removed during this etching, the third insulating films 107a, 107b, 107c, 107d, and 107e function as a hard mask. In the case where the second resists are not removed during the etching, the third insulating film need not be used.

As illustrated in FIGS. 12A and 12B, the second resists 108, 109, 110, 111, and 112 are removed.

Thus, the second step has been described. Specifically, the second step includes forming a second insulating film around the first fin-shaped semiconductor layer, depositing a first polysilicon on the second insulating film and planarizing the first polysilicon, forming a second resist for forming first and second gate lines, a first pillar-shaped semiconductor layer, and a second pillar-shaped semiconductor layer in a direction perpendicular to a direction in which the first fin-shaped semiconductor layer extends, and etching the first polysilicon, the second insulating film, and the first fin-shaped semiconductor layer to form a first pillar-shaped semiconductor layer, a first dummy gate derived from the first polysilicon, a second pillar-shaped semiconductor layer, and a second dummy gate derived from the first polysilicon.

Next, a description will be made of a third step of forming a fourth insulating film around the first pillar-shaped semiconductor layer, the second pillar-shaped semiconductor layer, the first dummy gate, and the second dummy gate, depositing a second polysilicon around the fourth insulating film, and etching the second polysilicon so as to remain on side walls of the first dummy gate, the first pillar-shaped semiconductor layer, the second dummy gate, and the second pillar-shaped semiconductor layer to form a third dummy gate and a fourth dummy gate.

As illustrated in FIGS. 13A and 13B, a fourth insulating film 118 is formed around the first pillar-shaped silicon layers 113, 114, 116, and 117, the second pillar-shaped silicon layer 115, the first dummy gates 106a, 106b, 106d, and 106e, and the second dummy gate 106c. The fourth insulating film 118 is preferably an oxide film.

As illustrated in FIGS. 14A and 14B, a second polysilicon 125 is deposited around the fourth insulating film 118.

As illustrated in FIGS. 15A and 15B, the second polysilicon 125 is etched so as to remain on side walls of the first dummy gates 106a, 106b, 106d, and 106e, the first pillar-shaped silicon layers 113, 114, 116, and 117, the second dummy gate 106c, and the second pillar-shaped silicon layer 115 to form third dummy gates 125a, 125b, 125d, and 125e and a fourth dummy gate 125c. At this time, the fourth insulating film 118 may be divided into fourth insulating films 118a, 118b, 118c, 118d, and 118e.

Thus, the third step has been described. Specifically, the third step includes forming a fourth insulating film around the first pillar-shaped semiconductor layer, the second pillar-shaped semiconductor layer, the first dummy gate, and the second dummy gate, depositing a second polysilicon around the fourth insulating film, and etching the second polysilicon so as to remain on side walls of the first dummy gate, the first pillar-shaped semiconductor layer, the second dummy gate, and the second pillar-shaped semiconductor layer to form a third dummy gate and a fourth dummy gate.

Next, a description will be made of a fourth step of forming a second diffusion layer in an upper portion of the first fin-shaped semiconductor layer, a lower portion of the first pillar-shaped semiconductor layer, and a lower portion of the second pillar-shaped semiconductor layer, forming a fifth insulating film around the third dummy gate and the fourth dummy gate, etching the fifth insulating film so as to remain as a sidewall to form a sidewall formed of the fifth insulating film, and forming a compound of a metal and a semiconductor in an upper portion of the second diffusion layer to form a first source line.

As illustrated in FIGS. 16A and 16B, an impurity is introduced to form a second diffusion layer 126 in lower portions of the first pillar-shaped silicon layers 113, 114, 116, and 117, a lower portion of the second pillar-shaped silicon layer 115, and an upper portion of the first fin-shaped silicon layer 103. In the case of an n-type diffusion layer, arsenic or phosphorus is preferably introduced. In the case of a p-type diffusion layer, boron is preferably introduced. The diffusion layer may be formed after formation of sidewalls formed of a fifth insulating film described below.

As illustrated in FIGS. 17A and 17B, a fifth insulating film 127 is formed around the third dummy gates 125a, 125b, 125d, and 125e and the fourth dummy gate 125c. The fifth insulating film 127 is preferably a nitride film.

As illustrated in FIGS. 18A and 18B, the fifth insulating film 127 is etched so as to remain as sidewalls. Thus, sidewalls 127a, 127b, 127c, 127d, and 127e formed of the fifth insulating film are formed.

As illustrated in FIGS. 19A and 19B, metal-semiconductor compounds 128a, 128b, 128c, and 128d are formed in upper portions of the second diffusion layer 126. At this time, metal-semiconductor compounds 129a, 129b, 129d, 129e, and 129c may be formed in upper portions of the third dummy gates 125a, 125b, 125d, and 125e and in an upper portion of the fourth dummy gate 125c, respectively.

Thus, the fourth step has been described. Specifically, the fourth step includes forming a second diffusion layer in an upper portion of the first fin-shaped semiconductor layer, a lower portion of the first pillar-shaped semiconductor layer, and a lower portion of the second pillar-shaped semiconductor layer, forming a fifth insulating film around the third dummy gate and the fourth dummy gate, etching the fifth insulating film so as to remain as a sidewall to form a sidewall formed of the fifth insulating film, and forming a compound of a metal and a semiconductor in an upper portion of the second diffusion layer to form a first source line.

Next, a description will be made of a fifth step of depositing an interlayer insulating film and performing planarization to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film which is to become first and second gate insulating films around the first pillar-shaped semiconductor layer, around the second pillar-shaped semiconductor layer, and inside the fifth insulating film, depositing a metal and performing etch-back to form a first gate line around the first pillar-shaped semiconductor layer and a second gate line around the second pillar-shaped semiconductor layer.

Figure 20A:
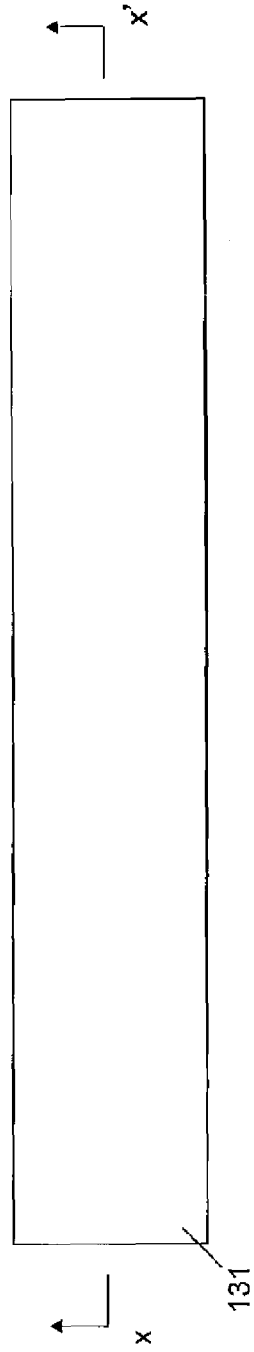
FIG. 20A is a plan view illustrating a method for producing a semiconductor device according to an embodiment of the present invention.
Figure 20B:
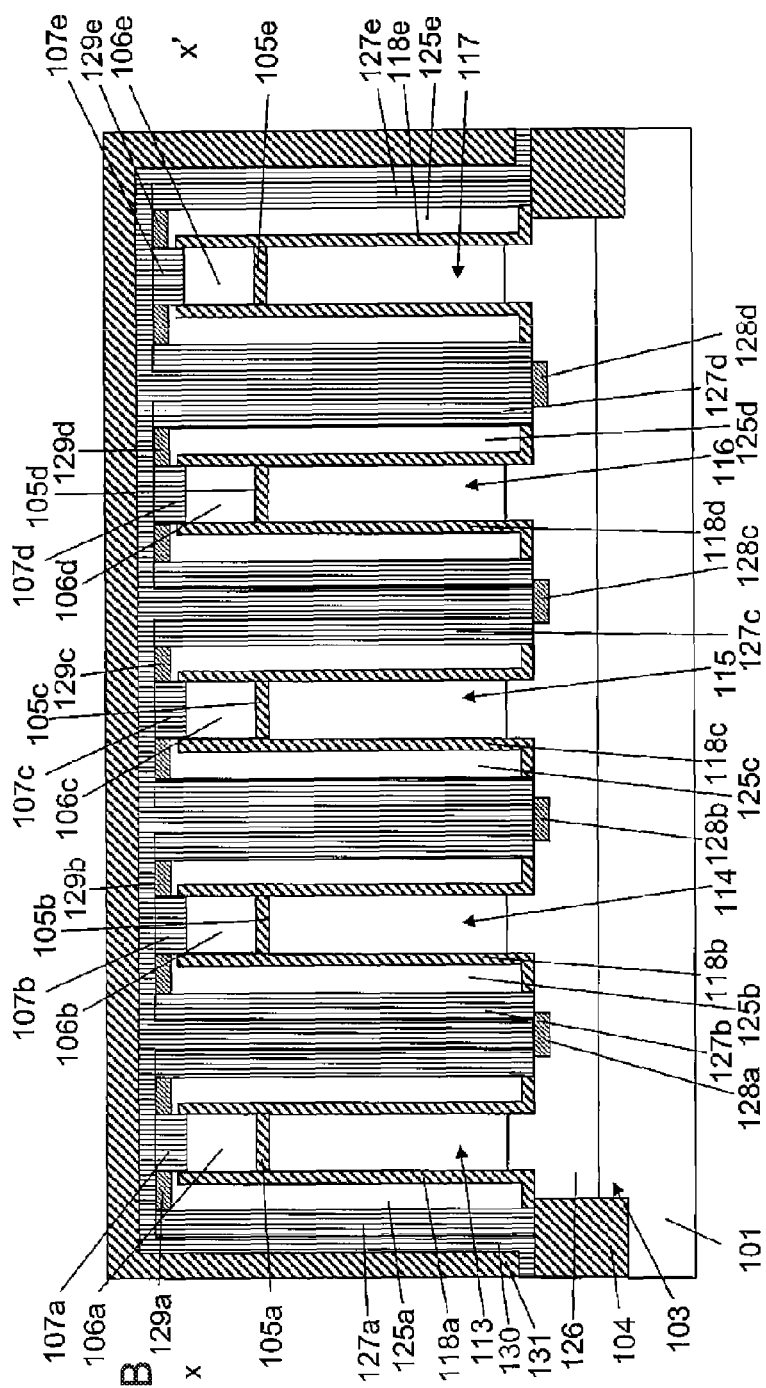
FIG. 20B is a sectional view taken along line X-X' in FIG. 20A.

As illustrated in FIGS. 20A and 20B, a nitride film 130 is deposited, and an interlayer insulating film 131 is deposited.

Figure 21A:
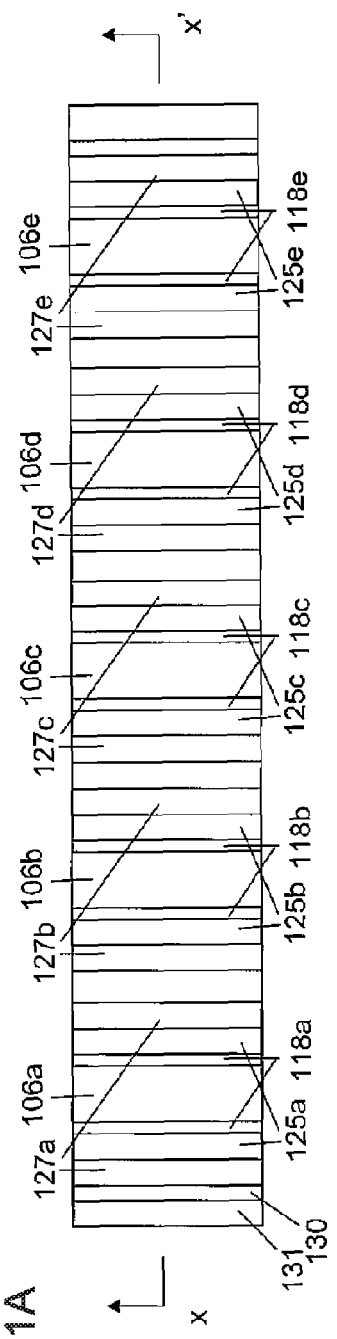
FIG. 21A is a plan view illustrating a method for producing a semiconductor device according to an embodiment of the present invention.
Figure 21B:
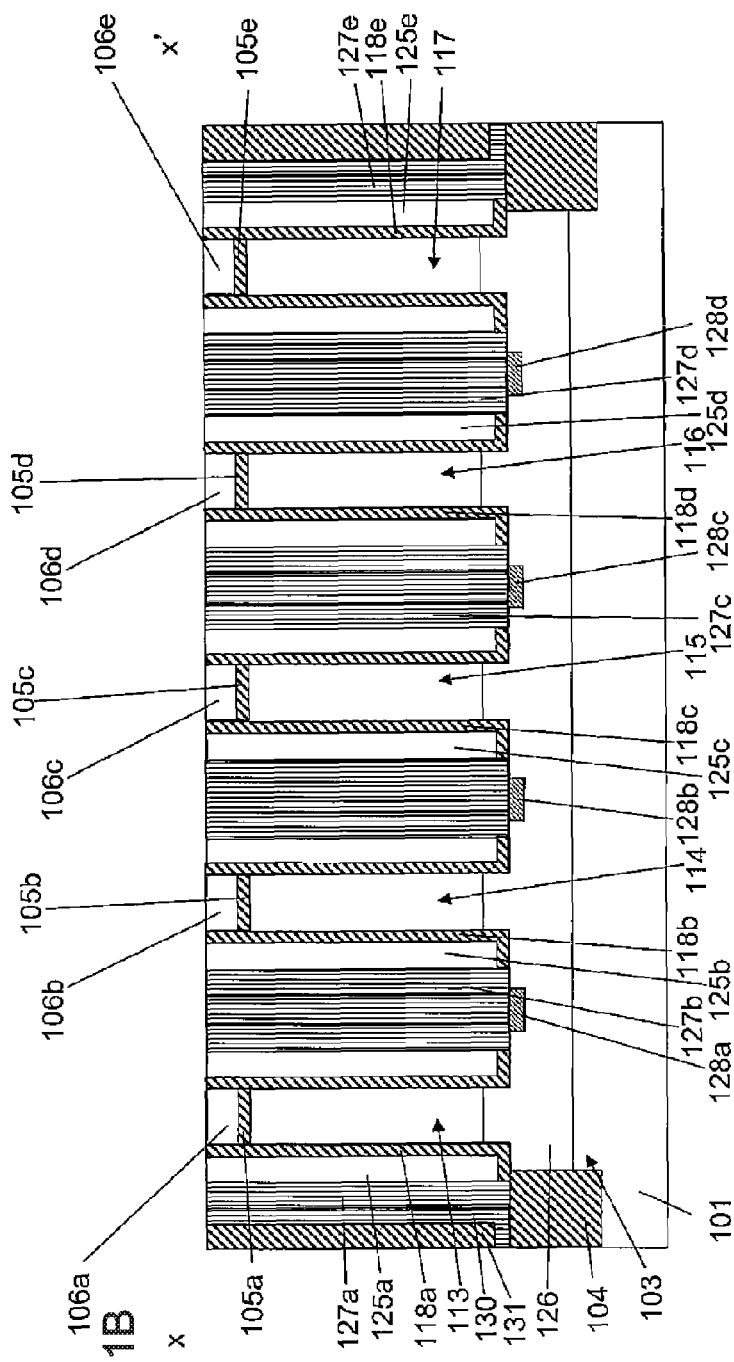
FIG. 21B is a sectional view taken along line X-X' in FIG. 21A.

As illustrated in FIGS. 21A and 21B, chemical mechanical polishing is performed to expose upper portions of the first dummy gates 106a, 106b, 106d, and 106e, the second dummy gate 106c, the third dummy gates 125a, 125b, 125d, and 125e, and the fourth dummy gate 125c. At this time, the metal-semiconductor compounds 129a, 129b, 129d, 129e in upper portions of the third dummy gates 125a, 125b, 125d, and 125e and the metal-semiconductor compound 129c in an upper portion of the fourth dummy gate 125c are removed.

As illustrated in FIGS. 22A and 22B, the first dummy gates 106a, 106b, 106d, and 106e, the second dummy gate 106c, the third dummy gates 125a, 125b, 125d, and 125e, and the fourth dummy gate 125c are removed.

As illustrated in FIGS. 23A and 23B, the second insulating films 105a, 105b, 105c, 105d, and 105e and the fourth insulating films 118a, 118b, 118c, 118d, and 118e are removed.

As illustrated in FIGS. 24A and 24B, a gate insulating film 132 which is to become first and second gate insulating films is formed around the first pillar-shaped silicon layers 113, 114, 116, and 117, around the second pillar-shaped silicon layer 115, and inside the fifth insulating films 127a, 127b, 127c, 127d, and 127e.

As illustrated in FIGS. 25A and 25B, a metal 133 is deposited.

Figure 26A:
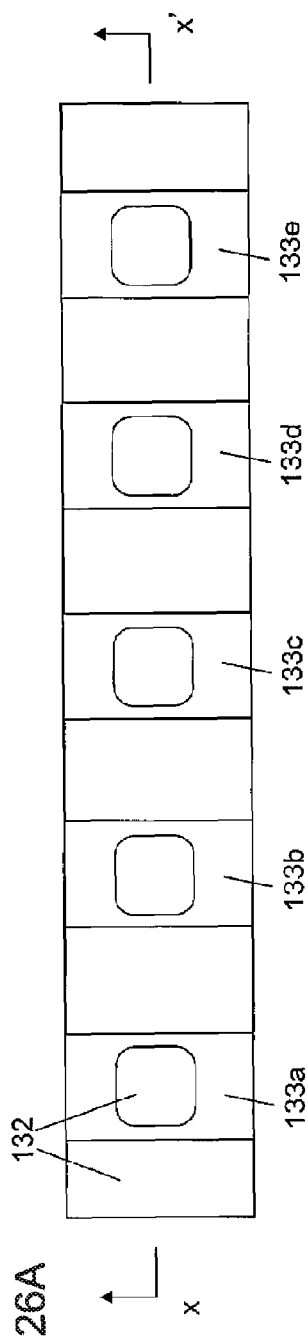
FIG. 26A is a plan view illustrating a method for producing a semiconductor device according to an embodiment of the present invention.
Figure 26B:
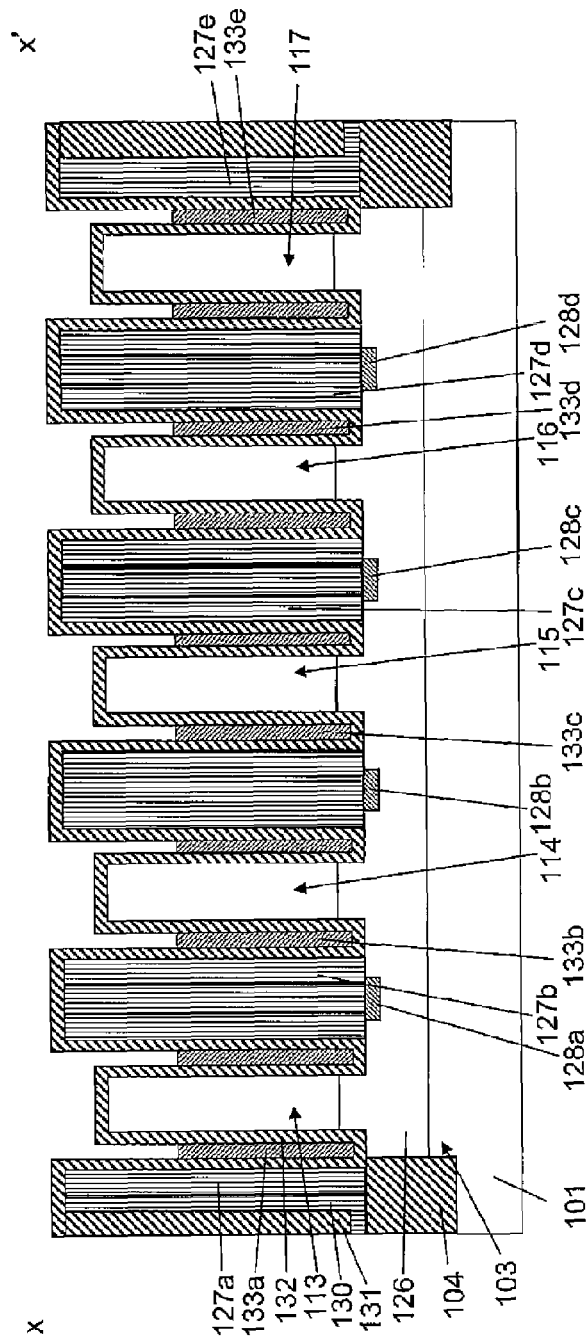
FIG. 26B is a sectional view taken along line X-X' in FIG. 26A.

As illustrated in FIGS. 26A and 26B, the metal 133 is etched-back to form first gate lines 133a, 133b, 133d, and 133e around the first pillar-shaped silicon layers 113, 114, 116, and 117 and to form a second gate line 133c around the second pillar-shaped silicon layer 115.

Thus, the fifth step has been described. Specifically, the fifth step includes depositing an interlayer insulating film and performing planarization to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film which is to become first and second gate insulating films around the first pillar-shaped semiconductor layer, around the second pillar-shaped semiconductor layer, and inside the fifth insulating film, depositing a metal and performing etch-back to form a first gate line around the first pillar-shaped semiconductor layer and a second gate line around the second pillar-shaped semiconductor layer.

Next, a description will be made of a sixth step of, after the fifth step, removing exposed portions of the gate insulating film which is to become first and second gate insulating films, forming a gate insulating film which is to become third and fourth gate insulating films on around upper portions of the first pillar-shaped semiconductor layers, around an upper portion of the second pillar-shaped semiconductor layer, and inside the fifth insulating film, depositing a metal and performing etch-back to form first contact electrode lines around the upper portions of the first pillar-shaped semiconductor layers and a third contact electrode line around the upper portion of the second pillar-shaped semiconductor layer, removing the gate insulating film which is to become third and fourth gate insulating films, the gate insulating film being exposed on upper portions of the first pillar-shaped semiconductor layers and the second pillar-shaped semiconductor layer, depositing a metal and performing etch-back to form second contact electrode lines and a fourth contact electrode line, and etching the first contact electrode lines and the second contact electrode lines to form first contact electrodes, second contact electrodes, a third contact electrode, and a fourth contact electrode.

As illustrated in FIGS. 27A and 27B, exposed portions of the gate insulating film 132 which is to become first and second gate insulating films are removed. The gate insulating film 132 which is to become first and second gate insulating films is divided into first gate insulating films 132a, 132b, 132d, and 132e and a second gate insulating film 132c.

Figure 28A:
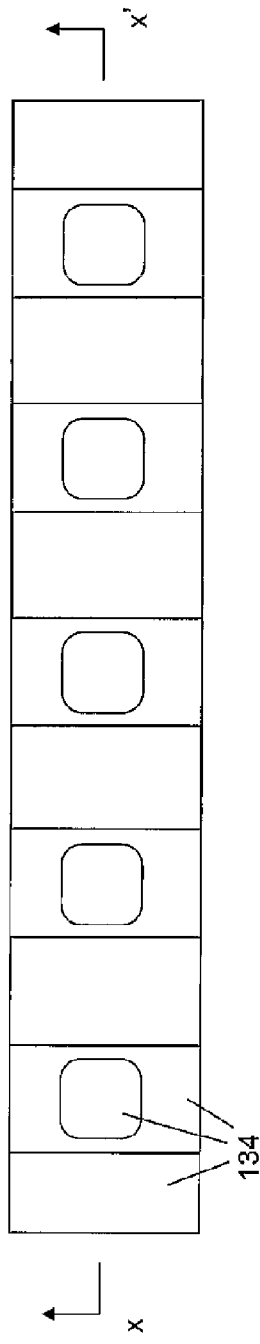
FIG. 28A is a plan view illustrating a method for producing a semiconductor device according to an embodiment of the present invention.
Figure 28B:
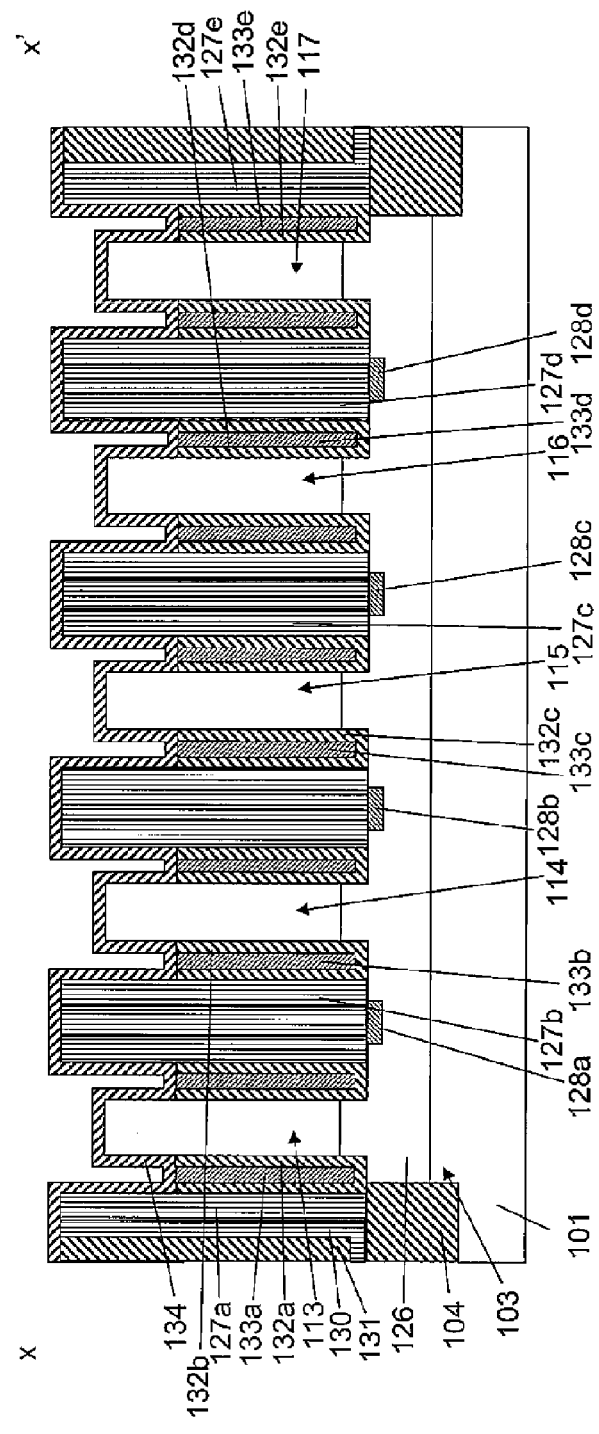
FIG. 28B is a sectional view taken along line X-X' in FIG. 28A.

As illustrated in FIGS. 28A and 28B, a gate insulating film 134 which is to become third and fourth gate insulating films is formed around upper portions of the first pillar-shaped silicon layers 113, 114, 116, and 117, around an upper portion of the second pillar-shaped silicon layer 115, and inside the fifth insulating films 127a, 127b, 127c, 127d, and 127e.

As illustrated in FIGS. 29A and 29B, a metal 135 is deposited.

As illustrated in FIGS. 30A and 30B, the metal 135 is etched-back to form first contact electrode lines 135a, 135b, 135d, and 135e around the upper portions of the first pillar-shaped silicon layers 113, 114, 116, and 117, respectively, and a third contact electrode line 135c around the upper portion of the second pillar-shaped silicon layer 115.

Figure 31A:
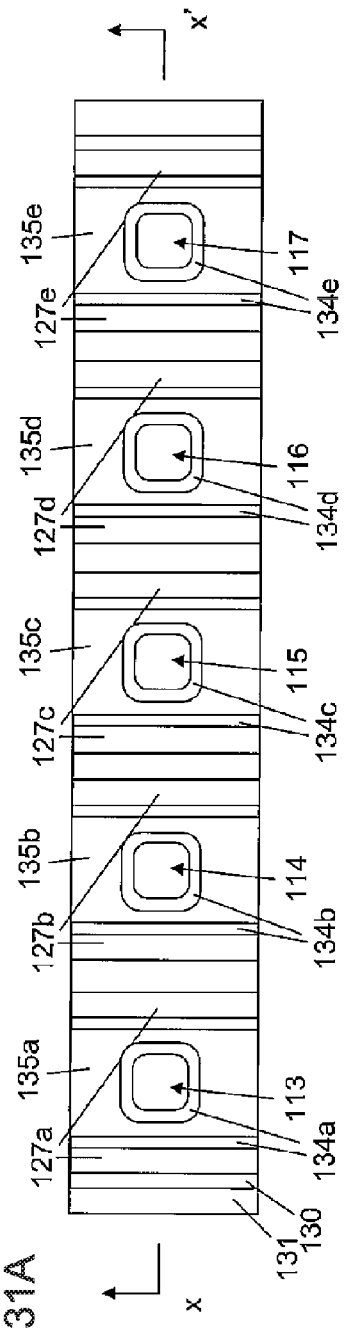
FIG. 31A is a plan view illustrating a method for producing a semiconductor device according to an embodiment of the present invention.
Figure 31B:
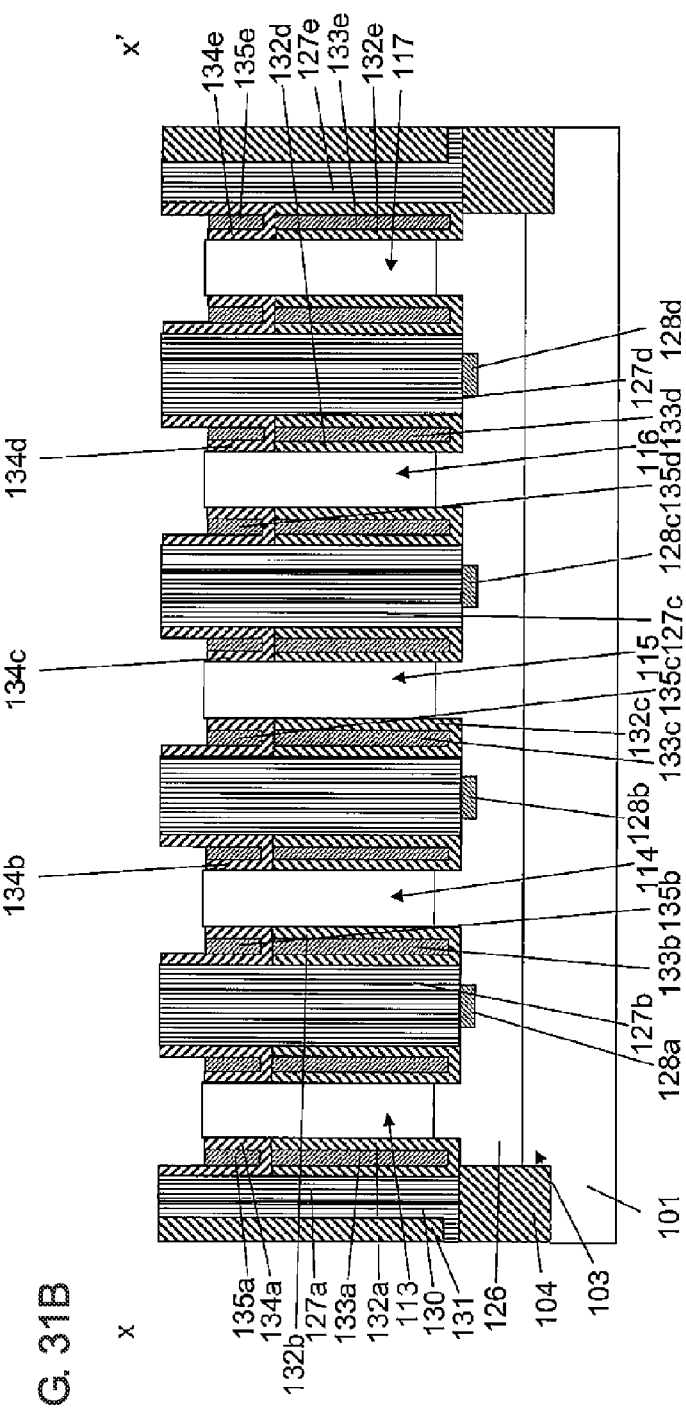
FIG. 31B is a sectional view taken along line X-X' in FIG. 31A.

As illustrated in FIGS. 31A and 31B, the gate insulating film 134 which is to become third and fourth gate insulating films, the gate insulating film being exposed on upper portions of the first pillar-shaped silicon layers 113, 114, 116, and 117 and the second pillar-shaped silicon layer 115, is removed. The gate insulating film 134 which is to become third and fourth gate insulating films is divided into third gate insulating films 134a, 134b, 134d, and 134e and a fourth gate insulating film 134c.

As illustrated in FIGS. 32A and 32B, a metal 136 is deposited.

Figure 33A:
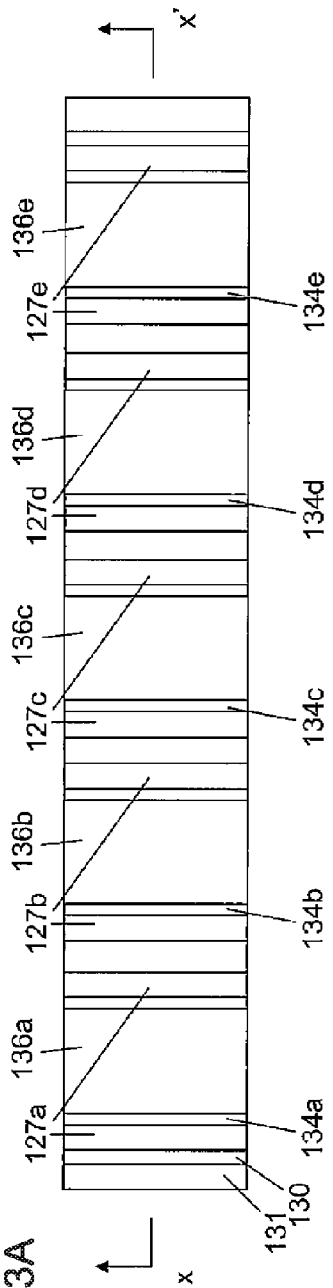
FIG. 33A is a plan view illustrating a method for producing a semiconductor device according to an embodiment of the present invention.
Figure 33B:
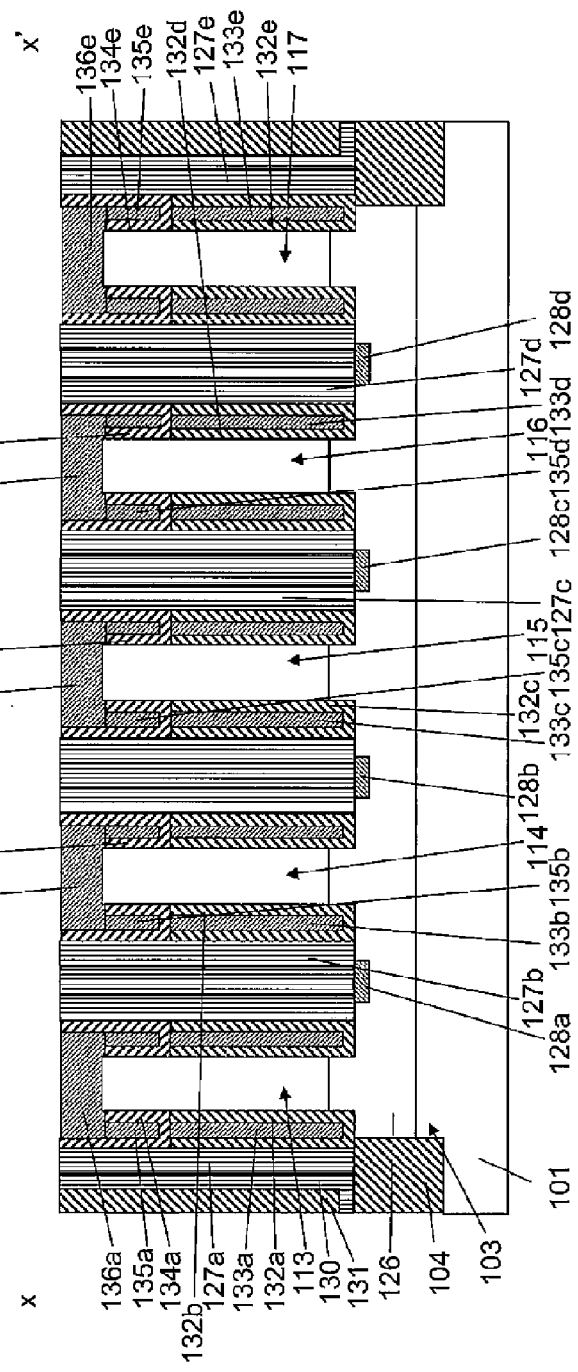
FIG. 33B is a sectional view taken along line X-X' in FIG. 33A.

As illustrated in FIGS. 33A and 33B, the metal 136 is etched-back to form second contact electrode lines 136a, 136b, 136d, and 136e and a fourth contact electrode line 136c.

Figure 34A:
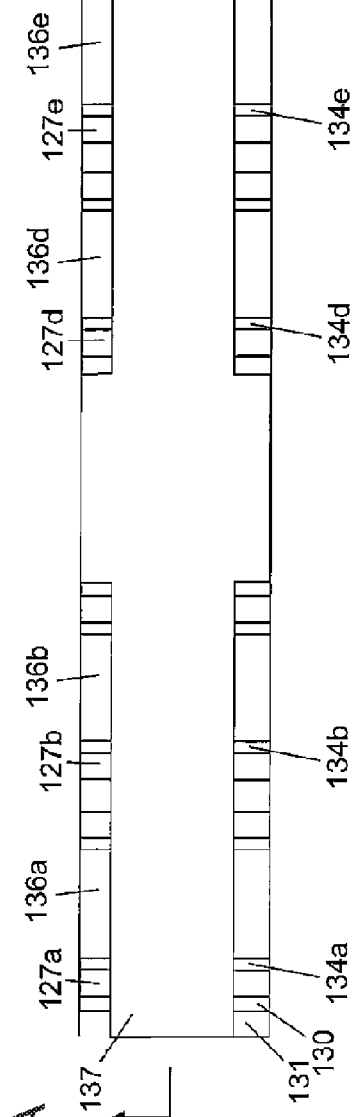
FIG. 34A is a plan view illustrating a method for producing a semiconductor device according to an embodiment of the present invention.
Figure 34B:
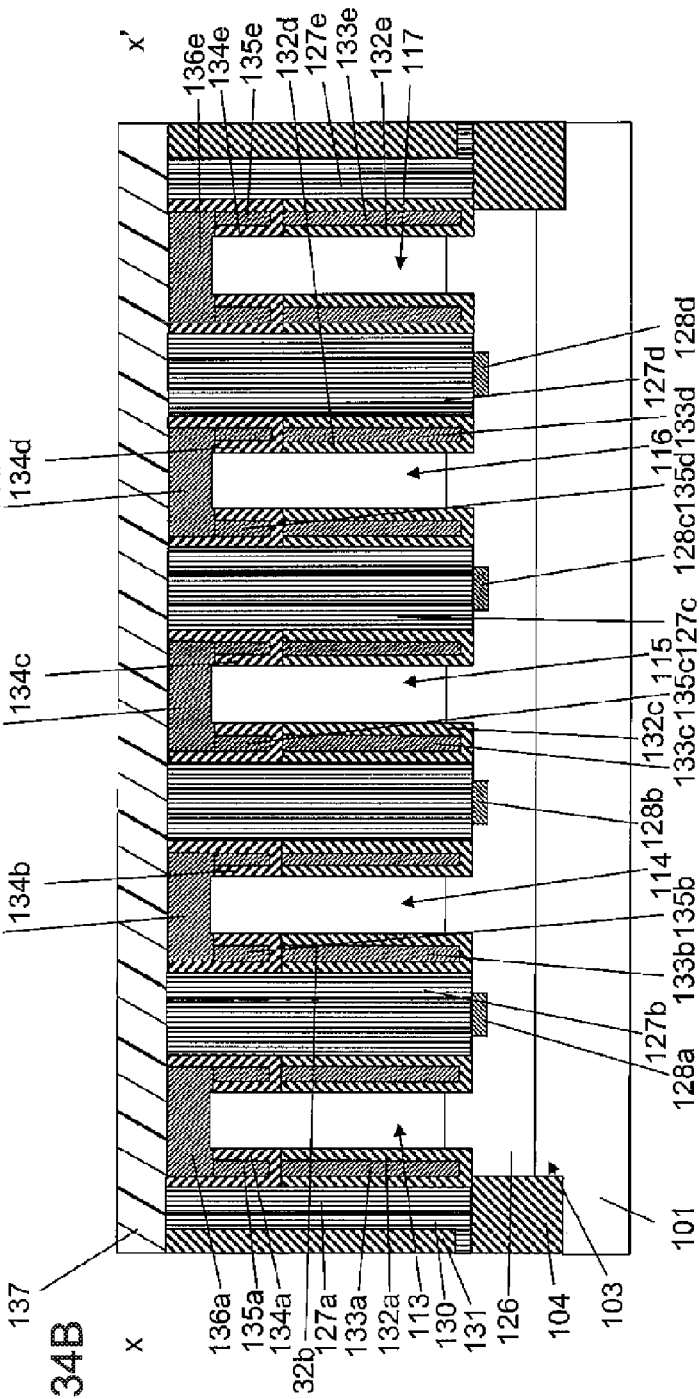
FIG. 34B is a sectional view taken along line X-X' in FIG. 34A.

As illustrated in FIGS. 34A and 34B, a third resist 137 is formed.

Figure 35A:
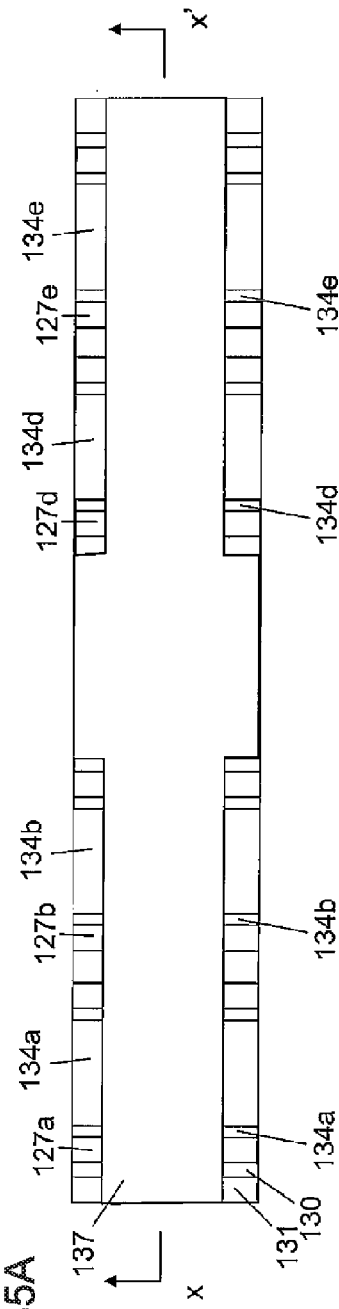
FIG. 35A is a plan view illustrating a method for producing a semiconductor device according to an embodiment of the present invention.
Figure 35B:
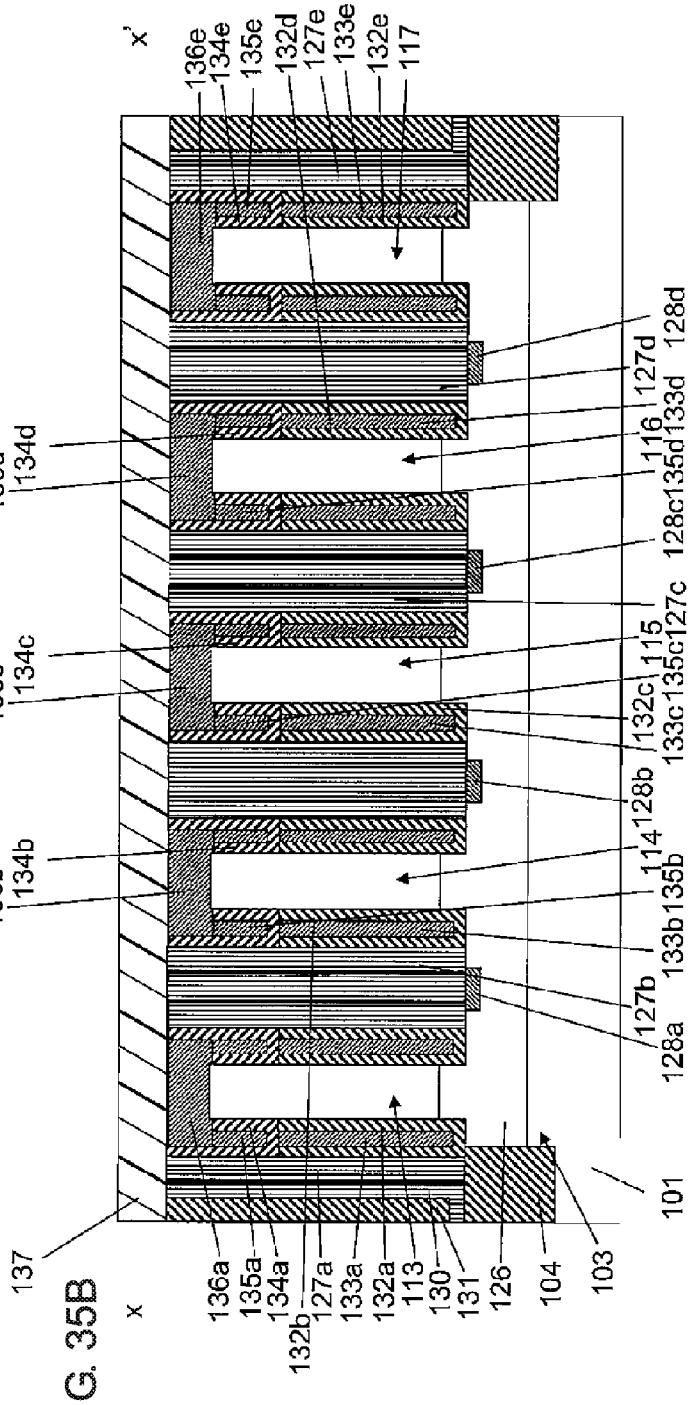
FIG. 35B is a sectional view taken along line X-X' in FIG. 35A.

As illustrated in FIGS. 35A and 35B, the first contact electrode lines 135a, 135b, 135d, and 135e and the second contact electrode lines 136a, 136b, 136d, and 136e are etched to form first contact electrodes 138a, 138b, 138d, and 138e, second contact electrodes 139a, 139b, 139d, and 139e, a third contact electrode 135c, and a fourth contact electrode 136c.

As illustrated in FIGS. 36A and 36B, the third resist 137 is removed.

Thus, the sixth step has been described. Specifically, the sixth step includes, after the fifth step, removing exposed portions of the gate insulating film which is to become first and second gate insulating films, forming a gate insulating film which is to become third and fourth gate insulating films on around upper portions of the first pillar-shaped semiconductor layers, around an upper portion of the second pillar-shaped semiconductor layer, and inside the fifth insulating film, depositing a metal and performing etch-back to form first contact electrode lines around the upper portions of the first pillar-shaped semiconductor layers and a third contact electrode line around the upper portion of the second pillar-shaped semiconductor layer, removing the gate insulating film which is to become third and fourth gate insulating films, the gate insulating film being exposed on upper portions of the first pillar-shaped semiconductor layers and the second pillar-shaped semiconductor layer, depositing a metal and performing etch-back to form second contact electrode lines and a fourth contact electrode line, and etching the first contact electrode lines and the second contact electrode lines to form first contact electrodes, second contact electrodes, a third contact electrode, and a fourth contact electrode.

Next, a description will be made of a seventh step of, after the sixth step, depositing a second interlayer insulating film and performing planarization to expose upper portions of the second contact electrodes and an upper portion of the fourth contact electrode, and forming a first magnetic tunnel junction storage element on each of the second contact electrodes.

As illustrated in FIGS. 37A and 37B, a second interlayer insulating film is deposited, and etched-back is performed to expose upper portions of the second contact electrodes 139a, 139b, 139d, and 139e and the fourth contact electrode 136c. The second interlayer insulating film is divided into second interlayer insulating films 140a, 140b, 140d, and 140e.

As illustrated in FIGS. 38A and 38B, a metal 141 for a lower electrode, a film 142 for a pinned layer, a film 143 for a tunnel barrier layer, a film 144 for a free layer, and a metal 145 for an upper electrode are deposited. The film 142 for a pinned layer is preferably made of CoFeB. The film 143 for a tunnel barrier layer is preferably made of MgO. The film 144 for a free layer is preferably made of CoFeB. Alternatively, a double-MgO free layer structure may be formed.

As illustrated in FIGS. 39A and 39B, fourth resists 146, 147, 148, and 149 for forming first magnetic tunnel junction storage elements are formed.

As illustrated in FIGS. 40A and 40B, the metal 141 for a lower electrode, the film 142 for a pinned layer, the film 143 for a tunnel barrier layer, the film 144 for a free layer, and the metal 145 for an upper electrode are etched. The metal 141 for a lower electrode is divided into lower electrodes 141a, 141b, 141d, and 141e. The film 142 for a pinned layer is divided into pinned layers 142a, 142b, 142d, and 142e. The film 143 for a tunnel barrier layer is divided into tunnel barrier layers 143a, 143b, 143d, and 143e. The film 144 for a free layer is divided into free layers 144a, 144b, 144d, and 144e. The metal 145 for an upper electrode is divided into upper electrodes 145a, 145b, 145d, and 145e.

Figures 41A, 41B:
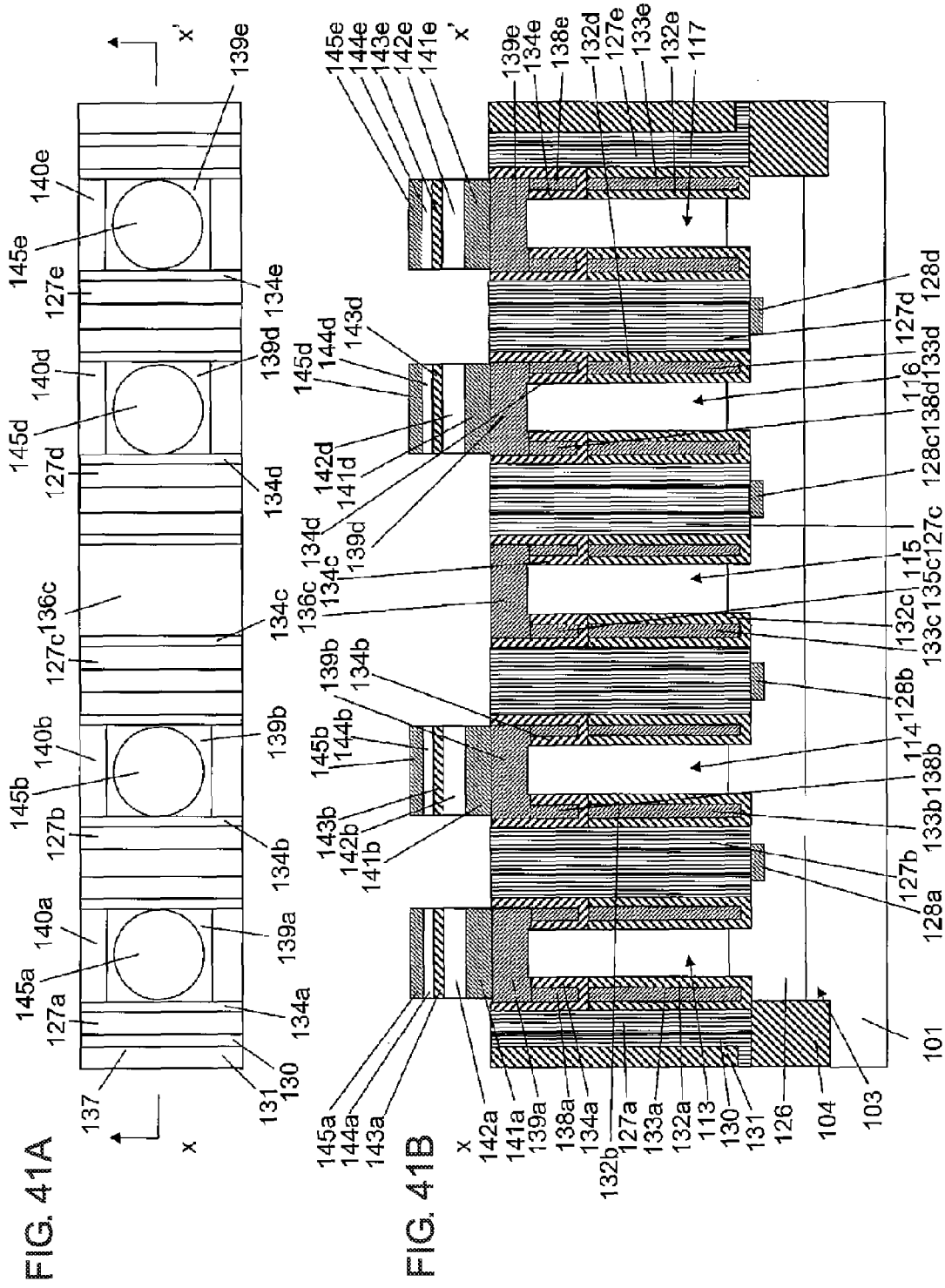
FIG. 41A is a plan view illustrating a method for producing a semiconductor device according to an embodiment of the present invention.
FIG. 41B is a sectional view taken along line X-X' in FIG. 41A.

As illustrated in FIGS. 41A and 41B, the fourth resists 146, 147, 148, and 149 are removed.

Thus, the seventh step has been described. Specifically, the seventh step includes, after the sixth step, depositing a second interlayer insulating film and performing planarization to expose upper portions of the second contact electrodes and an upper portion of the fourth contact electrode, and forming a first magnetic tunnel junction storage element on each of the second contact electrodes.

Figure 42A:
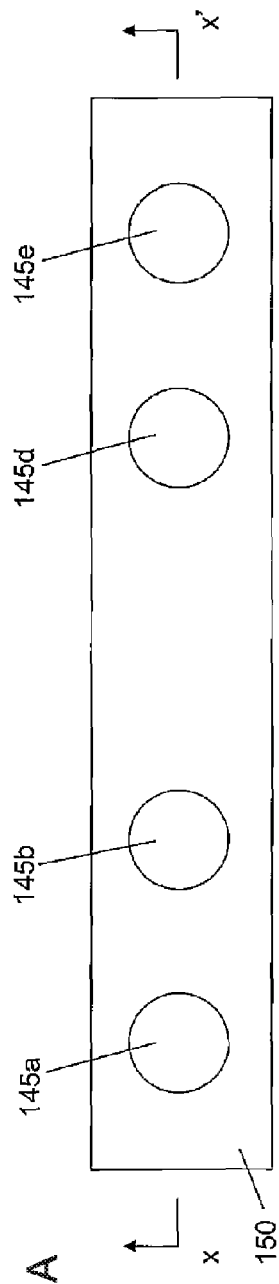
FIG. 42A is a plan view illustrating a method for producing a semiconductor device according to an embodiment of the present invention.
Figure 42B:
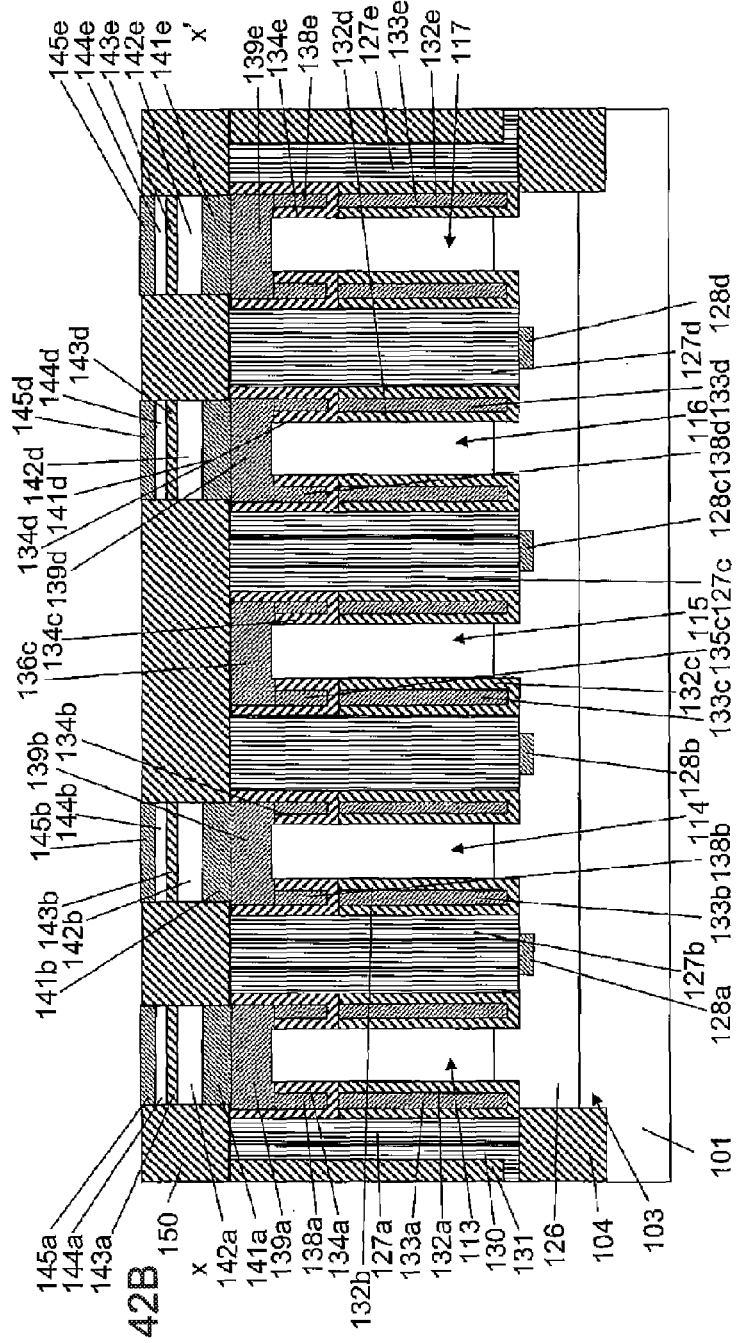
FIG. 42B is a sectional view taken along line X-X' in FIG. 42A.

As illustrated in FIGS. 42A and 42B, a third interlayer insulating film 150 is deposited, and the upper electrodes 145a, 145b, 145d, and 145e are exposed.

As illustrated in FIGS. 43A and 43B, a metal 151 is deposited.

Figures 44A, 44B:
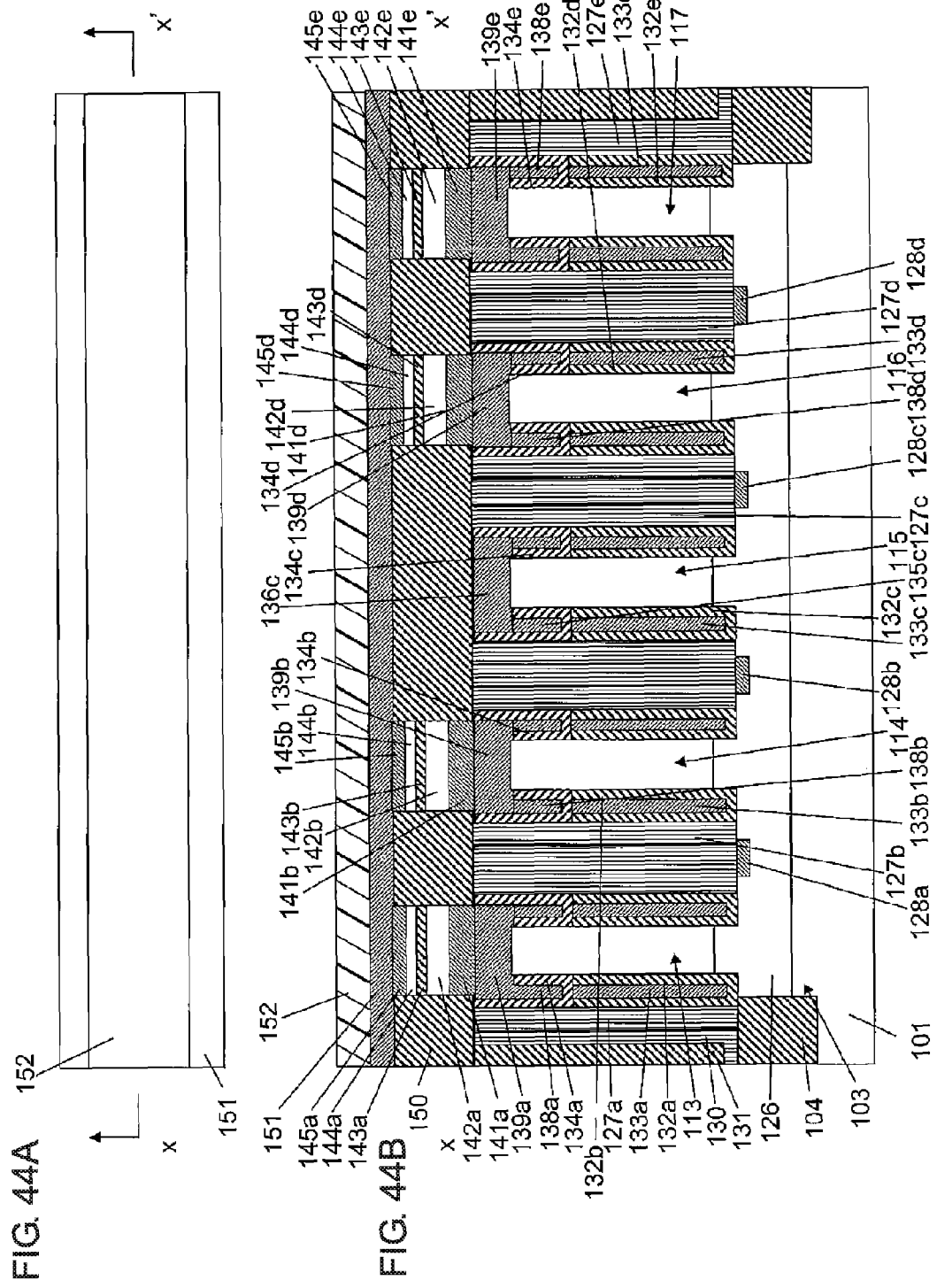
FIG. 44A is a plan view illustrating a method for producing a semiconductor device according to an embodiment of the present invention.
FIG. 44B is a sectional view taken along line X-X' in FIG. 44A.

As illustrated in FIGS. 44A and 44B, a fifth resist 152 is formed.

As illustrated in FIGS. 45A and 45B, the metal 151 is etched to form a first bit line 151a.

As illustrated in FIGS. 46A and 46B, the fifth resist 152 is removed.

Thus, the production process for forming a structure of a semiconductor device according to an embodiment of the present invention has been described.

It is to be understood that various embodiments and modifications of the present invention can be made without departing from the broad spirit and the scope of the present invention. The embodiments described above are illustrative examples of the present invention and do not limit the scope of the present invention.

For example, a method for producing a semiconductor device in which the p-type (including p$^+$-type) and the n-type (including n$^+$-type) in the above-described embodiments are changed to the opposite conductivity types and a semiconductor device produced by the method are also obviously within the technical scope of the present invention.

The invention claimed is:

1. A method for producing a semiconductor device, the method comprising:
    a first step of forming a first fin-shaped semiconductor layer on a semiconductor substrate, and forming a first insulating film around the first fin-shaped semiconductor layer;
    a second step, after the first step, of forming a second insulating film around the first fin-shaped semiconductor layer, depositing a first polysilicon on the second insulating film and planarizing the first polysilicon, forming a resist for forming first and second gate lines, a first pillar-shaped semiconductor layer, and a second pillar-shaped semiconductor layer in a direction perpendicular to a direction in which the first fin-shaped semiconductor layer extends, and etching the first polysilicon, the second insulating film, and the first fin-shaped semiconductor layer to form a first pillar-shaped semiconductor layer, a first dummy gate derived from the first polysilicon, a second pillar-shaped semiconductor layer, and a second dummy gate derived from the first polysilicon;
    a third step, after the second step, of forming a fourth insulating film around the first pillar-shaped semiconductor layer, the second pillar-shaped semiconductor layer, the first dummy gate, and the second dummy gate, depositing a second polysilicon around the fourth insulating film, and etching the second polysilicon so as to remain on side walls of the first dummy gate, the first pillar-shaped semiconductor layer, the second dummy gate, and the second pillar-shaped semiconductor layer to form a third dummy gate and a fourth dummy gate;
    a fourth step, after the third step, of forming a diffusion layer in an upper portion of the first fin-shaped semiconductor layer, a lower portion of the first pillar-shaped semiconductor layer, and a lower portion of the second pillar-shaped semiconductor layer, forming a fifth insulating film around the third dummy gate and the fourth dummy gate, etching the fifth insulating film so as to remain as a sidewall to form a sidewall formed of the fifth insulating film, and forming a compound of a metal and a semiconductor in an upper portion of the second diffusion layer to form a first source line;
    a fifth step, after the fourth step, of depositing a first interlayer insulating film and performing planarization to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film which is to become first and second gate insulating films around the first pillar-shaped semiconductor layer, around the second pillar-shaped semiconductor layer, and inside the fifth insulating film, depositing a metal and performing etch-back to form a first gate line around the first pillar-shaped semiconductor layer and a second gate line around the second pillar-shaped semiconductor layer;
    a sixth step, after the fifth step, of removing exposed portions of the gate insulating film which is to become first and second gate insulating films, forming another gate insulating film which is to become third and fourth gate insulating films around an upper portion of the first pillar-shaped semiconductor layer, around an upper portion of the second pillar-shaped semiconductor layer, and inside the fifth insulating film, depositing a metal and performing etch-back to form a first contact electrode line around the upper portion of the first pillar-shaped semiconductor layer and a third contact electrode line around the upper portion of the second pillar-shaped semiconductor layer, removing the gate insulating film which is to become third and fourth gate insulating films, the gate insulating film being exposed on upper portions of the first pillar-shaped semiconductor layer and the second pillar-shaped semiconductor layer, depositing a metal and performing etch-back to form a second contact electrode line and a fourth contact electrode line, and etching the first contact electrode line and the second contact electrode line to form a first contact electrode, a second contact electrode, a third contact electrode, and a fourth contact electrode; and
    a seventh step, after the sixth step, of depositing a second interlayer insulating film and performing planarization to expose an upper portion of the second contact electrode and an upper portion of the fourth contact electrode, and forming a first magnetic tunnel junction storage element on the second contact electrode.

2. The method according to claim 1, further comprising, after the deposition of the first polysilicon on the second insulating film and the planarization of the first polysilicon, forming a third insulating film on the first polysilicon.

* * * * *